United States Patent
Sato

(10) Patent No.: US 9,904,184 B2
(45) Date of Patent: Feb. 27, 2018

(54) LIQUID IMMERSION MEMBER, EXPOSURE APPARATUS, EXPOSING METHOD, METHOD FOR MANUFACTURING DEVICE, PROGRAM, AND RECORDING MEDIUM

(71) Applicant: NIKON CORPORATION, Tokyo (JP)

(72) Inventor: Shinji Sato, Fukaya (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/486,976

(22) Filed: Apr. 13, 2017

(65) Prior Publication Data

US 2017/0219941 A1    Aug. 3, 2017

Related U.S. Application Data

(63) Continuation of application No. 14/134,999, filed on Dec. 19, 2013, now Pat. No. 9,651,873.

(60) Provisional application No. 61/746,497, filed on Dec. 27, 2012.

(51) Int. Cl.
  *G03B 27/52*  (2006.01)
  *G03B 27/42*  (2006.01)
  *G03F 7/20*   (2006.01)

(52) U.S. Cl.
  CPC ...... *G03F 7/70866* (2013.01); *G03F 7/70341* (2013.01)

(58) Field of Classification Search
  CPC ............. G03F 7/70341; G03F 7/70325; G03F 7/70716; G03F 7/2041; G03F 7/70725
  See application file for complete search history.

(56) References Cited

U.S. PATENT DOCUMENTS

| 6,208,407 | B1 | 3/2001 | Loopstra |
| 6,262,796 | B1 | 7/2001 | Loopstra et al. |
| 6,341,007 | B1 | 1/2002 | Nishi et al. |
| 6,452,292 | B1 | 9/2002 | Binnard |

(Continued)

FOREIGN PATENT DOCUMENTS

| CN | 101438385 A | 5/2009 |
| CN | 101799636 A | 8/2010 |

(Continued)

OTHER PUBLICATIONS

Apr. 1, 2014 International Search Reoprt issued in International Applicatinon No. PCT/JP2013/084758.

(Continued)

*Primary Examiner* — Mesfin Asfaw
(74) *Attorney, Agent, or Firm* — Oliff PLC

(57) ABSTRACT

A liquid immersion member is used in a liquid immersion exposure apparatus, and is capable of forming a liquid immersion space on a surface of an object opposite to an emitting surface of an optical member which emits exposure light. The liquid immersion member includes a first member that includes a first part disposed at surrounding of an optical path of the exposure light, and in which a first opening part, through which the exposure light is able to pass, and a first liquid supply part, which is disposed at at least a portion of surrounding of the first opening part and is capable of opposing the surface of the object, are provided at the first part, and a second member that includes a first liquid recovery part which is capable of opposing the surface of the object and is movable with respect to the first member outside the first part with respect to the optical path.

40 Claims, 24 Drawing Sheets

(56) References Cited

U.S. PATENT DOCUMENTS

| | | |
|---|---|---|
| 6,611,316 B2 | 8/2003 | Sewell |
| 6,778,257 B2 | 8/2004 | Bleeker et al. |
| 6,897,963 B1 | 5/2005 | Taniguchi et al. |
| 7,292,313 B2 | 11/2007 | Poon et al. |
| 7,394,522 B2 | 7/2008 | Hasegawa et al. |
| 7,864,292 B2 | 1/2011 | Leenders et al. |
| 8,004,651 B2 | 8/2011 | Nagasaka |
| 8,068,209 B2 | 11/2011 | Poon et al. |
| 8,134,685 B2 | 3/2012 | Nishii et al. |
| 8,237,911 B2 | 8/2012 | Poon et al. |
| 8,289,497 B2 | 10/2012 | Poon et al. |
| 8,400,610 B2 | 3/2013 | Poon et al. |
| 8,477,283 B2 | 7/2013 | Nishii |
| 8,610,873 B2 | 12/2013 | Poon et al. |
| 8,743,343 B2 | 6/2014 | Poon et al. |
| 8,891,059 B2 | 11/2014 | Nagasaka |
| 8,896,806 B2 | 11/2014 | Sato |
| 8,934,080 B2 | 1/2015 | Poon et al. |
| 9,013,675 B2 | 4/2015 | Nishii et al. |
| 9,268,231 B2 | 2/2016 | Sato |
| 9,323,160 B2 | 4/2016 | Shibazaki |
| 2005/0018155 A1 | 1/2005 | Cox et al. |
| 2005/0280791 A1 | 12/2005 | Nagasaka et al. |
| 2007/0109512 A1 | 5/2007 | Kate et al. |
| 2007/0109513 A1 | 5/2007 | Antonius Leenders et al. |
| 2007/0110213 A1 | 5/2007 | Leenders et al. |
| 2007/0177125 A1 | 8/2007 | Shibazaki |
| 2007/0252964 A1 | 11/2007 | Kohno et al. |
| 2007/0288121 A1 | 12/2007 | Shibazaki |
| 2007/0296939 A1 | 12/2007 | Nishii |
| 2008/0002169 A1 | 1/2008 | Hasegawa et al. |
| 2008/0049209 A1 | 2/2008 | Nagasaka et al. |
| 2008/0084546 A1 | 4/2008 | Owa et al. |
| 2010/0304310 A1 | 12/2010 | Sato |
| 2013/0188159 A1 | 7/2013 | Shibazaki |
| 2014/0022522 A1 | 1/2014 | Sato |
| 2014/0253886 A1 | 9/2014 | Sato |
| 2014/0285781 A1 | 9/2014 | Sato |
| 2014/0300875 A1 | 10/2014 | Sato et al. |
| 2014/0307235 A1 | 10/2014 | Sato |

FOREIGN PATENT DOCUMENTS

| | | |
|---|---|---|
| EP | 1 713 113 A1 | 10/2006 |
| EP | 2 523 210 A1 | 11/2012 |
| JP | 2007-005363 A | 1/2007 |
| JP | 2007-053329 A | 3/2007 |
| JP | 2008-034801 A | 2/2008 |
| JP | 2010-157724 A | 7/2010 |
| JP | 2011-205121 A | 10/2011 |
| NO | 2011/083724 A1 | 7/2011 |
| NO | 2013/100114 A1 | 7/2013 |
| WO | 01/35168 A1 | 5/2001 |
| WO | 2004/019128 A2 | 3/2004 |

OTHER PUBLICATIONS

Apr. 1, 2014 Written Opinion of the International Searching Authority issued in International Application No. PCT/JP2013/084758.
Feb. 25, 2016 Office Action issued in U.S. Appl. No. 14/134,999.
Jan. 11, 2017 Office Action issued in U.S. Appl. No. 14/743,430.
Feb. 17, 2017 Office Action issued in Chinese Patent Application No. 201380073365.0.
Dec. 6, 2016 Notice of Allowance issued in U.S. Appl. No. 14/134,999.
Oct. 3, 2017 Office Action issued in Japanese Application No. 2014-554512.
Dec. 26, 2017 Office Action issued in Chinese Application No. 201380073365.0.

(A)

Jr (D)

Jsm (B)

Jrm (E)

Js (C)

Jm (A)

(B)

(C)

(D)

(A)

(B)

(C)

(D)

(A)

(B)

(A)

(B)

US 9,904,184 B2

LIQUID IMMERSION MEMBER, EXPOSURE APPARATUS, EXPOSING METHOD, METHOD FOR MANUFACTURING DEVICE, PROGRAM, AND RECORDING MEDIUM

CROSS-REFERENCE TO RELATED APPLICATION

This application is a continuation of U.S. application Ser. No. 14/134,999 filed Dec. 19, 2013, which is based on and claims priority to U.S. Patent Provisional Application No. 61/746,497, filed Dec. 27, 2012, the contents of which are incorporated herein by reference.

BACKGROUND

Technical Field

The present invention relates to a liquid immersion member, an exposure apparatus, an exposing method, a method of manufacturing a device, a program, and a recording medium.

For example, in an exposure apparatus which is used in a photolithography process, as disclosed in U.S. Pat. No. 7,864,292, a liquid immersion exposure apparatus which exposes a substrate by exposure light via a liquid is known.

For example, in a liquid immersion exposure apparatus, if liquid flows out from a predetermined space or remains on an object such as a substrate, exposure failure may occur. As a result, a defective device may be manufactured.

An object of an aspect of the present invention is to provide a liquid immersion member, an exposure apparatus, and an exposing method capable of suppressing occurrences of exposure failure. Moreover, an object of another aspect of the present invention is to provide a method of manufacturing a device, a program, and a recording medium capable of suppressing occurrences of defective devices.

SUMMARY

According to a first aspect of the present invention, there is provided a liquid immersion member that is used in a liquid immersion exposure apparatus, and is capable of forming a liquid immersion space in a surface of an object opposite to an emitting surface of an optical member which emits exposure light, including: a first member that includes a first part disposed at surrounding of an optical path of the exposure light, and in which a first opening part, through which the exposure light is able to pass, and a first liquid supply part, which is disposed at at least a portion of surrounding of the first opening part and is capable of opposing the surface of the object, are provided at the first part; and a second member that includes a first liquid recovery part which is capable of opposing the surface of the object and is movable with respect to the first member outside the first part with respect to the optical path.

According to a second aspect of the present invention, there is provided a liquid immersion member that is used in a liquid immersion exposure apparatus, and is capable of forming a liquid immersion space on a surface of an object opposite to an emitting surface of an optical member which emits exposure light, including: a first member that includes a first part disposed at surrounding of an optical path of the exposure light, and in which a first opening part, through which the exposure light is able to pass, is provided at the first part; and a second member that includes a first liquid recovery part and a first gas supply part, and is movable with respect to the first member outside the first part with respect to the optical path, the first liquid recovery part being capable of opposing the surface of the object, the first gas supply part being disposed outside the first liquid recovery part in a radial direction with respect to an optical axis of the optical member and being capable of opposing the surface of the object.

According to a third aspect of the present invention, there is provided a liquid immersion member that is used in a liquid immersion exposure apparatus, and is capable of forming a liquid immersion space on a surface of an object opposite to an emitting surface of an optical member which emits exposure light, including: a first member that includes a first part disposed at surrounding of an optical path of the exposure light, and in which a first opening part, through which the exposure light is able to pass, is provided at the first part; and a second member that includes a first liquid recovery part and a second liquid supply part, and that is movable with respect to the first member outside the first part with respect to the optical path, the first liquid recover part being capable of opposing the surface of the object, the second liquid supply part being disposed between the optical path and the first liquid recovery part in a radial direction with respect to an optical axis of the optical member and being capable of opposing the surface of the object.

According to a fourth aspect of the present invention, there is provided a liquid immersion member that is used in a liquid immersion exposure apparatus, and is capable of forming a liquid immersion space on a surface of an object opposite to an emitting surface of an optical member which emits exposure light, including: a first member that includes a first part disposed at surrounding of an optical path of the exposure light, and in which a first opening part, through which the exposure light is able to pass, is provided at the first part; and a second member that includes a first liquid recovery part which is capable of opposing the surface of the object and is movable with respect to the first member outside the first part with respect to the optical path; and a second liquid recovery part that is disposed at the first member and is capable of recovering at least a portion of liquid which has flowed in a gap between the first member and the second member from above the object.

According to a fifth aspect of the present invention, there is provided a liquid immersion member that is used in a liquid immersion exposure apparatus, and is capable of forming a liquid immersion space on a surface of an object opposite to an emitting surface of an optical member which emits exposure light, including: a first member that includes a first part disposed at surrounding of an optical path of the exposure light, and in which a first opening part, through which the exposure light is able to pass, is provided at the first part; a second member that includes a first liquid recovery part which is capable of opposing the surface of the object and is movable with respect to the first member outside the first part with respect to the optical path; and a second liquid recovery part which is capable of recovering at least a portion of liquid which has flowed in a gap between the first member and the second member from above the object, wherein the gap between the first member and the second member includes a first gap part having a first size, and a second gap part which is disposed outside the first gap part with respect to the optical axis of the optical member and has a second size smaller than the first size, and wherein the second liquid recovery part is capable of recovering liquid from the first gap part.

According to a sixth aspect of the present invention, there is provided an exposure apparatus which exposes a substrate via liquid by exposure light, the exposure apparatus including: the liquid immersion member according to any one of the first to fifth aspects.

According to a seventh aspect of the present invention, there is provided an exposure apparatus that exposes a substrate via liquid by exposure light, including: an optical member that includes an emitting surface from which the exposure light is emitted; a liquid immersion member that is capable of forming a liquid immersion space of the liquid on an object capable of moving below the optical member, and includes a first member which is disposed at at least a portion of surrounding of an optical path of the exposure light, and a second member in which at least a portion is disposed to be opposite to the object below the first member and which is movable with respect to the first member, and a gas supply part that supplies gas to at least a portion of surrounding of the liquid immersion space.

According to an eighth aspect of the present invention, there is provided a method of manufacturing a device, including: exposing the substrate using the exposure apparatus according to the sixth aspect or the seventh aspect; and developing the exposed substrate.

According to a ninth aspect of the present invention, there is provided an exposing method that exposes a substrate by exposure light via liquid between an emitting surface of an optical member emitting the exposure light and the substrate, including: forming a liquid immersion space of the liquid on a surface of the substrate by using a liquid immersion member that includes a first member and a second member, the first member including a first part disposed at surrounding of an optical path of the exposure light, a first opening part, through which the exposure light is able to pass, and a first liquid supply part being provided at the first part of the first member, the first liquid supply part being disposed at at least surrounding of the first opening part and being capable of opposing the surface of the substrate, the second member including a first liquid recovery part which is capable of opposing the surface of the substrate and being movable with respect to the first member outside the first part with respect to the optical path; exposing the substrate by the exposure light emitted from the emitting surface via the liquid of the liquid immersion space; and moving the second member with respect to the first member in at least a portion of exposure of the substrate.

According to a tenth aspect of the present invention, there is provided an exposing method that exposes a substrate by exposure light via liquid between an emitting surface of an optical member emitting the exposure light and the substrate, including: forming a liquid immersion space of the liquid on a surface of the substrate by using a liquid immersion member that includes a first member and a second member, the first member including a first part disposed at surrounding of an optical path of exposure light, a first opening part, through which the exposure light is able to pass, being provided at the first part of the first member, the second member including a first liquid recovery part and a first gas supply part and being movable with respect to the first member outside the first part with respect to the optical path, the first liquid recovery part being capable of opposing the surface of the object, the first gas supply part being disposed outside the first liquid recovery part in a radial direction with respect to an optical axis of an optical member and being capable of opposing the surface of the object; exposing the substrate by the exposure light emitted from the emitting surface via the liquid of the liquid immersion space; and moving the second member with respect to the first member in at least a portion of exposure of the substrate.

According to an eleventh aspect of the present invention, there is provided an exposing method that exposes a substrate to exposure light via liquid between an emitting surface of an optical member emitting the exposure light and the substrate, including: forming a liquid immersion space of the liquid on a surface of the substrate by using a liquid immersion member that includes a first member and a second member, the first member including a first part disposed at surrounding of an optical path of the exposure light, a first opening part, through which the exposure light is able to pass, being provided at the first part of the first member, the second member including a first liquid recovery part and a second liquid supply part and being movable with respect to the first member outside the first part with respect to the optical path, the first liquid recovery part being capable of opposing the surface of the object, the second liquid supply part being disposed between the optical path and the first liquid recovery part in a radial direction with respect to an optical axis of the optical member and being capable of opposing the surface of the object; exposing the substrate by the exposure light emitted from the emitting surface via the liquid of the liquid immersion space; and moving the second member with respect to the first member in at least a portion of exposure of the substrate.

According to a twelfth aspect of the present invention, there is provided an exposing method that exposes a substrate by exposure light via liquid between an emitting surface of an optical member emitting the exposure light and the substrate, including: forming a liquid immersion space of the liquid on a surface of the substrate by using a liquid immersion member that includes a first member, a second member, and a second liquid recovery part, the first member including a first part disposed at surrounding of an optical path of the exposure light, a first opening part, through which the exposure light is able to pass, being provided at the first part of the first member, the second member including a first liquid recovery part and being movable with respect to the first member outside the first part with respect to the optical path, the first liquid recovery part being capable of opposing a surface of the object, the second liquid recovery part being disposed at the first member and being capable of recovering at least a portion of liquid which has flowed in a gap between the first member and the second member from above the object; exposing the substrate by the exposure light emitted from the emitting surface via the liquid of the liquid immersion space; and moving the second member with respect to the first member in at least a portion of exposure of the substrate.

According to a thirteenth aspect of the present invention, there is provided an exposing method that exposes a substrate by exposure light via liquid between an emitting surface of an optical member emitting the exposure light and the substrate, including: forming a liquid immersion space of the liquid on a surface of a substrate by using a liquid immersion member that includes a first member, a second member, and a second liquid recovery part, wherein a gap between the first member and the second member includes a first gap part having a first size, and a second gap part having a second size which is disposed outside the first gap part with respect to the optical axis of the optical member and is smaller than the first size, and the second liquid recovery part is capable of recovering liquid from the first gap part, the first member including a first part disposed at surrounding of an optical path of the exposure light, a first opening part, through which the exposure light is able to pass, being provided at the first part of the first member, the second member including a first liquid recovery part which is capable of opposing a surface of the object and being movable with respect to the first member outside the first part with respect to the optical path, the second liquid recovery part being capable of recovering at least a portion of liquid which has flowed in the gap between the first member and the second member from above the object; exposing the substrate by the exposure light emitted from the emitting surface via the liquid of the liquid immersion space; and moving the second member with respect to the first member in at least a portion of exposure of the substrate.

According to a fourteenth aspect of the present invention, there is provided an exposing method that exposes a substrate by exposure light via liquid between an emitting surface of an optical member emitting the exposure light and the substrate, including: forming a liquid immersion space of the liquid on a substrate which is movable below the optical member by using a first liquid immersion member that includes a first member and a second member. the first member being disposed at at least a portion of surrounding of an optical path of the exposure light, the second member being disposed so that at least a portion of the second member is capable of opposing the object below the first member and being movable with respect to the first member; exposing the substrate by the exposure light emitted from the emitting surface via the liquid of the liquid immersion space; moving the second member with respect to the first member in at least a portion of the exposure of the substrate; and supplying gas from a gas supply part to at least a portion of surrounding of the liquid immersion space.

According to a fifteenth aspect of the present invention, there is provided a method of manufacturing a device, including: exposing a substrate using the exposing method according to any one of the ninth to fourteenth aspects; and developing the exposed substrate.

According to a sixteenth aspect of the present invention, there is provided a program that causes a computer to execute a control of a liquid immersion exposure apparatus which exposes a substrate by exposure light via liquid between an emitting surface of an optical member emitting the exposure light and the substrate, wherein the program performs: forming a liquid immersion space of the liquid on a surface of the substrate by using a liquid immersion member that includes a first member and a second member, the first member including a first part disposed at surrounding of an optical path of the exposure light, a first opening part, through which the exposure light is able to pass, and a first liquid supply part being provided at the first part of the first member, the first liquid supply part being disposed at at least surrounding of the first opening part and being capable of opposing the surface of the substrate, the second member including a first liquid recovery part which is capable of opposing the surface of the substrate and being movable with respect to the first member outside the first part with respect to the optical path; exposing the substrate by the exposure light emitted from the emitting surface via the liquid of the liquid immersion space; and moving the second member with respect to the first member in at least a portion of exposure of the substrate.

According to a seventeenth aspect of the present invention, there is provided a program that causes a computer to execute a control of a liquid immersion exposure apparatus which exposes a substrate by exposure light via liquid between an emitting surface of an optical member emitting the exposure light and the substrate, wherein the program performs: forming a liquid immersion space of the liquid on a surface of the substrate by using a liquid immersion member that includes a first member and a second member, the first member including a first part disposed at surrounding of an optical path of exposure light, a first opening part, through which the exposure light is able to pass, being provided at the first part of the first member, the second member including a first liquid recovery part and a first gas supply part and being movable with respect to the first member outside the first part with respect to the optical path, the first liquid recovery part being capable of opposing the surface of the object, the first gas supply part being disposed outside the first liquid recovery part in a radial direction with respect to an optical axis of an optical member and being capable of opposing the surface of the object; exposing the substrate by the exposure light emitted from the emitting surface via the liquid of the liquid immersion space; and moving the second member with respect to the first member in at least a portion of exposure of the substrate.

According to an eighteenth aspect of the present invention, there is provided a program that causes a computer to execute a control of a liquid immersion exposure apparatus which exposes a substrate by exposure light via liquid between an emitting surface of an optical member emitting the exposure light and the substrate, wherein the program performs: forming a liquid immersion space of the liquid on a surface of the substrate by using a liquid immersion member that includes a first member and a second member, the first member including a first part disposed at surrounding of an optical path of the exposure light, a first opening part, through which the exposure light is able to pass, being provided at the first part of the first member, the second member including a first liquid recovery part and a second liquid supply part and being movable with respect to the first member outside the first part with respect to the optical path, the first liquid recovery part being capable of opposing the surface of the object, the second liquid supply part being disposed between the optical path and the first liquid recovery part in a radial direction with respect to an optical axis of the optical member and being capable of opposing the surface of the object; exposing the substrate by the exposure light emitted from the emitting surface via the liquid of the liquid immersion space; and moving the second member with respect to the first member in at least a portion of exposure of the substrate.

According to a nineteenth aspect of the present invention, there is provided a program that causes a computer to execute a control of a liquid immersion exposure apparatus which exposes a substrate to exposure light via liquid between an emitting surface of an optical member emitting the exposure light and the substrate, wherein the program performs: forming a liquid immersion space of the liquid on a surface of the substrate by using a liquid immersion member that includes a first member, a second member, and a second liquid recovery part, the first member including a first part disposed at surrounding of an optical path of the exposure light, a first opening part, through which the exposure light is able to pass, being provided at the first part of the first member, the second member including a first liquid recovery part and being movable with respect to the first member outside the first part with respect to the optical path, the first liquid recovery part being capable of opposing a surface of the object, the second liquid recovery part being disposed at the first member and being capable of recovering at least a portion of liquid which has flowed in a gap between the first member and the second member from above the object; exposing the substrate by the exposure light emitted from the emitting surface via the liquid of the liquid immersion space; and moving the second member with respect to the first member in at least a portion of exposure of the substrate.

According to a twentieth aspect of the present invention, there is provided a program that causes a computer to execute a control of a liquid immersion exposure apparatus which exposes a substrate by exposure light via liquid between an emitting surface of an optical member emitting the exposure light and the substrate, wherein the program performs: forming a liquid immersion space of the liquid on a surface of a substrate by using a liquid immersion member that includes a first member, a second member, and a second liquid recovery part, wherein a gap between the first member and the second member includes a first gap part having a first size, and a second gap part having a second size which is disposed outside the first gap part with respect to the optical axis of the optical member and is smaller than the first size, and the second liquid recovery part is capable of recovering liquid from the first gap part, the first member including a first part disposed at surrounding of an optical path of the exposure light, a first opening part, through which the exposure light is able to pass, being provided at the first part of the first member, the second member including a first liquid recovery part which is capable of opposing a surface of the object and being movable with respect to the first member outside the first part with respect to the optical path, the second liquid recovery part being capable of recovering at least a portion of liquid which has flowed in the gap between the first member and the second member from above the object; exposing the substrate by the exposure light emitted from the emitting surface via the liquid of the liquid immersion space; and moving the second member with respect to the first member in at least a portion of exposure of the substrate.

According to a twenty-first aspect of the present invention, there is provided a program which causes a computer to execute a control of a liquid immersion exposure apparatus which exposes a substrate by exposure light via liquid between an emitting surface of an optical member emitting the exposure light and the substrate, wherein the program performs: forming a liquid immersion space of the liquid on a substrate which is movable below the optical member by using a first liquid immersion member that includes a first member and a second member the first member being disposed at at least a portion of surrounding of an optical path of the exposure light, the second member being disposed so that at least a portion of the second member is capable of opposing the object below the first member and being movable with respect to the first member; exposing the substrate by the exposure light emitted from the emitting surface via the liquid of the liquid immersion space; moving the second member with respect to the first member in at least a portion of the exposure of the substrate; and supplying gas from a gas supply part to at least a portion of surrounding of the liquid immersion space.

According to a twenty-second of the present invention, there is provided a computer-readable recording medium on which the program according to any one of the sixteenth to twenty-first aspects is recorded.

According to the aspects of the present invention, occurrence of exposure failure can be prevented. In addition, according to the aspects of the present invention, occurrence of a defective device can be prevented.

DESCRIPTION OF EMBODIMENTS

Figure 1:
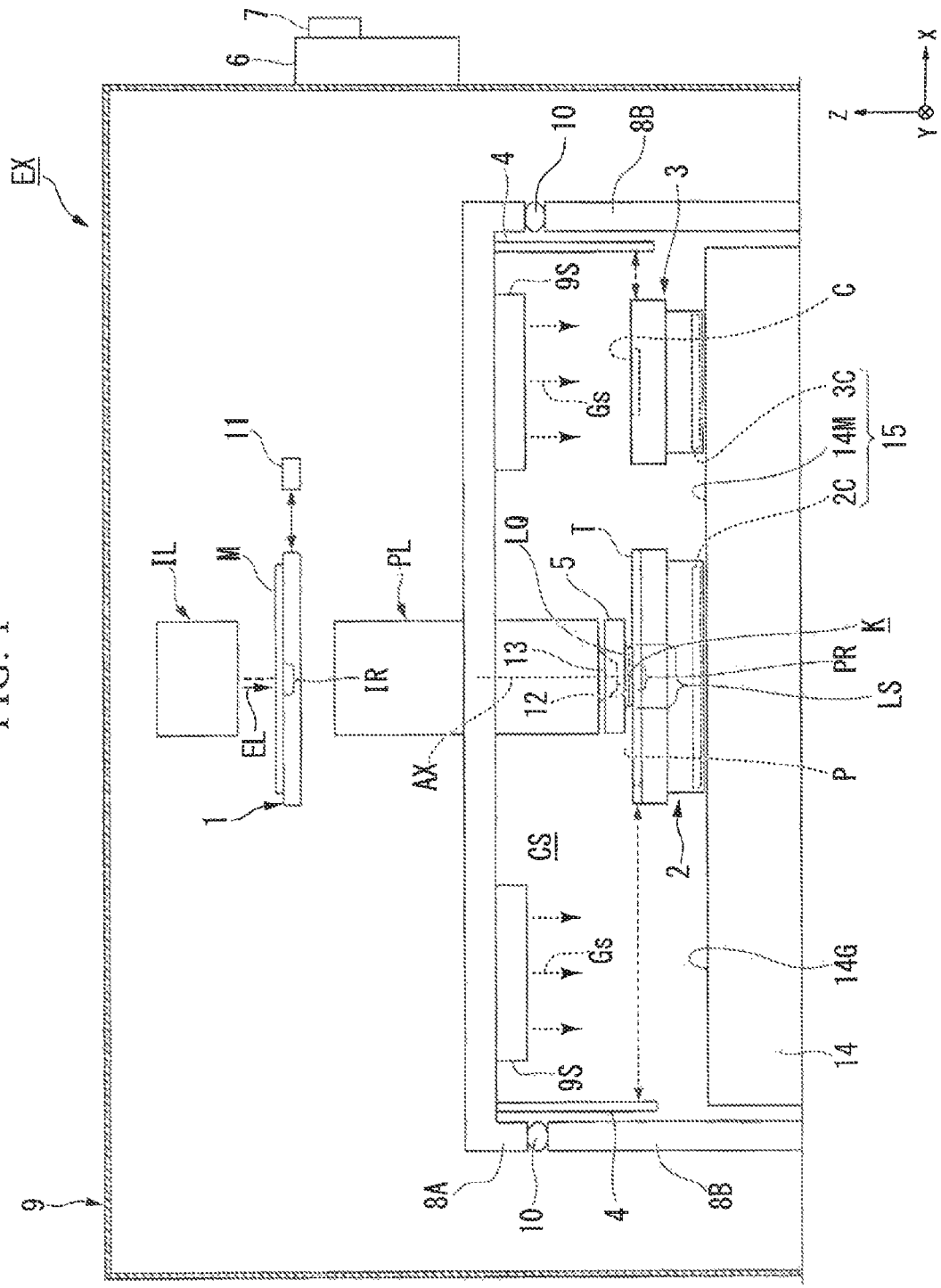
FIG. 1 is a view showing an example of an exposure apparatus according to a first embodiment.

Hereinafter, embodiments of the present invention will be described referring to the drawings. However, the present invention is not limited thereto. In the descriptions below, an XYZ rectangular coordinate system is set, and a positional relationship of each portion will be described with reference to the XYZ rectangular coordinate system. A predetermined direction in a horizontal surface is set to an X axis direction, a direction orthogonal to the X axis direction in the horizontal surface is set to a Y axis direction, and a direction (that is, a vertical direction) orthogonal to each of the X axis direction and the Y axis direction is set to a Z axis direction. Moreover, the rotation (inclination) directions around the X axis, the Y axis, and the Z axis are set to the θX direction, the θY direction, and the θZ direction.

First Embodiment

A first embodiment will be described. FIG. 1 is a schematic configuration view showing an example of an exposure apparatus EX according to the first embodiment. The exposure apparatus EX of the present embodiment is a liquid immersion exposure apparatus which exposes a substrate P via a liquid LQ using exposure light EL. In the present embodiment, a liquid immersion space LS is formed so that an optical path of the exposure light EL which is radiated to the substrate P is filled with the liquid LQ. The liquid immersion space means a portion (space or region) which is filled with the liquid. The substrate P is exposed by the exposure light EL via the liquid LQ in the liquid immersion space LS. In the present embodiment, water (pure water) is used as the liquid LQ.

For example, the exposure apparatus EX of the present embodiment is an exposure apparatus which includes a substrate stage and a measurement stage as disclosed in U.S. Pat. No. 6,897,963, European Patent Application, Publication No. 1,713,113, or the like.

In FIG. 1, the exposure apparatus EX includes: a mask stage 1 which is movable while holding a mask M; a substrate stage 2 which is movable while holding a substrate P; a measurement stage 3 which does not hold the substrate P, and which is movable while mounting a measurement member (measurement instrument) C which measures the exposure light EL; a measurement system 4 which measures positions of the substrate stage 2 and the measurement stage 3; an illumination system IL which illuminates the mask M with the exposure light EL; a projection optical system PL which projects an image of a pattern of the mask M which is illuminated with the exposure light EL to the substrate P; a liquid immersion member 5 which forms the liquid immersion space LS of a liquid LQ; a controller 6 which controls an operation of the entire exposure apparatus EX; and a storage apparatus 7 which is connected to the controller 6 and stores various information with respect to the exposure.

Moreover, the exposure apparatus EX includes a reference frame 8A which supports the projection optical system PL and various measurement systems including the measurement system 4, an apparatus frame 8B which supports the reference frame 8A, and a vibration isolator 10 which is disposed between the reference frame 8A and the apparatus frame 8B, and suppresses transmission of vibration from the apparatus frame 8B to the reference frame 8A. The vibration isolator 10 includes a spring apparatus or the like. In the present embodiment, the vibration isolator 10 includes a gas spring (for example, an air mount). In addition, either a detection system which detects an alignment mark of the substrate P or a detection system which detects the position of the surface of an object such as the substrate P, or both detection systems may be supported by the reference frame 8A.

Moreover, the exposure apparatus EX includes a chamber apparatus 9 which adjusts an environment (at least one of temperature, humidity, pressure, and a degree of cleanness) of a space CS to which the exposure light EL advances. The chamber apparatus 9 includes an air conditioner 9S which supplies a gas GS to the space CS. The air conditioner 9S supplies the gas GS, in which the temperature, the humidity, and the degree of cleanness are adjusted, to the space CS.

At least the projection optical system PL, the liquid immersion member 5, the substrate stage 2, and the measurement stage 3 are disposed at the space CS. In the present embodiment, at least a portion of the mask stage 1 and the illumination system IL is also disposed at the space CS.

The mask M includes a reticle on which a device pattern projected to the substrate P is formed. For example, the mask M includes a transmission type mask which includes a transparent plate such as a glass plate, and a pattern formed on the transparent plate using a light-shielding material such as chromium. Moreover, a reflection type mask may be used as the mask M.

The substrate P is a substrate used to manufacture a device. For example, the substrate P includes a base material such as a semiconductor wafer and a photosensitive film which is formed on the base material. The photosensitive film is a film of a photosensitive material (photoresist). Moreover, the substrate P may include other films in addition to the photosensitive film. For example, the substrate P may include an antireflection film and a protective film (top coat film) which protects the photosensitive film.

The illumination system IL radiates the exposure light EL to an illumination region IR. The illumination region IR includes positions which can be radiated with the exposure light EL emitted from the illumination system IL. The illumination system IL illuminates at least a portion of the mask M disposed at the illumination region IR by the exposure light EL having a uniform illumination distribution. For example, as for the exposure light EL which is emitted from the illumination system IL, far-ultraviolet light (DUV light) such as a bright line (g-line, h-line, i-line) emitted from a mercury lamp and KrF excimer laser light (248 nm in wavelength), ArF excimer laser light (193 nm in wavelength), vacuum-ultraviolet light (VUV light) such as $F_2$ laser light (157 nm in wavelength), and the like are used. In the present embodiment, as for the exposure light EL, ArF excimer laser light, which is ultraviolet light (vacuum-ultraviolet light), is used.

The mask stage 1 is movable in a state where it holds the mask M. For example, the mask stage 1 is moved by an operation of a driving system 11 which includes a planar motor as disclosed in U.S. Pat. No. 6,452,292. In the present embodiment, the mask stage 1 is movable in six directions of the X axis, the Y axis, the Z axis, the θX, the θY, and the θZ by the operation of the driving system 11. Moreover, the driving system 11 may not include a planar motor. The driving system 11 may include a linear motor.

The projection optical system PL radiates the exposure light EL to a projection region PR. The projection region PR includes positions which can be radiated with the exposure light EL emitted from the projection optical system PL. The projection optical system PL projects the image of the pattern of the mask M on at least a portion of the substrate P disposed at the projection region PR by a predetermined projection magnification. In the present embodiment, the projection optical system PL is a reduction system. The projection magnification of the projection optical system PL is ¼. In addition, the projection magnification of the projection optical system PL may be ⅕, ⅛, or the like. Moreover, the projection optical system PL may be either an equal magnification system or an enlargement system. In the present embodiment, the optical axis of the projection optical system PL is parallel to the Z axis. The projection optical system PL may be any of a refraction system which does not include a reflective optical element, a reflection system which does not include a refractive optical element, or a reflective refraction system which includes the reflective optical element and the refractive optical element. The projection optical system PL may form either an inverted image or an erected image.

The projection optical system PL includes a terminal optical element 13 which includes an emitting surface 12 from which the exposure light EL is emitted. The emitting surface 12 emits the exposure light EL toward the image surface of the projection optical system PL. The terminal optical element 13 is an optical element nearest to the image surface of the projection optical system PL among the plurality of optical elements of the projection optical system PL. The projection region PR includes positions which can be radiated with the exposure light EL emitted from the emitting surface 12. In the present embodiment, the emitting surface 12 faces the −Z direction. The exposure light EL emitted from the emitting surface 12 advances in the −Z direction. The emitting surface 12 is parallel to the XY plane. Moreover, the emitting surface 12 facing the −Z direction may have a convex surface or a concave surface. In addition, the emitting surface 12 may be inclined with respect to the XY plane and may include a curved surface. In the present embodiment, the optical axis AX of the terminal optical element 13 is parallel to the Z axis.

With respect to the direction parallel to the optical axis AX of the terminal optical element 13, the emitting surface 12 side is at the −Z side, and the incident surface side is at the +Z side. With respect to the direction parallel to the optical axis of the projection optical system PL, the image surface side of the projection optical system PL is at the −Z side, and the object surface side of the projection optical system PL is at the +Z side. In the present embodiment, the emitting surface 12 side (image surface side) is at the lower side (lower portion), and the incident surface side (object surface side) is at the upper side (upper portion).

The substrate stage 2 is movable in the XY plane, which includes positions (projection region PR) which can be radiated with the exposure light EL from the emitting surface 12, in a state where the substrate stage holds the substrate P. The measurement stage 3 is movable in the XY plane, which includes positions (projection region PR) which can be radiated with the exposure light EL from the emitting surface 12, in a state where a measurement member (measurement instrument) C is mounted on the measurement stage. Each of the substrate stage 2 and the measurement stage 3 is movable on a guide surface 14G of a base member 14. The guide surface 14G and the XY plane are substantially parallel to each other.

The substrate stage 2 includes a first holding part which releasably holds the substrate P and a second holding part which is disposed at the surrounding of the first holding part and releasably holds a cover member T as disclosed in, for example, United States Patent Application, Publication No. 2007/0177125, United States Patent Application, Publication No. 2008/0049209, and the like. The first holding part holds the substrate P so that the surface (upper surface) of the substrate P and the XY plane are substantially parallel to each other. The upper surface of the substrate P held by the first holding part and the upper surface of the cover member T held by the second holding part are disposed at substantially the same plane. With respect to the Z axis direction, the distance between the emitting surface 12 and the upper surface of the substrate P held by the first holding part is substantially the same as the distance between the emitting surface 12 and the upper surface of the cover member T held by the second holding part.

Moreover, with respect to the Z axis direction, the distance between the emitting surface 12 and the upper surface of the substrate P being substantially the same as the distance between the emitting surface 12 and the upper surface of the cover member T includes a difference of the distance between the emitting surface 12 and the upper surface of the substrate P and the distance between the emitting surface 12 and the upper surface of the cover member T being within 10% of the distance (a so-called working distance) between the emitting surface 12 and the upper surface of the substrate P when the substrate P is exposed, for example. In addition, the upper surface of the substrate P held by the first holding part and the upper surface of the cover member T held by the second holding part may not be disposed on substantially the same plane. For example, with respect to the Z axis direction, the position of the upper surface of the substrate P and the position of the upper surface of the cover member T may be different from each other. For example, there may be a step between the upper surface of the substrate P and the upper surface of the cover member T. In addition, the upper surface of the cover member T may be inclined with respect to the upper surface of the substrate P. The upper surface of the cover member T may include a curved surface.

The substrate stage 2 and the measurement stage 3 are moved by an operation of a driving system 15 which includes a planar motor as disclosed in, for example, U.S. Pat. No. 6,452,292. The driving system 15 includes a mover 2C which is disposed at the substrate stage 2, a mover 3C which is disposed at the measurement stage 3, and a stator 14M which is disposed at the base member 14. Each of the substrate stage 2 and the measurement stage 3 is movable on a guide surface 14G in six directions of the X axis, the Y axis, the Z axis, the θX, the θY, and the θZ directions by the operation of the driving system 15. Moreover, the driving system 15 may not include a planar motor. The driving system 15 may include a linear motor.

The measurement system 4 includes an interferometer system. The interferometer system includes a unit which radiates measurement light to a measurement mirror of the substrate stage 2 and a measurement mirror of the measurement stage 3 and measures the positions of the substrate stage 2 and the measurement stage 3. In addition, for example, the measurement system may include an encoder system disclosed in United States Patent Application, Publication No. 2007/0288121. Moreover, the measurement system 4 may include only one of the interferometer system and the encoder system.

When exposure processing of the substrate P is performed, or when predetermined measurement processing is performed, the controller 6 performs position controls of the substrate stage 2 (substrate P) and the measurement stage 3 (measurement member C) based on the measurement results of the measurement system 4.

Figure 2:
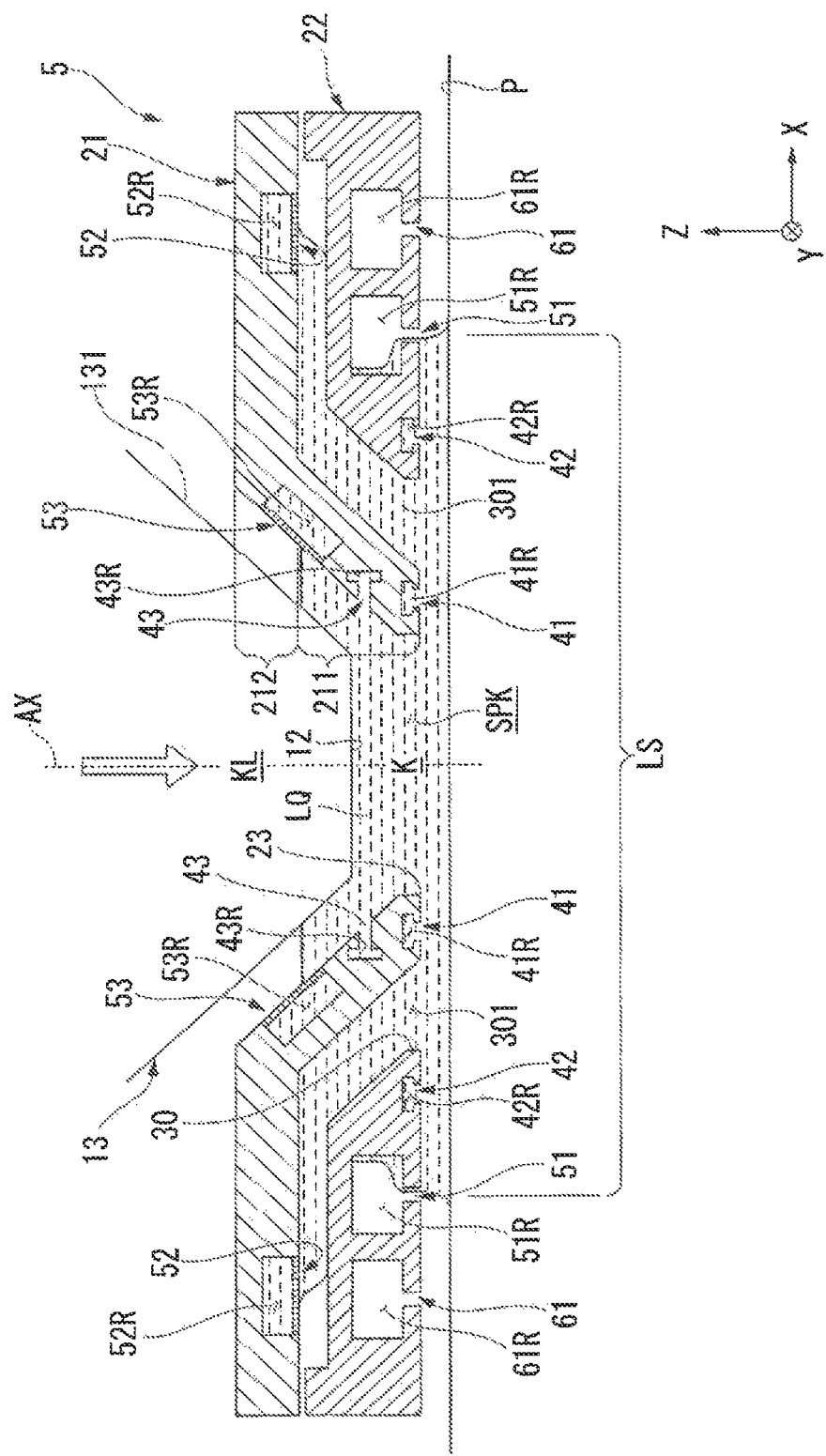
FIG. 2 is a side cross-sectional view showing an example of a liquid immersion member according to the first embodiment.
Figure 3:
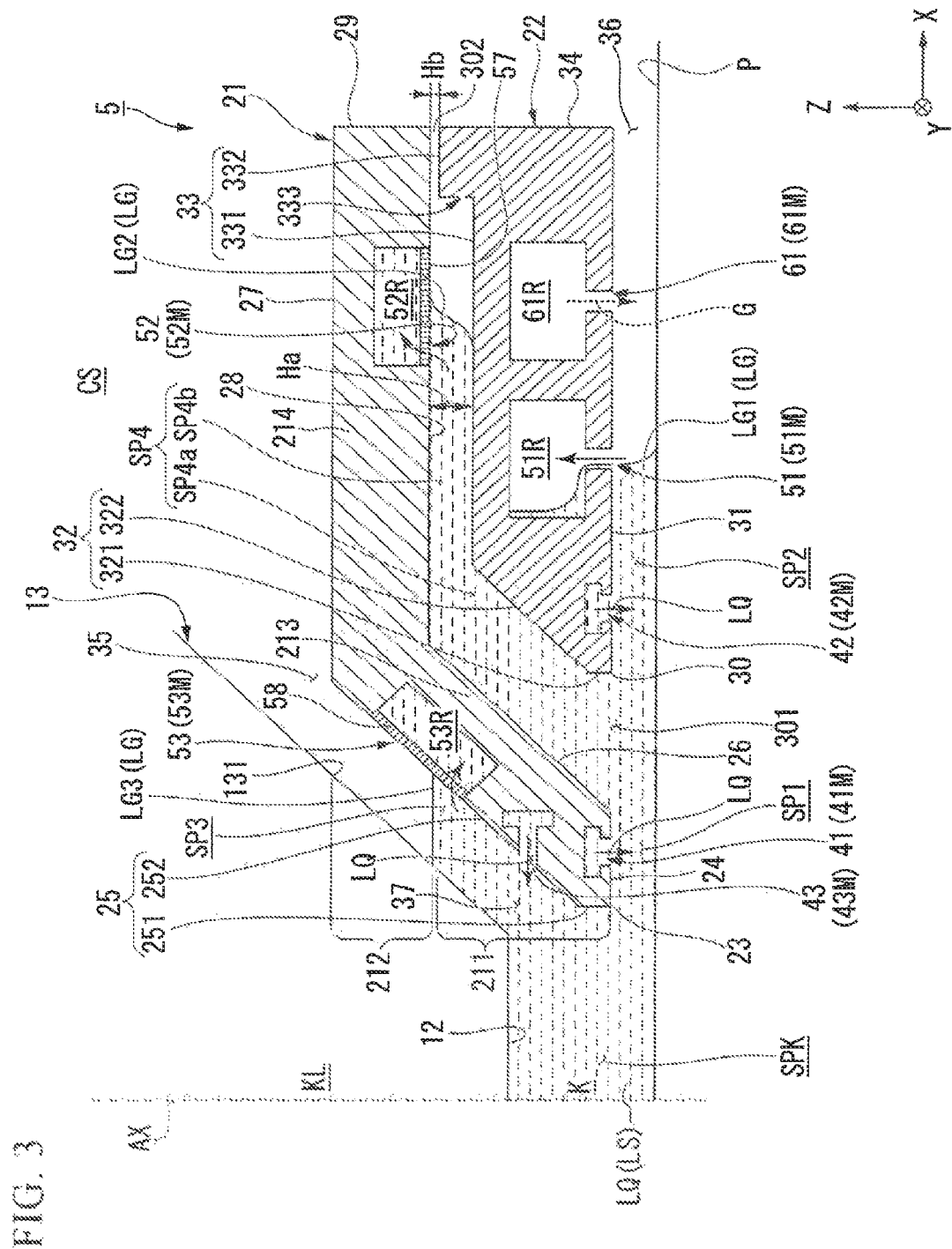
FIG. 3 is a side cross-sectional view showing a portion of the liquid immersion member according to the first embodiment.
Figure 4:
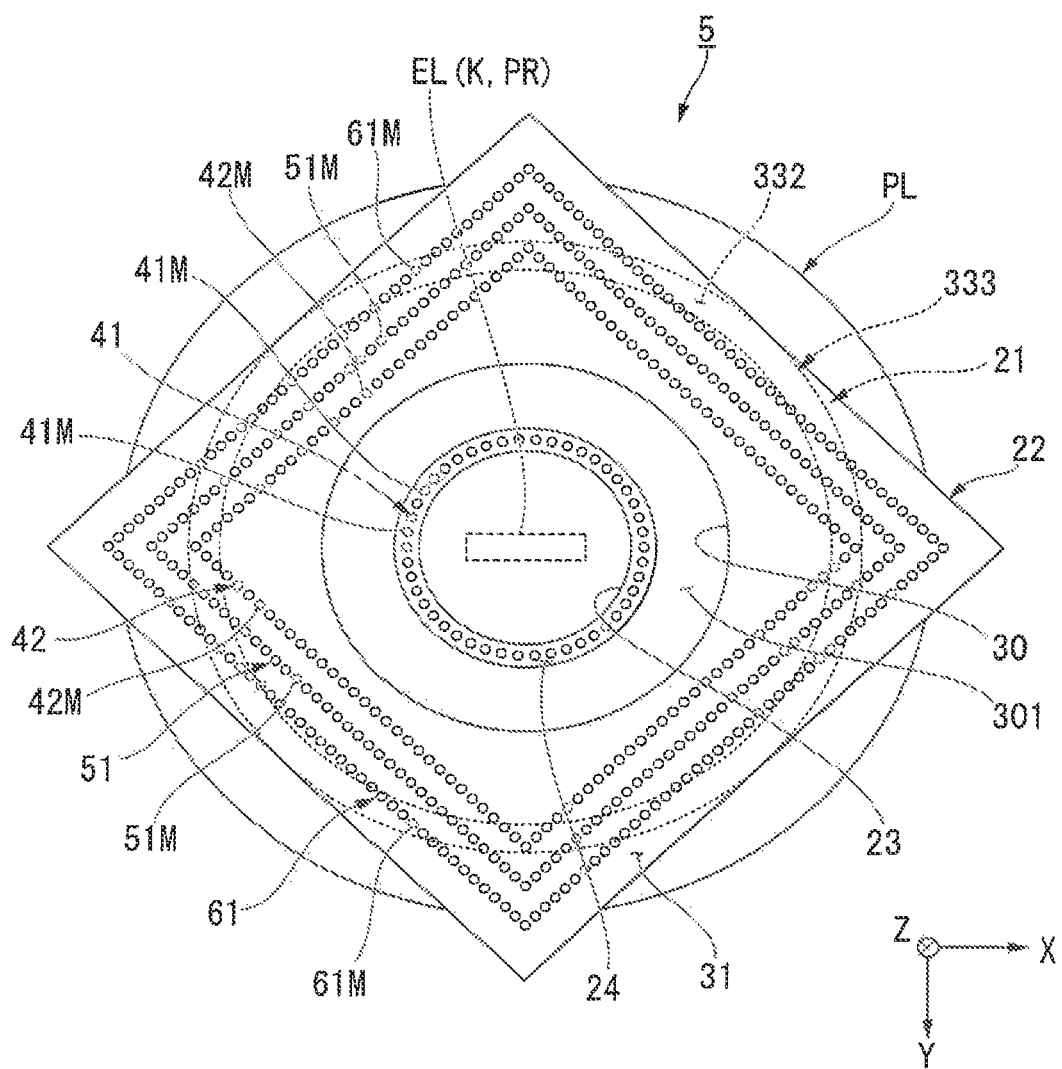
FIG. 4 is a view of the liquid immersion member according to the first embodiment as seen from below.
Figure 5:
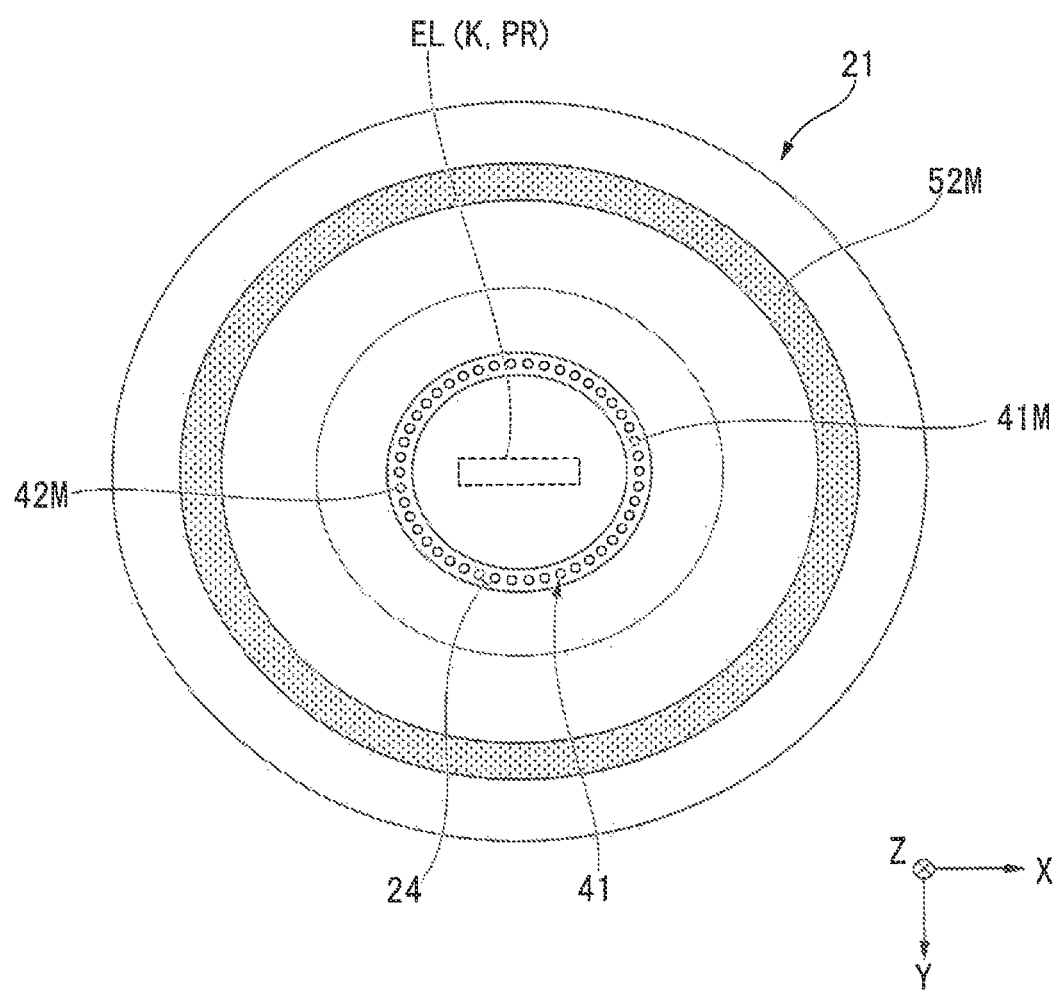
FIG. 5 is a view of a first member according to the first embodiment as seen from below.

Next, the liquid immersion member 5 according to the present embodiment will be described. In addition, the liquid immersion member may also be referred to as a nozzle member. FIG. 2 is a cross-sectional view of the terminal optical element 13 and the liquid immersion member 5 parallel to the XZ plane. FIG. 3 is a view in which a portion of FIG. 2 is enlarged. FIG. 4 is a view of the liquid immersion member 5 as seen from below (−Z side). FIG. 5 is a view of a first member 21 of the liquid immersion member 5 as seen from below (−Z side).

The terminal optical element 13 includes the emitting surface 12 facing the −Z axis direction and an outer surface 131 which is disposed at the surrounding of the emitting surface 12. The exposure light EL is emitted from the emitting surface 12. The exposure light EL is not emitted from the outer surface 131. The exposure light EL passes through the emitting surface 12 and does not pass through the outer surface 131. The outer surface 131 is a non-emitting surface from which the exposure light EL is not emitted. In the present embodiment, the outer surface 131 is inclined upwardly and outwardly in a radial direction with respect to the optical path AX of the terminal optical element 13.

The liquid immersion member 5 forms a liquid immersion space LS of the liquid LQ above the surface (upper surface) of the object which is movable below the terminal optical element 13.

The object which is movable below the terminal optical element 13 is movable in the XY plane which includes the position opposite to the emitting surface 12. The surface (upper surface) of the object is able to be opposite to the emitting surface 12 and is capable of being disposed at the projection region PR. The object is movable below the liquid immersion member 5 and is capable of being opposite to the liquid immersion member 5.

In the present embodiment, the object includes at least one of at least a portion of the substrate stage 2 (for example, the cover member T of the substrate stage 2), the substrate P which is held by the substrate stage 2 (first holding part), and the measurement stage 3.

In the exposure of the substrate P, the liquid immersion space LS is formed so that the optical path K of the exposure light EL between the emitting surface 12 of the terminal optical element 13 and the substrate P is filled with the liquid LQ. When the exposure light EL is radiated to the substrate P, the liquid immersion space LS is formed so that only a portion of the surface region of the substrate P which includes the projection region PR is covered by the liquid LQ.

In descriptions below, the object is defined as the substrate P. Moreover, as described above, the object may be at least one of the substrate stage 2 and the measurement stage 3, and the object may be one other than the substrate P, the substrate stage 2, and the measurement stage 3.

The liquid immersion space LS may be formed over two objects. For example, the liquid immersion space LS may be formed over the cover member T of the substrate stage 2 and the substrate P. The liquid immersion space LS may be formed over the substrate stage 2 and the measurement stage 3.

The liquid immersion space LS is formed so that the optical path K of the exposure light EL emitted from the emitting surface 12 of the terminal optical element 13 is filled with the liquid LQ. At least a portion of the liquid immersion space LS is formed in a space between the terminal optical element 13 and the substrate P (object). At least a portion of the liquid immersion space LS is formed in a space between the liquid immersion member 5 and the substrate P (object).

The liquid immersion member 5 includes the first member 21 including a first part 211 disposed at at least a portion of the surrounding of the optical path of the exposure light EL, and the second member 22 in which at least a portion is disposed outside the first part 211 with respect to the optical path K. The second member 22 is movable with respect to the first member 21 outside the first part 211 with respect to the optical path of the exposure light EL.

In the present embodiment, the first part 211 is disposed at at least a portion of the surrounding of the optical path K of the exposure light EL emitted from the emitting surface 12. Moreover, the first part 211 may be disposed at at least a portion of the surrounding of the optical path K of the exposure light EL emitted from the emitting surface 12, and may be disposed at at least a portion of the surrounding of the optical path KL (the optical path KL of the exposure light EL which passes through the terminal optical element 13) of the exposure light EL in the terminal optical element 13. In other words, in the present embodiment, the optical path of the exposure light EL may include the optical path K of the exposure light EL between the emitting surface 12 and the substrate P (object), and may also include the optical path KL of the exposure light EL in the terminal optical element 13. The first part 211 may be a portion which is disposed at at least a portion of the surrounding of the optical path K, and may be a portion which is disposed at at least a portion of the surrounding of the optical path K and the optical path KL (optical path K and the terminal optical element 13).

The first part 211 of the first member 21 includes a lowermost part of the first member 21. The first part 211 of the first member 21 includes a portion closest to the surface (upper surface) of the substrate P (object) of the first member 21. In the present embodiment, the first part 211 of the first member 21 is disposed below the emitting surface 12 of the terminal optical element 13. At least a portion of the first part 211 may be disposed above the emitting surface 12.

The second member 22 is a movable member which is able to move. The terminal optical element 13 does not substantially move. The first member 21 also does not substantially move. The first member 21 does not substantially move with respect to the optical element 13.

The first member 21 is disposed so as not to contact the terminal optical element 13. A gap is formed between the terminal optical element 13 and the first member 21. The second member 22 is disposed so as not to contact the terminal optical element 13 and the first member 21. A gap is formed between the first member 21 and the second member 22. The second member 22 moves so as not to contact the terminal optical element 13 and the first member 21.

The substrate P (object) is able to be opposite to at least a portion of the terminal optical element 13 via the gap. The substrate P (object) is able to be opposite to at least a portion of the first member 21 via the gap. The substrate P (object) is able to be opposite to at least a portion of the second member 22 via the gap. The substrate P (object) is movable below the terminal optical element 13, the first member 21, and the second member 22.

At least a portion of the first member 21 is opposite to the terminal optical element 13 via the gap. In the present embodiment, the first member 21 is opposite to the outer surface 131, and is not opposite to the emitting surface 12.

At least a portion of the second member 22 is opposite to the first member 21 via the gap. The second member 22 is not opposite to the terminal optical element 13. The first member 21 is disposed between the second member 22 and the terminal optical element 13.

The first member 21 includes the first part 211 which is disposed at at least a portion of the surrounding of the optical path K, and a second part 212 which is disposed at at least a portion of the surrounding of the terminal optical element 13. The second part 212 is disposed above the first part 211. In the present embodiment, the first member 21 is an annular member. The first part 211 is disposed at the surrounding of the optical path K. The second member 212 is disposed at the surrounding of the terminal optical element 13.

The first member 21 includes a first opening part 23 through which the exposure light EL emitted from the emitting surface 12 is able to pass, a lower surface 24 which is disposed at the surrounding of the first opening part 23 and faces the −Z axis direction, an inner surface 25 in which at least a portion is opposite to the outer surface 131 of the terminal optical element 13, an outer surface 26 which faces the direction opposite to the inner surface 25, an upper surface 27 which faces the +Z axis direction, a lower surface 28 which faces the direction opposite to the upper surface 27, and an outer surface 29 which faces outward in the radial direction with respect to the optical axis AX.

The lower surface 24 is disposed at the surrounding of the lower end of the first opening part 23. The surface (upper surface) of the substrate P (object) is able to be opposite to the lower surface 24. The lower surface 24 does not face the second member 22. The first opening part 23 and the lower surface 24 are provided at the first part 211.

At least a portion of the inner surface 25 is opposite to the outer surface 131 via a gap. A portion (the lower portion) of the inner surface 25 is disposed at the surrounding of the optical path K. A portion (the upper portion) of the inner surface 25 is disposed at the surrounding of the terminal optical element 13. The first part 211 includes a portion (the lower portion) of the inner surface 25, and the second part 212 includes a portion (the upper portion) of the inner surface 25.

At least a portion of the outer surface 26 is opposing the second member 22 via a gap. The first part 211 includes a portion (the lower portion) of the outer surface 26, and the second part 212 includes a portion (the upper portion) of the outer surface 26.

The lower surface 24 is disposed so that the lower end of the inner surface 25 and the lower end of the outer surface 26 are connected to each other. An inner edge of the lower surface 24 is connected to the lower end of the inner surface 25. An outer edge of the lower surface 24 is connected to the lower end of the outer surface 26.

The upper surface 27 faces the space CS. The upper surface 27 does not face the second member 22. The upper surface 27 is connected to the upper end of the inner surface 25. The upper surface 27 is disposed at the surrounding of the upper end of the inner surface 25. The second part 212 includes the upper surface 27.

At least a portion of the lower surface 28 is opposite to the second member 22 via a gap. The lower surface 28 is connected to the upper end of the outer surface 26. The lower surface 28 is disposed at the surrounding of the upper end of the upper surface 26. The second part 212 includes the lower surface 28.

The outer surface 29 faces the space CS. The outer surface 29 does not face the second member 22. The outer surface 29 is disposed so that the outer edge of the upper surface 27 and the outer edge of the lower surface 28 are connected to each other. The second member 212 includes the outer surface 29.

Each of the lower surface 24, the inner surface 25, the outer surface 26, the upper surface 27, the lower surface 28, and the outer surface 29 is a non-recovery part which is not able to recover the liquid LQ. The lower surface 24 is able to hold the liquid LQ between the lower surface 24 and the substrate P (object). The inner surface 25 is able to hold the liquid LQ between the inner surface 25 and the terminal optical element 13. The outer surface 26 and the lower surface 28 are able to hold the liquid LQ between the outer surface 26 and the lower surface 28, and the second member 22.

In the descriptions below, a portion of the first member 21 including the lower surface 24, the inner surface 25, and the outer surface 26 is appropriately referred to as an surrounding part 213, and a portion of the first member 21 including the upper surface 27, the lower surface 28, and the outer surface 29 is appropriately referred to as an upper plate part 214.

At least a portion of the surrounding part 213 is opposite to the outer surface 131 of the terminal optical element 13. The enclosing part 213 is disposed at the surrounding of the optical path K and the terminal optical element 13 (optical path K). The upper plate part 214 is disposed above the surrounding part 213. The upper plate part 214 is connected to the upper end of the surrounding part 213. The surrounding part 213 includes the first part 211. The surrounding part 213 includes a portion of the second part 212. The upper plate part 214 includes a portion of the second part 212. The second member 22 is disposed below the upper plate part 214 (second part 212). In addition, the surrounding part 213 may not include the second part 212. In addition, the upper plate part 214 may include the first part 211.

The lower surface 24 is disposed below the emitting surface 12. The lower surface 24 is substantially parallel to the plane (XY plane) perpendicular to the optical axis AX (Z axis) of the terminal optical element 13.

The inner surface 25 is disposed above the lower surface 24. At least a portion of the inner surface 25 is inclined upwardly and outwardly in a radial direction with respect to the optical axis AX. In the present embodiment, the inner surface 25 is connected to the inner edge of the lower surface 24, and includes a region 251 which is substantially parallel to the optical axis AX (Z axis), and a region 252 which is disposed above the region 251 and is inclined upwardly and outwardly in the radial direction with respect to the optical axis AX. With respect to the Z axis direction, a size of the region 252 is larger than a size of the region 251.

The outer surface 26 is disposed above the lower surface 24. At least a portion of the outer surface 26 is inclined upwardly and outwardly in the radial direction with respect to the optical axis AX. The outer surface 26 is disposed outside the lower surface 24 in the radial direction with respect to the optical axis AX.

The upper surface 27 is disposed above the lower surface 24, the inner surface 25, the outer surface 26, and the lower surface 28. The upper surface 27 is substantially parallel to the XY plane.

The lower surface 28 is disposed above the lower surface 24 and the outer surface 26. The lower surface 28 is disposed outside the lower surface 24 and the outer surface 26 in the radial direction with respect to the optical axis AX. A step is formed between the lower surface 24 and the lower surface 28. The lower surface 28 is substantially parallel to the XY plane.

The second member 22 is disposed to surround at least a portion of the first part 211 and the second part 212. Moreover, the second member 22 may be disposed to surround at least a portion of the first part 211, and may not surround the second part 212. In the present embodiment, the second member 22 is an annular member.

In the present embodiment, the second member 22 is disposed outside the surrounding part 213. At least a portion of the second member 22 is disposed below the upper plate part 214. In other words, at least a portion of the second member 22 is disposed between the upper plate part 214 and the substrate P (object). In the present embodiment, the second member 22 is disposed at a space outside the surrounding part 213 below the upper plate part 214. The second member 22 moves in the space outside the surrounding part 213 below the upper plate part 214.

The second member 22 includes a second opening part 30 through which the emitting light EL emitted from the emitting surface 12 is able to pass, a lower surface 31 which is disposed at the surrounding of the second opening part 30 and faces the −Z axis direction, an inner surface 32 in which at least a portion is opposite to the outer surface 26 of the first member 21, a upper surface 33 in which at least a portion faces the +Z axis direction, and an outer surface 34 which faces outward in the radial direction with respect to the optical axis AX.

In the XY plane, the second opening part 30 is larger than the first opening part 23. At least a portion of the optical path K and the first member 21 is disposed inside the second opening part 30. In the present embodiment, the first part 211 of the first member 21 is disposed inside the second opening part 30.

In the descriptions below, an opening part of one end (lower end) of a gap between the first member 21 and the second member 22 is appropriately referred to as an opening part 301. The opening part 301 is disposed between the first part 211 and the second member 22. The opening part 301 is disposed between the outer edge of the lower surface 24 and the inner edge of the lower surface 31. The one end (opening part 301) of the gap between the first member 21 and the second member 22 is disposed to be opposite to the surface (upper surface) of the substrate P (object). The liquid LQ on the substrate P (object) is able to flow into the gap between the first member 21 and the second member 22 from the opening part 301.

The lower surface 31 is disposed at the surrounding of the lower end of the second opening part 30 (opening part 301). In the present embodiment, the lower surface 31 is disposed at the surrounding of the lower surface 24. The surface (upper surface) of the substrate P (object) is able to be opposite to the lower surface 31. The opening part 301 is disposed between the lower surface 24 and the lower surface 31.

At least a portion of the inner surface 32 is opposite to the first member 21 via a gap. In the present embodiment, at least a portion of the inner surface 32 is opposite to the outer surface 26 via a gap. At least a portion of the inner surface 32 is disposed at the surrounding of the surrounding part 213. The inner edge of the lower surface 31 and the lower end of the inner surface 32 are connected to each other.

At least a portion of the upper surface 33 is opposite to the first member 21 via a gap. The upper surface 33 is connected to the upper end of the inner surface 32. The upper surface 33 is disposed at the surrounding of the upper end of the inner surface 32.

The outer surface 34 faces the space CS. The outer surface 34 does not face the first member 21. The outer surface 34 is disposed to connect the outer edge of the upper surface 33 and the outer edge of the lower surface 31.

Each of the lower surface 31, the inner surface 32, the upper surface 33, and the outer surface 34 is a non-recovery part which is not able to recover the liquid LQ. The lower surface 31 is able to hold the liquid LQ between the lower surface 31 and the substrate P (object). The inner surface 32 and the upper surface 33 is able to hold the liquid LQ between the inner surface 32 and the upper surface 33, and the first member 21.

The lower surface 31 is disposed below the emitting surface 12. The lower surface 31 is substantially parallel to the plane (XY plane) perpendicular to the optical axis AX (Z axis) of the terminal optical element 13. In the present embodiment, the lower surface 24 and the lower surface 31 are disposed on substantially a same plane (are flush with each other).

The inner surface 32 is disposed above the lower surface 31. At least a portion of the inner surface 32 is inclined upwardly and outwardly in the radial direction with respect to the optical axis AX. In the present embodiment, the inner surface 32 is connected to the inner edge of the lower surface 31, and includes a region 321 which is substantially parallel to the optical axis AX (Z axis), and a region 322 which is disposed above the region 321 and is inclined upwardly and outwardly in the radial direction with respect to the optical axis AX. With respect to the Z axis direction, a size of the region 322 is larger than a size of the region 321.

The upper surface 33 is disposed above the lower surface 31 and the outer surface 32. The upper surface 33 is disposed outside the inner surface 32 in the radial direction with respect to the optical axis AX. In the present embodiment, the upper surface 33 includes a region 331 which is connected to the upper end of the inner surface 32, and a region 332 which is positioned outside the region 331 in the radial direction with respect to the optical axis AX and is disposed above the region 331. In the present embodiment, a size of the region 332 is smaller than a size of the region 331 in the radial direction with respect to the optical axis AX. The region 331 is substantially parallel to the XY plane. The region 332 is substantially parallel to the XY plane. A step is formed between the region 331 and the region 332.

In the present embodiment, the second member 22 includes a protruding part (wall part) 333 at the surrounding of the region 331. The region 332 includes the upper surface of the protruding part 333.

As shown in FIG. 4, the first opening part 23 has substantially the circular shape in the XY plane. The second opening part 30 also has a substantially circular shape. The opening part 301 has an annular shape (circular annular shape).

As shown in FIG. 4, in the XY plane, an outer shape of the first member 21 has substantially the circular shape. The outer shape of the second member 22 is rectangular. The region 332 has an annular shape (circular annular shape).

In the descriptions below, a space to which the emitting surface 12 faces is appropriately referred to as an optical path space SPK. The optical path space SPK is a space at the emitting surface 12 side. The optical path space SPK is a space between the terminal optical element 13 and the substrate P (object). The optical path space SPK is a space which includes the optical path K between the emitting surface 12 and the upper surface of the substrate P (object).

Moreover, a space to which the lower surface 24 faces is appropriately referred to as a first space SP1. The first space SP1 is a space of the lower surface 24 side. The first space SP1 is a space between the first member 21 and the substrate P (object). The first space SP1 is a space between the lower surface 24 and the upper surface of the substrate P (object).

In addition, a space to which the lower surface 31 faces is appropriately referred to as a second space SP2. The second space SP2 is a space at the lower surface 31 side. The second space SP2 is a space between the second member 22 and the substrate P (object). The second space SP2 is a space between the lower surface 31 and the upper surface of the substrate P (object).

Moreover, in the present embodiment, a size in the Z axis direction of the second space SP2, that is, a distance between the lower surface 31 and the upper surface of the substrate P (object) in the Z axis direction is 0.1 mm to 0.2 mm.

In addition, a space to which the inner surface 25 faces is appropriately referred to as a third space SP3. The third space SP3 is a space at the inner surface 25 side. The third space SP3 is a space between the first member 21 and the terminal optical element 13. The third space SP3 is a space between the inner surface 25 and the outer surface 131.

In addition, a space to which the inner surface 32 and the upper surface 33 face is appropriately referred to as a fourth space SP4. The fourth space SP4 is a space to which the inner surface 32 and the upper surface 33 face. The fourth SP4 is a gap (space) between the first member 21 and the second member 22. The fourth space SP4 is a space between the inner surface 32 and the upper surface 33, and the outer surface 26 and the lower surface 28.

Moreover, in the fourth space SP4, a space between the surrounding part 213 (first part 211) and the second member 22 is appropriately referred to as a space SP4$a$, and a space SP4 between the upper plate part 214 (second part 212) and the second member 22 is appropriately referred to as a space SP4$b$.

In the present embodiment, the gap (fourth space SP4) between the first member 21 and the second member 22 includes a first gap part having a size Ha, and a second gap part which is disposed outside the first gap part with respect to the optical axis AX of the terminal optical element 13 and which has a size Hb smaller than the size Ha.

In the present embodiment, the first gap part includes a gap (space) between the region 331 and the lower surface 28. The second gap part includes a gap (space) between the region 332 and the lower surface 28. The lower surface 28 of the first member 21 defining the second gap part and the region 332 of the second member 22 opposite to the lower surface 28 are substantially parallel to the XY plane.

In the present embodiment, at least a portion of one or both of the surface of the first member 21 and the surface of the second member 22 facing the gap (fourth space SP4) between the first member 21 and the second member 22 may have a liquid repellent property with respect to the liquid LQ. For example, the upper surface 33 of the second member 22 may have the liquid repellent property with respect to the liquid LQ. The lower surface 28 of the first member 21 may have the liquid repellent property with respect to the liquid LQ. For example, the surface having the liquid repellent property with respect to the liquid LQ includes a surface in which a contact angle with respect to the liquid LQ is 90° or more. Moreover, for example, the surface having the liquid repellent property with respect to the liquid LQ may include a surface in which the contact angle with respect to the liquid LQ is 100° or more, a surface in which the contact angle is 110° or more, or a surface in which the contact angle is 120° or more. The surface having the liquid repellent property with respect to the liquid LQ includes a surface of a film having the liquid repellent property with respect to the liquid LQ. For example, the film may be a resin film which includes fluorine. For example, the upper surface 33 may be a surface of the resin film including fluorine. The lower surface 28 may be a surface of the resin film including fluorine. The film having the liquid repellent property with respect to the liquid LQ may be a film including Tetra fluoro ethylene-perfluoro alkylvinyl ether copolymer (PFA). The film having the liquid repellent property with respect to the liquid LQ may be a film including Poly tetra fluoro ethylene (PTFE).

In the present embodiment, a portion of an interface LG of the liquid LQ in the liquid immersion space LS is formed between the second member 22 and the substrate P (object). A portion of the interface LG of the liquid LQ in the liquid immersion space LS is formed between the first member 21 and the second member 22. A portion of the interface LG of the liquid LQ in the liquid immersion space LS is formed between the terminal optical element 13 and the first member 21.

In the descriptions below, the interface LG which is formed between the second member 22 and the substrate P (object) is appropriately referred to as a first interface LG1. The interface LG of the liquid LQ which is formed between the first member 21 and the second member 22 is appropriately referred to as a second interface LG2. The interface LG which is formed between the terminal optical element 13 and the first member 21 is appropriately referred to as a third interface LG3.

The liquid immersion member 5 includes a first liquid supply part 41, a second liquid supply part 42, and a third liquid supply part 43 capable of supplying the liquid LQ, a first liquid recovery part 51, a second liquid recovery part 52, and a third liquid recovery part 53 capable of recovering the liquid LQ, and a first gas supply part 61 capable of supplying gas.

The first liquid supply part 41 is disposed at the first part 211 of the first member 21. The first liquid supply part 41 is disposed at at least a portion of the surrounding of the first opening part 23. The first liquid supply part 41 is disposed to be opposite to the upper surface of the substrate P (object). The first liquid supply part 41 is disposed to face the first space SP1. The first liquid supply part 41 is disposed at the lower surface 24.

In the present embodiment, the first liquid supply part 41 is disposed at the lower surface 24, and includes an opening (first liquid supply port) 41M capable of supplying the liquid LQ. As shown in FIG. 4, a plurality of first liquid supply ports 41M are disposed at the lower surface 24. The plurality of first liquid supply ports 41M are disposed to surround the optical path K. The plurality of first liquid supply ports 41M are disposed with intervals at the surrounding of the optical path K. In the present embodiment, the plurality of first liquid supply ports 41M are disposed along a circular virtual line in the XY plane.

Each of the first liquid supply parts 41 (first liquid supply port 41M) is connected to a liquid supply apparatus via a supply channel 41R which is formed inside the first member 21. The liquid supply apparatus includes a filter apparatus which cleans the liquid LQ to be supplied, a temperature adjustment apparatus which is able to adjust the temperature of the liquid LQ to be supplied, or the like, and the liquid supply apparatus is able to supply a cleaned liquid LQ in which the temperature is adjusted. The liquid LQ discharged from the liquid supply apparatus is sent to the first liquid supply part 41 via the supply channel 41R. The first liquid supply part 41 supplies the liquid LQ supplied from the liquid supply apparatus via the supply channel 41R to the first space SP1.

The second liquid supply part 42 is disposed at the second member 22. The second liquid supply part 42 is disposed at at least a portion of the surrounding of the second opening part 30. The second liquid supply part 42 is disposed to be opposite to the upper surface of the substrate P (object). The second liquid supply part 42 is disposed to face the second space SP2. The second liquid supply part 42 is disposed at the lower surface 31.

In the present embodiment, the second liquid supply part 42 is disposed at the lower surface 31, and includes an opening (second liquid supply port) 42M which is able to supply the liquid LQ. As shown in FIG. 4, a plurality of the second liquid supply ports 42M are disposed at the lower surface 31. The plurality of second liquid supply ports 42M are disposed to surround the optical path K. The second liquid supply ports 42M are disposed with intervals at the surrounding of the optical path K. In the present embodiment, the plurality of second liquid supply parts 42M are disposed along a rectangular virtual line in the XY plane.

The second liquid supply part 42 (second liquid supply port 42M) is connected to the liquid supply apparatus via a supply channel 42R which is formed inside the second member 22. The liquid LQ discharged from the liquid supply apparatus is sent to the second liquid supply part 42 via the supply channel 42R. The second liquid supply part 42 supplies the liquid LQ supplied from the liquid supply apparatus via the supply channel 42R to the second space SP2.

The third liquid supply part 43 is disposed at the first member 21. In the present embodiment, the third liquid supply part 43 is disposed at the first part 211 of the first member 21. The third liquid supply part 43 is disposed at a least a portion of the surrounding of the optical path K. The third liquid supply part 43 is disposed to face the optical path K. The third liquid supply part 43 is disposed to face the optical path space SPK. The third liquid supply part 43 is disposed at the inner surface 25.

In the present embodiment, the third liquid supply part 43 is disposed at the inner surface 25, and includes an opening (third liquid supply port) 43M which is able to supply the liquid LQ. A plurality of the third liquid supply ports 43M are disposed at the inner surface 25. The third liquid supply ports 43M may be disposed at each of the +X side and the −X side with respect to the optical path K. The third liquid supply ports 43M may be disposed at each of the +Y side and the −Y side with respect to the optical path K. The third liquid supply ports 43M may be disposed at each of the +X side, the −X side, the +Y side, and the −Y side with respect to the optical path K. A plurality of the third liquid supply ports 43M may be provided to surround the optical path K.

The third liquid supply part 43 (third liquid supply port 43M) is connected to the liquid supply apparatus via a supply channel 43R which is formed inside the first member 21. The liquid LQ discharged from the liquid supply apparatus is sent to the third liquid supply part 43 via the supply channel 43R. The third liquid supply part 43 supplies the liquid LQ supplied from the liquid supply apparatus via the supply channel 43R to the optical path space SPK.

Moreover, the third liquid supply part 43 (third liquid supply part 43M) may be disposed at the first member 21 to face the third space SP3. That is, the third liquid supply port 43M may be disposed at the inner surface 25 of the first member 21 to be opposite to the outer surface 131. The third liquid supply part 43 may supply the liquid LQ to the gap (third space SP3) between the first member 21 and the terminal optical element 13. When the first part 211 is a portion of the first member 21 which is disposed at the surrounding of the optical path K and the optical path KL (terminal optical element 13), the third liquid supply part 43 may be disposed at the first part 211 to be opposite to the outer surface 131 of the terminal optical element 13.

The first liquid recovery part 51 is disposed at the second member 22. The first liquid recovery part 51 is disposed at at least a portion of the surrounding of the second opening part 30. The first liquid recovery part 51 is disposed to be opposite to the upper surface of the substrate P (object). The first liquid recovery part 51 is disposed to face the second space SP2. The first liquid recovery part 51 is disposed at the lower surface 31.

In the present embodiment, the first liquid recovery part 51 is disposed at the lower surface 31, and includes an opening (first liquid recover port) 51M which is able to recover the liquid LQ. As shown in FIG. 4, a plurality of the first liquid recovery ports 51M are disposed at the lower surface 31. The plurality of first liquid recovery ports 51M are disposed to surround the optical path K. The plurality of first liquid recovery ports 51M are disposed with intervals in the surrounding of the optical path K. In the present embodiment, the plurality of first liquid recovery ports 51M are disposed along a rectangular virtual line in the XY plane.

The first liquid recovery part 51 (first liquid recover port 51M) is connected to a liquid recovery apparatus via a recovery channel 51R which is formed inside of the second member 22. The liquid recovery apparatus is able to be connected to the first liquid recovery part 51 and a vacuum system (suction apparatus). The liquid recovery apparatus may include a tank which accommodates the recovered liquid LQ. The first liquid recovery part 51 is able to recover at least a portion of the liquid LQ of the second space SP2. The liquid LQ recovered from the first liquid recovery part 51 is recovered to the liquid recovery apparatus via the recovery channel 51R.

In the present embodiment, the first liquid recovery part 51 (first liquid recovery port 51M) recovers (suctions) both of the liquid LQ and the gas G of the second space SP1. The first liquid recovery part 51 is able to recover the liquid LQ and the gas G together. In other words, the first liquid recovery part 51 performs a gas-liquid mixture recovery.

The second liquid recovery part 52 is disposed at the first member 21. The second liquid recovery part 52 is able to recover at least a portion of the liquid LQ which is flowed from the substrate P (object) into the gap (fourth space SP4) between the first member 21 and the second member 22. The second liquid recovery part 52 is able to recover at least a portion of the liquid LQ which is flowed to the fourth space SP4 between the first member 21 and the second member 22 via the opening part 301. The second liquid recovery part 52 is disposed to face the fourth space SP4. The second liquid recovery part 52 is disposed above the opening part 301 inside the fourth space SP4. In the present embodiment, the second liquid recovery part 52 is disposed at the second part 212 of the first member 21. In the present embodiment, the second liquid recovery part 52 is disposed at the upper plate part 214 (second part 212) to face the space SP4*b* between the upper plate part 214 (second part 212) and the second member 22. In the present embodiment, the second liquid recovery part 52 is disposed at the lower surface 28. The second liquid recovery part 52 recovers the liquid LQ from the first gap part having the size Ha in the space SP4*b*.

The second liquid recovery part 52 (second liquid recovery port 52M) is connected to the liquid recovery apparatus via the recovery channel 52R which is formed inside the first member 21. The second liquid recovery part 52 is able to recover at least a portion of the liquid LQ of the fourth space SP4. The liquid LQ recovered from the second liquid recovery part 52 is recovered to the liquid recovery apparatus via the recovery channel 52R.

In the present embodiment, the second liquid recovery part 52 includes a porous member 57. The porous member 57 includes a mesh plate. The porous member 57 includes a lower surface which is able to be opposite to the upper surface 33, an upper surface which faces the recovery channel 52R, and a plurality of holes which connect the lower surface and the upper surface. The lower surface 28 is disposed at the surrounding of the lower surface of the porous member 57. The second liquid recovery part 52 recovers the liquid LQ via the holes of the porous member 57. In the present embodiment, the holes of the porous member 57 function as the openings (second liquid recover port) 52M which are able to recover the liquid LQ. The liquid LQ in the fourth space SP4 recovered from the second liquid recovery part 52 (second liquid recovery port 52M) flows into the recovery channel 52R, flows through the recovery channel 52R, and is recovered by the liquid recovery apparatus.

In the present embodiment, only the liquid LQ is substantially recovered via the second liquid recovery part 52, and the recovery of the gas G is limited. The controller 6 adjusts a difference between a pressure (pressure in fourth space SP4) at the lower surface side of the porous member 57 and a pressure (pressure in recovery channel 52R) at the upper surface side so that the liquid LQ in the fourth space SP4 passes through the holes of the porous member 57 and flows into the recovery channel 52R, and the gas G does not pass through the holes. Moreover, for example, an example of the technology, which only recovers the liquid via the porous member, is disclosed in U.S. Pat. No. 7,292,313 and the like.

In addition, the second liquid recovery part 52 may recover (suction) both of the liquid LQ and the gas G via the porous member 57. In addition, the second liquid recovery part 52 may not include the porous member 57. That is, a fluid (one or both of the liquid LQ and the gas G) in the fourth space SP4 may be recovered without going through the porous member.

The third liquid recovery part 53 is disposed at the first member 21. The third liquid recovery part 53 recovers the liquid LQ from the gap (third space SP3) between the terminal optical element 13 and the first member 21. The third liquid recovery part 53 is able to recover at least a portion of the liquid LQ which flows in the third space SP3 between the terminal optical element 13 and the first member 21. The third liquid recovery part 53 is disposed to face the third space SP3. The third liquid recovery part 53 is disposed above the first opening part 23. The third liquid recovery part 53 is disposed above the third liquid supply part 43. The third liquid recovery part 53 is disposed above the emitting surface 12. The third liquid recovery part 53 is disposed to be opposite to the outer surface 131 of the terminal optical element 13. The third liquid recovery part 53 is disposed at the first part 211. The first part 211 may be a portion of the first member 21 which is disposed at the surrounding of the optical path K, and may include a portion of the first member 21 which is disposed at the surrounding of the optical path KL (terminal optical element 13). In the present embodiment, the third liquid recovery part 53 is disposed at the inner surface 25.

The third liquid recovery part 53 (third liquid recovery port 53M) is connected to the liquid recovery apparatus via a recovery channel 53R which is formed inside the first member 21. The third liquid recovery part 53 is able to recover at least a portion of the liquid LQ of the third space SP3. The liquid LQ recovered from the third liquid recovery part 53 is recovered to the liquid recovery apparatus via the recovery channel 53R.

In the present embodiment, the third liquid recovery part 53 includes a porous member 58. The porous member 58 includes a mesh plate. The porous member 58 includes one surface which is able to be opposite to the outer surface 131, the other surface which faces the recovery channel 53R, and a plurality of holes which connect the one surface and the other surface. In the present embodiment, the inner surface 25 is disposed at the surrounding of the one surface of the porous member 58. The third liquid recovery part 53 recovers the liquid LQ via the holes of the porous member 58. In the present embodiment, the holes of the porous member 58 function as openings (third liquid recovery port) 53M which are able to recover the liquid LQ. The liquid LQ in the third space SP3 recovered from the third liquid recovery part 53 (third liquid recovery port 53M) flows into the recovery channel 53R, flows through the recovery channel 53R, and is recovered by the liquid recovery apparatus.

In the present embodiment, only the liquid LQ is substantially recovered via the third liquid recovery part 53, and the recovery of the gas G is limited. The controller 6 adjusts a difference between a pressure (pressure in third space SP3) at the one surface side of the porous member 58 and a pressure (pressure in recovery channel 53R) at the other surface side so that the liquid LQ in the third space SP3 passes through the holes of the porous member 58 and flows into the recovery channel 53R, and the gas G does not pass through the holes. Moreover, for example, an example of the technology, which only recovers the liquid via the porous member, is disclosed in U.S. Pat. No. 7,292,313 or like.

Moreover, the third liquid recovery part 53 may recover (suction) both of the liquid LQ and the gas G via the porous member 58. Moreover, the third liquid recovery part 53 may not include the porous member 58. That is, a fluid (one or both of the liquid LQ and the gas G) in the third space SP3 may be recovered without going through the porous member.

The first gas supply part 61 is disposed at the second member 22. The first gas supply part 61 is disposed at at least a portion of the surrounding of the second opening part 30. The first gas supply part 61 is disposed to be opposite to the upper surface of the substrate P (object). The first gas supply part 61 is disposed to face the second space SP2. The first gas supply part 61 is disposed at the lower surface 31.

In the present embodiment, the first gas supply part 61 includes an opening (first gas supply port) 61M which is disposed at the lower surface 31 and is able to supply the gas G. As shown in FIG. 4, a plurality of the first gas supply ports 61M are disposed at the lower surface 31. The plurality of first gas supply ports 61M are disposed to surround the optical path K. The plurality of first gas supply ports 61M are disposed with intervals at the surrounding of the optical path K. In the present embodiment, the plurality of first gas supply ports 61M are disposed along a rectangular virtual line in the XY plane.

The first liquid supply part 61 (first liquid supply port 61M) is connected to a gas supply apparatus via a supply channel 61R which is formed inside the second member 22. The gas supply apparatus includes a filter apparatus which cleans the gas G to be supplied, a temperature adjustment apparatus which is able to adjust the temperature of the gas G to be supplied, or the like, and the liquid supply apparatus is able to supply the cleaned gas G in which the temperature is adjusted. Moreover, in the present embodiment, the gas supply apparatus includes a humidity adjustment apparatus which is able to adjust humidity of the gas G to be supplied, and thus, is able to supply the humidified gas G, for example. The humidity adjustment apparatus is able to increase the humidity of the gas G by using the liquid LQ (liquid LQ for exposure) forming the liquid immersion space LS. The gas G discharged from the gas supply apparatus is sent to the first gas supply part 61 via the supply channel 61R. The first gas supply part 61 supplies the gas G, which is supplied from the gas supply apparatus via the supply channel 61R, to the second space SP2.

In the present embodiment, the first gas supply part 61 is disposed outside the first liquid recovery part 51 in the radial direction with respect to the optical path K (optical axis AX).

The second liquid supply part 42 is disposed between the optical path K and the first liquid recovery part 51 in the radial direction with respect to the optical path K (optical axis AX). The second liquid supply part 42 is disposed between a center of the second opening part 30 and the first liquid recovery part 51 in the radial direction with respect to the center of the second opening part 30.

The first liquid supply part 41 is disposed between the optical path K and the second liquid supply part 42 in the radial direction with respect to the optical path K (optical axis AX). The first liquid supply part 41 is disposed between a center of the first opening part 23 and the opening part 301 in the radial direction with respect to the center of the first opening part 23.

The third liquid supply part 43 is disposed to be closer to the optical path K side than the second liquid supply part 42. The third liquid supply part 43 is disposed above the first and second liquid supply parts 41 and 42. The third liquid supply part 43 is disposed below the third liquid recovery part 53. The third liquid supply part 43 is disposed to be closer to the optical path K side than the third liquid recovery part 53.

The second liquid recovery part 52 is disposed above the first and second liquid supply parts 41 and 42. The second liquid recovery part 52 is disposed above the opening part 301. The second liquid recovery part 52 is disposed outside the opening part 301 in the radial direction with respect to the optical path K (optical axis AX).

The third space SP3 communicates with the space CS outside the liquid immersion member 5 via the opening part 35 different from the first opening part 23. The opening part 35 is disposed at the upper end of the gap between the terminal optical element 13 and the first member 21. The third space SP3 is opened to the space CS (atmosphere at the surrounding of the liquid immersion member 5) via the opening part 35. When the space CS is the atmospheric pressure, the third space SP3 is opened to the atmosphere via the opening part 35. In addition, the pressure of the space CS may be higher or lower than the atmosphere pressure.

The opening part 35 is disposed at a higher position than the first opening part 23. The opening part 35 is disposed between the outer surface 131 and the upper surface 27 (inner edge of upper surface 27). The opening part 35 cannot contact the liquid LQ on the substrate P (object).

The fourth space SP4 communicates with the space CS outside the liquid immersion member 5 via the opening part 302 different from the opening part 301. The opening part 302 is disposed at the other end of the gap (fourth space SP4) between the first member 21 and the second member 22. The fourth space SP4 is opened to the space CS (atmosphere at the surrounding of the liquid immersion member 5) via the opening part 302. When the space CS is the atmospheric pressure, the fourth space SP4 is opened to the atmosphere via the opening part 302. In addition, the pressure of the space CS may be higher or lower than the atmosphere pressure.

The other end (opening part 302) of the gap between the first member 21 and the second member 22 is positioned at a higher position than the one end (opening part 301) of the gap between the first member 21 and the second member 22. The opening part 302 is disposed between the lower surface 28 (the outer edge of the lower surface 28) and the upper surface 33 (the outer edge of the upper surface 33). In other words, the opening part 302 is disposed between the outer surface 29 and the outer surface 34. The opening part 302 is disposed not to be opposite to the surface of the substrate P (object). The opening part 302 cannot contact the liquid LQ on the substrate P (object).

The second space SP2 communicates with the space CS outside the liquid immersion member 5 via the opening part 36. The opening part 36 is disposed at the other end of the gap between the second member 22 and the substrate P (object). The opening part 36 is disposed between the lower surface 31 (the outer edge of the lower surface 31) and the upper surface of the substrate P (object). The second space SP2 is opened to the space CS (atmosphere at the surrounding of the liquid immersion member 5) via the opening part 36. When the space CS is the atmospheric pressure, the second space SP2 is opened to the atmosphere via the opening part 36. In addition, the pressure of the space CS may be higher or lower than the atmosphere pressure.

The second space SP2 and the fourth space SP4 are connected to each other via the opening part 301. The first space SP1 and the fourth space SP4 are connected to each other via the opening part 301. The first space SP1 and the optical path space SPK are connected to each other via the first opening part 23. The optical path space SPK and the third space SP3 are connected to each other via the opening part 37 between the emitting surface 12 and the inner surface 25.

That is, the fluid (one or both of the liquid LQ and the gas G) is able to circulate (move) between the optical path space SPK and the third space SP3, is able to circulate (move) between the optical path space SPK and the first space SP1, is able to circulate (move) between the first space SP1 and the third space SP3, is able to circulate (move) between the second space SP1 and the third space SP3, and is able to circulate (move) between the first space SP1 and the second space SP2.

In addition, the pressure of the fourth space SP4 to which the second liquid recovery part 52 (porous member 57) faces is able to be adjusted by the chamber apparatus 9. The pressure of the recovery channel 57R is able to be adjusted by the liquid recovery apparatus which is connected to the recovery channel 57R.

Moreover, the pressure of the third space SP3 to which the third liquid recovery part 53 (porous member 58) faces is able to be adjusted by the chamber apparatus 9. The pressure of the recovery channel 58R is able to be adjusted by the liquid recovery apparatus which is connected to the recovery channel 58R.

In the present embodiment, a recovery operation of the liquid LQ from the first liquid recovery part 51 is performed in parallel with at least one of the liquid LQ supply operation from the first liquid supply part 41, the second liquid supply part 42, and the third liquid supply part 43, and thus, the liquid immersion space LS is formed by the liquid LQ between the terminal optical element 13 and the liquid immersion member 5 on a one side, and between the terminal optical element 13 and the substrate P (object) on the another side.

When the supply operation of the liquid LQ in the first liquid supply part 41 is performed, the first liquid recovery part 51 is able to recover at least a portion of the liquid LQ from the first liquid recovery part 41. When the supply operation of the liquid LQ in the second liquid supply part 42 is performed, the first liquid recovery part 51 is able to recover at least a portion of the liquid LQ from the second liquid recovery part 42. When the supply operation of the liquid LQ in the third liquid supply part 43 is performed, the first liquid recovery part 51 is able to recover at least a portion of the liquid LQ from the third liquid recovery part 43.

By performing the recovery operation of the liquid LQ from the first liquid recovery part 51, the interface LG (first interface LG1) of the liquid LQ in the liquid immersion space LS is maintained more inside than the first liquid recovery part 51 in the radial direction with respect to the optical axis AX (optical path K). The first interface LG1 is at least maintained more inside than the end part outside the first liquid recovery part 51 (first liquid recovery port 51M).

For example, the recovery operation of the liquid LQ from the first liquid recovery part 51 is performed in parallel with the supply operation of the liquid LQ from the second liquid supply part 42, and thus, the interface LG (first interface LG1) of the liquid LQ in the liquid immersion space LS is maintained between the second liquid supply part 42 and the first liquid recovery part 51 in the radial direction with respect to the optical axis AX (optical path K). The first interface LG1 is maintained at least between the second liquid supply part 42 and the end part outside the first liquid recovery part 51 (first liquid recovery port 51M). The recovery operation of the liquid LQ from the first liquid recovery part 51 is performed in parallel with the supply operation of the liquid LQ from the second liquid supply part 42, and thus, even when the second member 22 moves in the XY plane in the state where the liquid immersion space LS is formed, the first interface LG1 is maintained between the second liquid supply part 42 and the first liquid recovery part 51.

Moreover, in the present embodiment, a recovery operation of the liquid LQ from the second liquid recovery part 52 is performed in parallel with at least one of the supply operation of the liquid LQ from the first liquid supply part 41, the second liquid supply part 42, and the third liquid supply part 43, and the recovery operation of the liquid LQ from the first liquid recovery part 51. Accordingly, the liquid LQ flowing into the fourth space SP4 via the opening part 301 is suppressed from flowing out from the fourth space SP4.

In addition, in the present embodiment, a recovery operation of the liquid LQ from the third liquid recovery part 53 is performed in parallel with at least one of the supply operation of the liquid LQ from the first liquid supply part 41, the second liquid supply part 42, and the third liquid supply part 43, and the recovery operation of the liquid LQ from the first liquid recovery part 51. Accordingly, the liquid LQ flowing into the third space SP3 is suppressed from flowing out from the third space SP3.

In addition, in the present embodiment, a supply operation of the gas G from the first gas supply part 61 is performed in parallel with at least one of the supply operation of the liquid LQ from the first liquid supply part 41, the second liquid supply part 42, and the third liquid supply part 43, and the recovery operation of the liquid LQ from the first liquid recovery part 51. The first gas supply part 61 is able to supply the gas G at the outside of the liquid immersion space LS. By the gas G supplied from the first gas supply part 61, a gas seal is formed outside the liquid immersion space LS. Accordingly, the liquid LQ in the second space SP2 is suppressed from flowing out from the second space SP2.

In the present embodiment, the humidified gas G may be supplied from the first gas supply part 61. The humidity of the gas G supplied from the first gas supply part 61 is higher than the humidity of the gas Gs supplied from the air conditioner 9S of the chamber apparatus 9. Occurrence of vaporization heat is suppressed by the supply of the humidified gas G. Accordingly, occurrence of a temperature change of the substrate P (object), a temperature change of the liquid immersion member 5, a temperature change of the liquid LQ in the liquid immersion space LS, a temperature change in the space (environment) in which the liquid immersion member 5 is disposed, or the like, which occurs due to the vaporization heat, is suppressed.

Next, an example of an operation of the second member 22 will be described.

The second member 22 is movable with respect to the first member 21. The second member 22 is movable with respect to the terminal optical element 13. A relative position between the second member 22 and the first member 21 is changed. The relative position between the second member 22 and the terminal optical element 13 is changed.

The second member 22 is able to relatively move in the XY plane perpendicular to the optical axis AX of the terminal optical element 13. The second member 22 is able to move to be substantially parallel to the XY plane. In the present embodiment, the second member 22 is able to move in at least the X axis direction.

Moreover, the second member 22 may be able to move in six directions of the X axis, the Y axis, the Z axis, the θX, the θY, and the θZ directions, and may be able to move in at least one direction of the six directions. Moreover, the second member 22 may be able to move in at least one direction of the Y axis, the Z axis, the θX, the θY, and the θZ directions, in addition to the X axis direction.

For example, the second member 22 moves in the XY plane, and thus, the size of the gap between the outer surface 26 of the first member 21 and the inner surface 32 of the second member 22 is changed. In other words, the second member 22 moves in the XY plane, and thus, the size of the space between the outer surface 26 and the inner surface 32 is changed. For example, the second member 22 moves in the −X axis direction, and thus, the size of the gap between the outer surface 26 and the inner surface 32 in the +X side with respect to the terminal optical element 13 is decreased (the space between the outer surface 26 and the inner surface 32 is decreased). The second member 22 moves in the +X axis direction, and thus, the size of the gap between the outer surface 26 and the inner surface 32 in the +X side with respect to the terminal optical element 13 is increased (the space between the outer surface 26 and the inner surface 32 is increased).

In the present embodiment, a movable range of the second member 22 is determined so that the first member 21 (outer surface 26) and the second member 22 (inner surface 32) do not contact each other.

The second member 22 is movable in cooperation with the movement of the substrate P (object). The second member 22 is movable to be independent of the substrate P (object). The second member 22 is movable in parallel with at least a portion of the movement of the substrate P (object).

The second member 22 may move in parallel with at least a part of a period in which the substrate P (object) moves. The second member 22 may move in a movement direction of the substrate P (object). For example, in at least a part of the period in which the substrate P moved, the second member 22 may move in the movement direction of the substrate P. For example, when the substrate P is moved in one direction (for example, +X axis direction) in the XY plane, the second member 22 may move in one direction (the +X axis direction) in the XY plane in synchronization with the movement of the substrate P.

The second member 22 may move in a state where the liquid immersion space LS is formed. The second member 22 may move in a state where the liquid LQ of the liquid immersion space LS contacts the second member 22. The second member 22 may move in a state where the liquid LQ exists in one or both of the second space SP2 and the fourth space SP4.

The second member 22 may move in parallel with the supply operation of the liquid LQ from at least one of the first liquid supply part 41, the second liquid supply part 42, and the third liquid supply part 43.

The second member 22 may move in parallel with the recovery operation of the liquid LQ from at least one of the first liquid recovery part 51, the second liquid recovery part 52, and the third liquid recovery part 53.

The second member 22 may move in parallel with the supply operation of the gas G from the first gas supply part 61.

The second member 22 may move in at least a part of a period in which the exposure light EL is emitted from the emitting surface 12.

The second member 22 may move in parallel with at least a part of a period in which the substrate P (object) moves in the state where the liquid immersion space LS is formed.

The second member 22 may move in at least a part of a period in which the exposure light EL is emitted from the emitting surface 12 in the state where the liquid immersion space LS is formed.

The second member 22 may move when the second member 22 and the substrate P (object) are not opposite to each other. The second member 22 may move when the object does not exist below the second member 22.

The second member 22 may move when the liquid LQ does not exist in the space between the second member 22 and the substrate P (object). The second member 22 may move when the liquid immersion space LS is not formed.

In the present embodiment, for example, the second member 22 moves based on movement conditions of the substrate P (object). For example, the controller 6 moves the second member 22 in parallel with at least a portion of the movement of the substrate P (object) based on the movement conditions of the substrate P (object). The controller 6 moves the second member 22 while performing the supply of the liquid LQ from at least one of the first, the second, and the third liquid supply parts 41, 42, and 43 and the recovery of the liquid LQ from the first liquid recovery part 51 so that the liquid immersion space LS is continuously formed.

In the present embodiment, the second member 22 is movable so that a relative movement between the second member 22 and the substrate P (object) is decreased. The second member 22 is movable so that the relative movement between the second member 22 and the substrate P (object) is smaller than the relative movement between the terminal optical element 13 and the substrate P (object). The second member 22 is movable so that the relative movement between the second member 22 and the substrate P (object) is smaller than the relative movement between the first member 21 and the substrate P (object). For example, the second member 22 may move in synchronization with the substrate P (object). For example, the second member 22 may move to follow the substrate P (object).

The relative movement includes at least one of a relative speed and a relative acceleration. For example, in the state where the liquid immersion space LS is formed, that is, in a state where the liquid LQ exists in the second space SP2, the second member 22 may move so that the relative speed between the second member 22 and the substrate P (object) is decreased.

Moreover, in the state where the liquid immersion space LS is formed, that is, in the state where the liquid LQ exists in the second space SP2, the second member 22 may move so that the relative acceleration between the second member 22 and the substrate P (object) is decreased.

In addition, in the state where the liquid immersion space LS is formed, that is, in the state where the liquid LQ exists in the second space SP2, the second member 22 may move so that the relative speed between the second member 22 and the substrate P (object) is smaller than the relative speed between the first member 21 and the substrate P (object).

Moreover, in the state where the liquid immersion space LS is formed, that is, in the state where the liquid LQ exists in the second space SP2, the second member 22 may move so that the relative acceleration between the second member 22 and the substrate P (object) is smaller than the relative acceleration between the first member 21 and the substrate P (object).

For example, the second member 22 is movable in the movement direction of the substrate P (object). For example, when the substrate P (object) moves in the +X axis direction (or the −X axis direction), the second member 22 is movable in the +X axis direction (or the −X axis direction). Moreover, when the substrate P (object) moves in the +Y axis direction (or the −Y axis direction) while moving in the +X axis direction, the second member 22 is movable in the +X axis direction. In addition, when the substrate P (object) moves in the +Y axis direction (or the −Y axis direction) while moving in the −X axis direction, the second member 22 is movable in the −X axis direction.

That is, in the present embodiment, when the substrate P (object) moves in the direction which includes the component of the X axis direction, the second member 22 moves in the X axis direction. For example, the second member 22 may move in the X axis direction in parallel with at least a portion of the movement of the substrate P (object) in the direction including the component in the X axis direction.

Moreover, the second member 22 is movable in the Y axis direction. When the substrate P (object) moves in the direction including the component in the Y axis direction, the second member 22 may move in the Y axis direction. For example, the second member 22 may move in the Y axis direction so that the relative speed between the second member 22 and the substrate P (object) is decreased in parallel with at least a portion of the movement of the substrate P (object) in the direction including the component in the Y axis direction.

Next, a method of exposing the substrate P using the above-described exposure apparatus EX will be described.

In the descriptions below, in order to form the liquid immersion space LS, the liquid LQ is supplied from each of the first liquid supply part 41, the second liquid supply part 42, and the third liquid supply part 43, and the liquid LQ is recovered from each of the first liquid recovery part 51, the second liquid recovery part 52, and the third liquid recovery part 53.

Moreover, in the descriptions below, the first, the second, the third liquid supply parts 41, 42, and 43 are collectively referred to as a liquid supply part 40 appropriately. The first, the second, the third liquid recovery parts 51, 52, and 53 are collectively referred to as a liquid recovery part 50 appropriately.

In addition, for example, in order to form the liquid immersion space LS, the liquid LQ may be supplied from the third liquid supply part 43, and the liquid LQ may not be supplied from the first and second liquid supply parts 41 and 42. The liquid LQ may be supplied from the second and third liquid supply parts 42 and 43, and the liquid LQ may not be provided from the first liquid supply part 41. The liquid LQ may be supplied from the second liquid supply part 42, and the liquid LQ may not be provided from the first and third liquid supply parts 41 and 43. The liquid LQ may be supplied from the first and second liquid supply parts 41 and 42, and the liquid LQ may not be provided from the third liquid supply part 43. The liquid LQ may be supplied from the first liquid supply part 41, and the liquid LQ may not be provided from the second and third liquid supply parts 42 and 43.

In addition, for example, the liquid LQ may be recovered from the first liquid recovery part 51, and the liquid LQ may not be recovered from the second and third liquid recovery parts 51 and 52. The liquid LQ may be recovered from the first and second liquid recovery parts 51 and 52, and the liquid LQ may not be recovered from the third liquid recovery part 53. The liquid LQ may be recovered from the first and third liquid recovery parts 51 and 53, and the liquid LQ may not be recovered from the second liquid recovery part 52.

In a substrate exchange position away from the liquid immersion member 5, processing which carries (loads) the substrate P before the exposure to the substrate stage 2 (first holding part) is performed. In at least a part of a period in which the substrate stage 2 is away from the liquid immersion member 5, the measurement stage 3 is disposed to be opposite to the terminal optical element 13 and the liquid immersion member 5. The controller 6 performs the supply of the liquid LQ from the liquid supply part 40 and the recovery of the liquid LQ from the liquid recovery part 50, and thus, forms the liquid immersion space LS on the measurement stage 3.

After the substrate P before the exposure is loaded on the substrate stage 2 and the measurement processing using the measurement stage 3 is terminated, the controller 6 moves the substrate stage 2 so that the terminal optical element 13 and the liquid immersion member 5 are opposite to the substrate stage 2 (substrate P). In the state where the terminal optical element 13 and the liquid immersion member 5 are opposite to the substrate stage 2 (substrate P), the recovery of the liquid LQ from the liquid recovery part 50 is performed in parallel with the supply of the liquid LQ from the liquid supply part 40, and thus, the liquid immersion space LS is formed between the terminal optical element 13 and the liquid immersion member 5, and the substrate stage 2 (substrate P) so that the optical path K is filled with the liquid LQ.

The controller 6 starts the exposure processing of the substrate P. In the state where the liquid immersion space LS is formed on the substrate P, the controller 6 emits the exposure light EL from the illumination system IL. The illumination system IL illuminates the mask M with the exposure light EL. The exposure light EL from the mask M is radiated to the substrate P via the liquid LQ in the liquid immersion space LS between the projection optical system PL and the emitting surface 12, and the substrate P. Accordingly, the substrate P is exposed by the exposure light EL which is emitted from the emitting surface 12 via the liquid LQ in the liquid immersion space LS between the emitting surface 12 of the terminal optical element 13 and the substrate P, and the image of the pattern of the mask M is projected to the substrate P.

The exposure apparatus EX of the present embodiment is a scanning type exposure apparatus (a so-called scanning stepper) in which the mask M and the substrate P synchronously move in a predetermined scanning direction and the image of the pattern of the mask M is projected to the substrate P. In the present embodiment, the scanning direction of the substrate P (synchronous movement direction) is set to the Y axis direction, and the scanning direction (synchronous movement direction) of the mask M is also set to the Y axis direction. The controller 6 radiates the exposure light EL to the substrate P via the projection optical system PL and the liquid LQ in the liquid immersion space LS on the substrate P while moving the substrate P in the Y axis direction with respect to the projection region PR of the projection optical system PL and moving the mask M in the Y axis direction with respect to the illumination region IR of the illumination system IL in synchronization with the movement in the Y axis direction of the substrate P.

Figure 6:
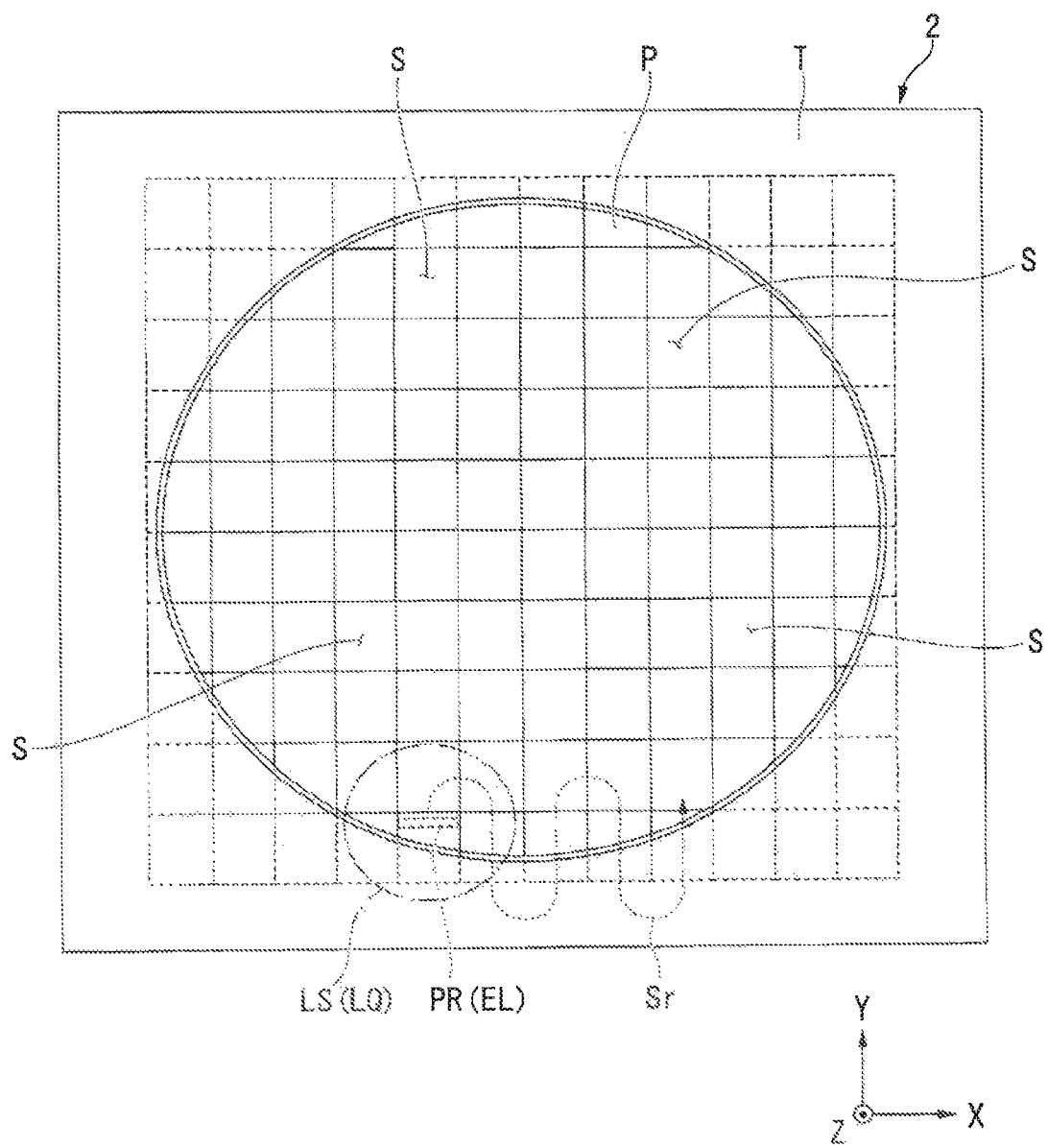
FIG. 6 is a view for explaining an example of an operation of the exposure apparatus according to the first embodiment.

FIG. 6 is a view showing an example of the substrate P which is held by the substrate stage 2. In the present embodiment, a plurality of shot regions S, which are regions to be exposed on the substrate P, are arranged in a matrix form. The controller 6 sequentially exposes the plurality of shot regions S of the substrate P by the exposure light EL emitted from the emitting surface 12 via the liquid LQ in the liquid immersion space LS between the emitting surface 12 and the substrate P while moving the substrate P held in the first holding part in the Y axis direction (scanning direction) with respect to the exposure light EL emitted from the emitting surface 12 of the terminal optical element 13.

For example, in order to expose one shot region S of the substrate P, in the state where the liquid immersion space LS is formed, the controller 6 radiates the exposure light EL to the shot region S via the projection optical system PL and the liquid LQ in the liquid immersion space LS on the substrate P while moving the substrate P in the Y axis direction with respect to the exposure light EL emitted from the emitting surface 12 (the projection region PR of the projection optical system PL), and moving the mask M in the Y axis direction with respect to the illumination region IR of the illumination system IL in synchronization with the movement in the Y axis direction of the substrate P. Accordingly, the image of the pattern of the mask M is projected to the shot region S, and the shot region S is exposed by the exposure light EL which is emitted from the emitting surface 12.

After the exposure of the shot region S is terminated, in order to start the exposure of a next shot region S, in the state where the liquid immersion space LS is formed, the controller 6 moves the substrate P in the direction (for example, X axis direction, directions which are inclined with respect to the X axis direction and Y axis direction in the XY plane, or the like) which intersects the Y axis in the XY plane, and moves the next shot region S to an exposure starting position. Thereafter, the controller 6 starts the exposure of the shot region S.

The controller 6 repeats the operation which exposes the shot region while moving the shot region in the Y axis direction with respect to the position (projection region PR) radiated with the exposure light EL from the emitting surface 12 in the state where the liquid immersion space LS is formed above the substrate P (substrate stage 2), and after the exposure of the shot region, the operation which moves the substrate P in the direction (for example, X axis direction, directions which are inclined with respect to the X axis direction and Y axis direction in the XY plane, or the like) which intersects the Y axis direction in the XY plane so that the next shot region is disposed at the exposure starting position in the state where the liquid immersion space LS is formed on the substrate P (substrate stage 2), and the controller sequentially exposes the plurality of shot regions of the substrate P.

In the descriptions below, the operation, which moves the substrate P (shot region) in the Y axis direction with respect to the position (projection region PR) radiated with the exposure light EL from the emitting surface 12 in the state where the liquid immersion space LS is formed above the substrate P (substrate stage 2) in order to expose the shot region, is appropriately referred to as a scan movement operation. Moreover, the operation, which moves the substrate P in the XY plane before the exposure of the next shot region starts in the state where the liquid immersion space LS is formed on the substrate P (substrate stage 2) after the exposure of a predetermined shot region is terminated, is appropriately referred to as a step movement operation.

In the present embodiment, the scan movement operation includes an operation in which the substrate P moves in the Y axis direction from a state where a predetermined shot region S is disposed at the exposure starting position to a state where the predetermined shot region is disposed at the exposure termination position. The step movement operation includes an operation in which the substrate P moves in a direction intersecting the Y axis direction in the XY plane from a state where a predetermined shot region S is disposed at the exposure termination position to a state where the next shot region S is disposed at the exposure starting position.

The exposure starting position includes a position of the substrate P when one end in the Y axis direction of a predetermined shot region S passes through the projection region PR in order to expose the shot region S. The exposure termination position includes a position of the substrate P when the other end in the Y axis direction of the shot region S radiated by the exposure light EL passes through the projection region PR.

The exposure starting position of the shot region S includes a starting position of the scan movement operation in order to expose the shot region S. The exposure starting position of the shot region S includes a termination position of the step movement operation in order to dispose the shot region S at the exposure starting position.

The exposure termination position of the shot region S includes a termination position of the scan movement operation in order to expose the shot region S. The exposure termination position of the shot region S includes a starting position of the step movement operation in order to dispose the next shot region S at the exposure starting position after the exposure of the shot region S is terminated.

In the descriptions below, a period, in which the scan movement operation is performed in order to expose a predetermined shot region S, is appropriately referred to as a scan movement period. In the descriptions below, a period, in which the step movement operation is performed in order to start the exposure of the next shot region S after the exposure termination of a predetermined shot region S, is appropriately referred to as a step movement period.

The scan movement period includes the exposure period from the exposure start of a predetermined shot region S to the exposure termination. The step movement period includes a movement period of the substrate P from the exposure termination of a predetermined shot region S to the exposure start of the next shot region S.

In the scan movement operation, the exposure light EL is emitted from the emitting surface 12. In the scan movement operation, the exposure light EL is radiated to the substrate P (object). In the step movement operation, the exposure light EL is not emitted from the emitting surface 12. In the step movement operation, the exposure light EL is not radiated to the substrate P (object).

The controller 6 sequentially exposes the plurality of shot regions S of the substrate P while repeating the scan movement operation and the step movement operation. Moreover, the scan movement operation is an equal speed movement mainly in the Y axis direction. The step movement operation includes acceleration and deceleration movements. For example, the step movement operation from the exposure termination of a predetermined shot region S to the exposure start of the next shot region S includes one or both of the acceleration and deceleration movements in the Y axis direction and the acceleration and deceleration movements in the X axis direction.

Moreover, there is a case where at least a portion of the liquid immersion space LS may be formed above the substrate stage 2 (cover member T) in at least a portion of the scan movement operation and the step movement operation. There is a case where the liquid immersion space LS may be formed over the substrate P and the substrate stage 2 (cover member T) in at least a portion of the scan movement operation and the step movement operation. When the exposure of the substrate P is performed in a state where the substrate stage 2 and the measurement stage 3 approach or contact each other, there is a case where the liquid immersion space LS may be formed over the substrate stage 2 (cover member T) and the measurement stage 3 in at least a portion of the scan movement operation and the step movement operation.

The controller 6 controls the driving system 15 based on exposure conditions of the plurality of shot regions S on the substrate P and moves the substrate P (substrate stage 2). For example, the exposure conditions of the plurality of shot regions S are defined by exposure control information referred to as an exposure recipe. The exposure control information is stored in the storage apparatus 7.

The exposure conditions (exposure control information) include arrangement information of the plurality of shot regions S (the position of each of the plurality of shot regions S in the substrate P). Moreover, the exposure conditions (exposure control information) include size information (size information with respect to the Y axis direction) of each of the plurality of shot regions S.

The controller 6 sequentially exposes the plurality of shot regions S while moving the substrate P by a predetermined movement condition based on the exposure conditions (exposure control information) stored in the storage apparatus 7. The movement conditions of the substrate P (object) include at least one of the movement speed, the acceleration, the movement distance, the movement direction, and the movement locus in the XY plane.

As an example, when the plurality of shot regions S are sequentially exposed, the controller 6 radiates the exposure light EL to the projection region PR while moving the substrate stage 2 so that the projection region PR of the projection optical system PL and the substrate P are relatively moved along the movement locus shown by an arrow Sr in FIG. 6, and sequentially exposes the plurality of shot regions S via the liquid LQ by the exposure light EL. The controller 6 sequentially exposes the plurality of shot regions S while repeating the scan movement operation and the step movement operation.

In the present embodiment, the second member 22 moves in at least a portion of the exposure processing of the substrate P. For example, the second member 22 moves in parallel with at least a portion of the step movement operation of the substrate P (substrate stage 2) in the state where the liquid immersion space LS is formed. For example, the second member 22 moves in parallel with at least a portion of the scan movement operation of the substrate P (substrate stage 2) in the state where the liquid immersion space LS is formed. The exposure light EL is emitted from the emitting surface 12 in parallel with the movement of the second member 22.

For example, the second member 22 may move so that the relative movement (relative speed, relative acceleration) between the second member 22 and the substrate P (substrate stage 2) is smaller than the relative movement (relative speed, relative acceleration) between the first member 21 and the substrate P (substrate stage 2) when the substrate P (substrate stage 2) performs the step movement operation.

In addition, the second member 22 may move so that the relative movement (relative speed, relative acceleration) between the second member 22 and the substrate P (substrate stage 2) is smaller than the relative movement (relative speed, relative acceleration) between the first member 21 and the substrate P (substrate stage 2) when the substrate P (substrate stage 2) performs the scan movement operation.

Moreover, the second member 22 may not move during the scan movement operation. That is, the second member 22 may not move in parallel with the emission of the exposure light EL from the emitting surface 12.

Figure 7:
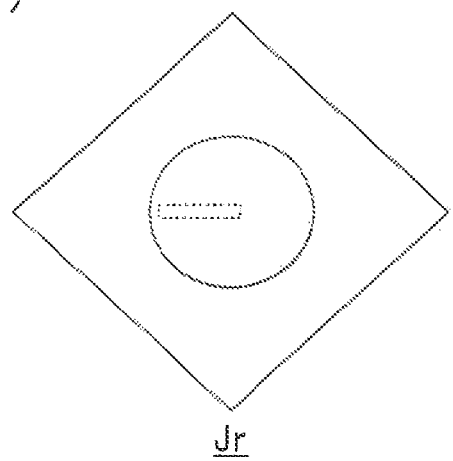
FIG. 7 is a view for explaining an example of an operation of a second member according to the first embodiment.
Figure 7:
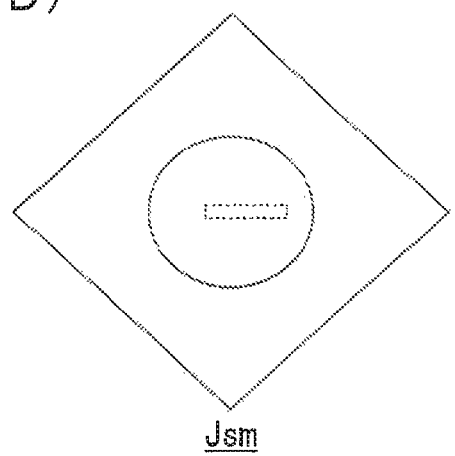
Figure 7:
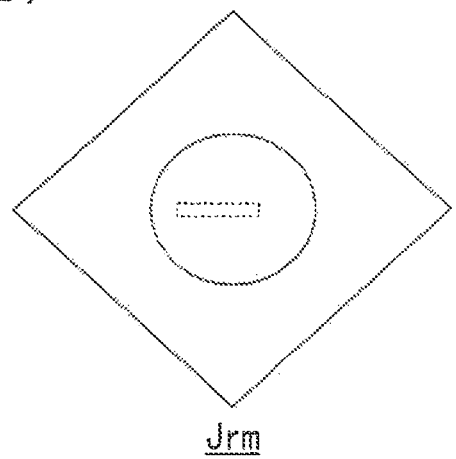
Figure 7:
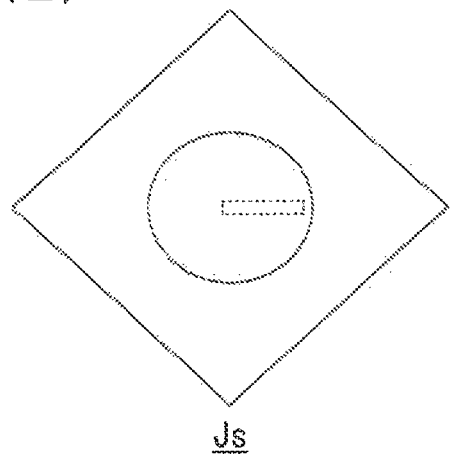
Figure 7:
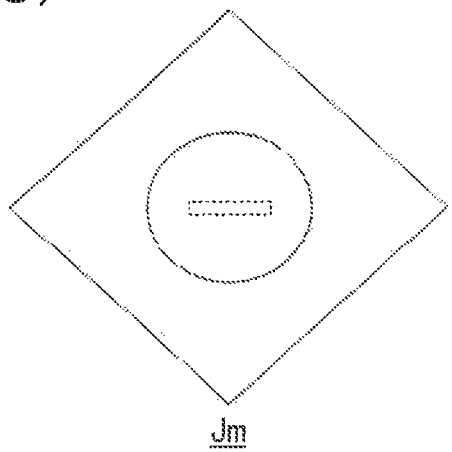
Figure 7:
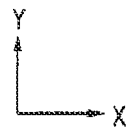

FIG. 7 is a schematic view showing an example of the operation of the second member 22. FIG. 7 is a view of the second member 22 as seen from the upper side.

In the descriptions below, the second member 22 moves in the X axis direction. Moreover, as described above, the second member 22 may move in the Y axis direction and may move in an arbitrary direction in the XY plane which includes the component in the X axis direction (or the Y axis direction).

The second member 22 moves within the movable range which is defined with respect to the X axis direction. The movable range of the second member 22 is determined so that the exposure light EL from the emitting surface 12 passes through the first opening part 23 and the second opening part 30 and the second member 22 does not contact the first member 21.

In at least a part of a period in which the substrate P (object) moves, as shown in FIGS. 7(A) to 7(E), the second member 22 moves in the X axis direction. FIG. 7(A) shows a state where the second member 22 is disposed at a position Jr which is positioned at the furthest end of the +X side of the movable range. FIG. 7(C) shows a state where the second member 22 is disposed at a center position Jm in the movable range. FIG. 7(E) shows a state where the second member 22 is disposed at a position Js which is positioned at the furthest end of the −X side of the movable range.

In the descriptions below, the position Jr of the second member 22 shown in FIG. 7(A) is appropriately referred to as a first end position Jr. The position Jm of the second member 22 shown in FIG. 7(C) is appropriately referred to as a center position Jm. The position Js of the second member 22 shown in FIG. 7(E) is appropriately referred to as a second end position Js.

Moreover, FIG. 7(B) shows a state where the second member 22 is positioned at a position Jrm between the first end position Jr and the center position Jm. FIG. 7(D) shows a state where the second member 22 is positioned at a position Jsm between the second end position Js and the center position Jm.

In addition, in the present embodiment, the state where the second member 22 is disposed at the center position Jm includes a state where the center of the second opening part 30 of the second member 22 substantially coincides with the optical axis AX of the terminal optical element 13. The position of the second member 22, in which the center of the second opening part 30 coincides with the optical axis AX, may also be referred to as an origin point.

The size of the movable range of the second member 22 includes the distance between the first end position Jr and the second end position Js in the X axis direction.

The controller 6 is able to make the positions of the second member 22 with respect to the terminal optical element 13 (projection region PR) be different to each other. The controller 6 is able to move the second member 22 between two positions which are selected from the position Jr, the position Jrm, the position Jm, the position Jsm, and the position Js. The controller 6 is able to stop the second member 22 in at least one of the position Jr, the position Jrm, the position Jm, the position Jsm, and the position Js.

The movement distance of the second member 22 between the position Jr and the position Jm is longer than the movement distance of the second member 22 between the position Jrm and the position Jm. The movement distance of the second member 22 between the position Js and the position Jm is longer than the movement distance of the second member 22 between the position Jsm and the Jm.

The controller 6 is able to move the second member 22 according to determined movement conditions. The movement conditions of the second member 22 include at least one of the movement direction, the movement speed, the acceleration, and the movement distance. The controller 6 is able to control at least one of the movement direction, the movement speed, the acceleration, and the movement distance of the second member 22.

Figure 8:
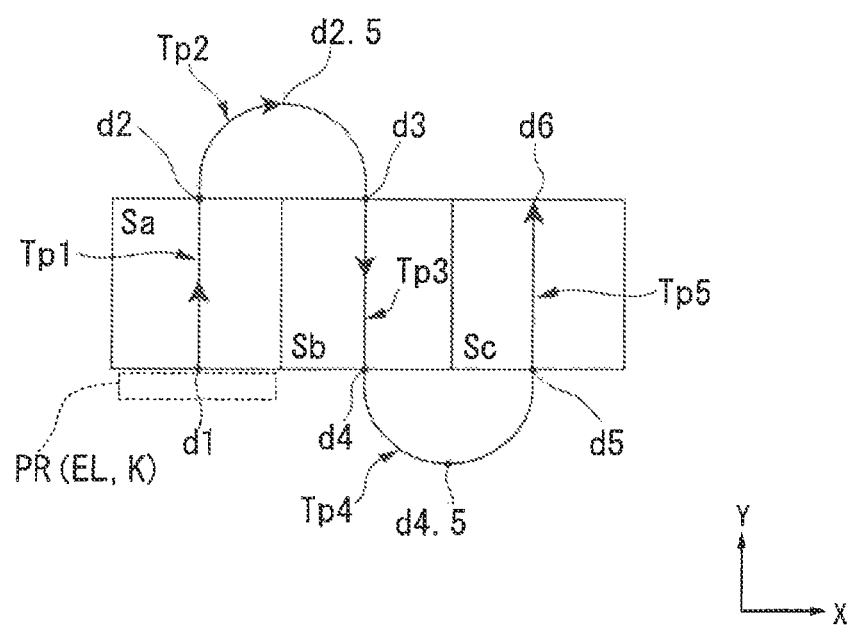
FIG. 8 is a view for explaining an example of the operation of the exposure apparatus according to the first embodiment.

FIG. 8 is a view schematically showing an example of the movement locus of the substrate P when sequentially exposing a shot region Sa, a shot region Sb, and a shot region Sc while performing the step movement which includes the components in the +X axis direction on the substrate P. The shot regions Sa, Sb, and Sc are disposed in the X axis direction.

As shown in FIG. 8, when the shot regions Sa, Sb, and Sc are exposed, the substrate P sequentially moves a pathway Tp1 from a state where the projection region PR is disposed at a position d1 of the substrate P to a state where the projection region PR is disposed at a position d2 adjacent at the +Y side with respect to the position d1, a pathway Tp2 from the state where the projection region PR is disposed at the position d2 to a state where the projection region PR is disposed at a position d3 adjacent at the +X side with respect to the position d2, a pathway Tp3 from the state where the projection region PR is disposed at the position d3 to a state where the projection region PR is disposed at a position d4 adjacent at the −Y side with respect to the position d3, a pathway Tp4 from the state where the projection region PR is disposed at the position d4 to a state where the projection region is disposed at a position d5 adjacent at the +X side with respect to the position d4, and a pathway Tp5 from the state where the projection region PR is disposed at the position d5 to a state where the projection region PR is disposed at a position d6 adjacent at the +Y side with respect to the position d5, under the terminal optical element 13. The positions d1, d2, d3, d4, d5, and d6 are positions in the XY plane.

At least a portion of the pathway Tp1 is a straight line parallel to the Y axis. At least a portion of the pathway Tp3 is a straight line parallel to the Y axis. At least a portion of the pathway Tp5 is a straight line parallel to the Y axis. The pathway Tp2 includes a curved line passing through a position d2. 5. The pathway Tp4 includes a curved line passing through a position d4. 5. The position d1 includes the start point of the pathway Tp1, and the position d2 includes the end point of the pathway Tp1. The position d2 includes the start point of the pathway Tp2, and the position d3 includes the end point of the pathway Tp2. The position d3 includes the start point of the pathway Tp3, and the position d4 includes the end point of the pathway Tp3. The position d4 includes the start point of the pathway Tp4, and the position d5 includes the end point of the pathway Tp4. The position d5 includes the start point of the pathway Tp5, and the position d6 includes the end point of the pathway Tp5. The pathway Tp1 is a pathway on which the substrate P moves in the −Y axis direction. The pathway Tp3 is a pathway on which the substrate P moves in the +Y axis direction. The pathway Tp5 is a pathway on which the substrate P moves in the −Y axis direction. The pathway Tp2 and the pathway Tp4 are pathways on which the substrate P moves in the direction which has the −X axis direction as the main component.

When the substrate P moves the pathway Tp1 in the state where the liquid immersion space LS is formed, the exposure light EL is radiated to the shot region Sa via the liquid LQ. When the substrate P moves the pathway Tp3 in the state where the liquid immersion space LS is formed, the exposure light EL is radiated to the shot region Sb via the liquid LQ. When the substrate P moves the pathway Tp5 in the state where the liquid immersion space LS is formed, the exposure light EL is radiated to the shot region Sc via the liquid LQ. When the substrate P moves the pathway Tp2 and the pathway Tp4, the exposure light EL is not radiated.

The operation in which the substrate P moves the pathway Tp1, the operation in which the substrate P moves the pathway Tp3, and the operation in which the substrate P moves the pathway Tp5 each include the scan movement operation. Moreover, the operation in which the substrate P moves the pathway Tp2 and the operation in which the substrate P moves the pathway Tp4 each include the step movement operation.

That is, the period in which the substrate P moves the pathway Tp1, the period in which the substrate P moves the pathway Tp3, and the period in which the substrate P moves the pathway Tp5 each include the scan movement period (exposure period). The period in which the substrate P moves the pathway Tp2 and the period in which the substrate P moves the pathway Tp4 each include the step movement period.

Figure 9:
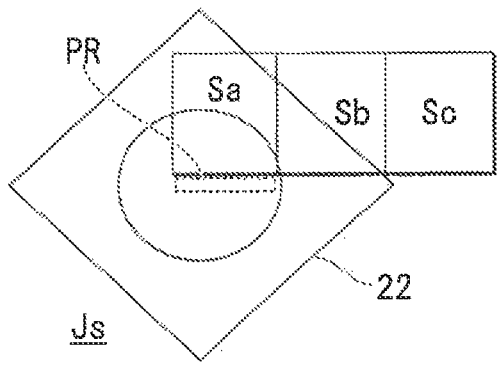
FIG. 9 is a view for explaining an example of the operation of the exposure apparatus according to the first embodiment.
Figure 9:
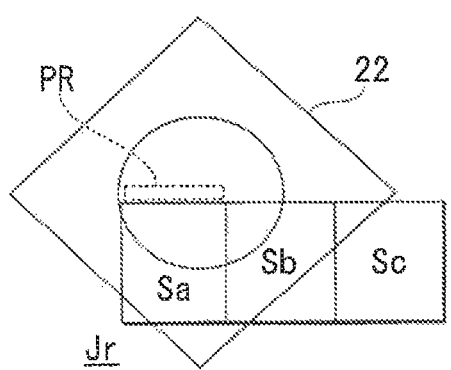
Figure 9:
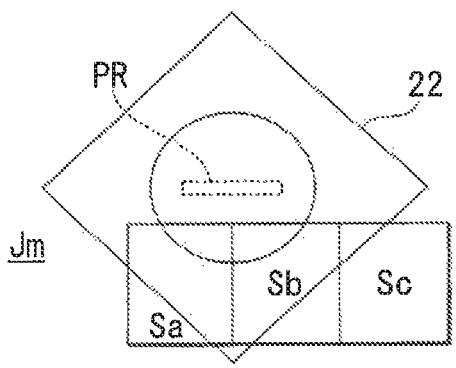
Figure 9:
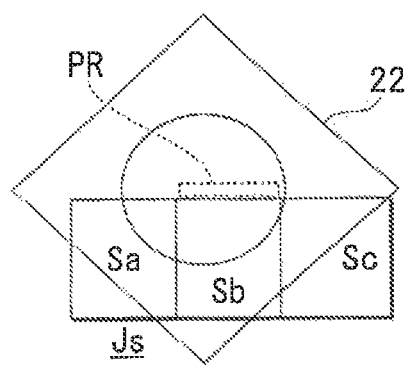
Figure 10:
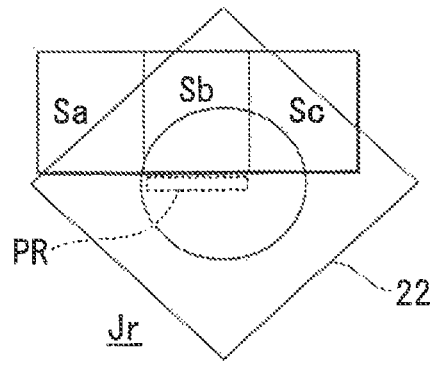
FIG. 10 is a view for explaining an example of the operation of the exposure apparatus according to the first embodiment.
Figure 10:
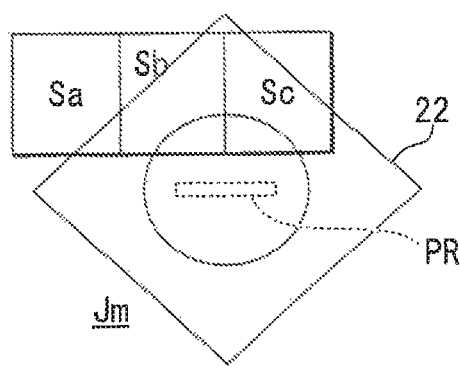
Figure 10:
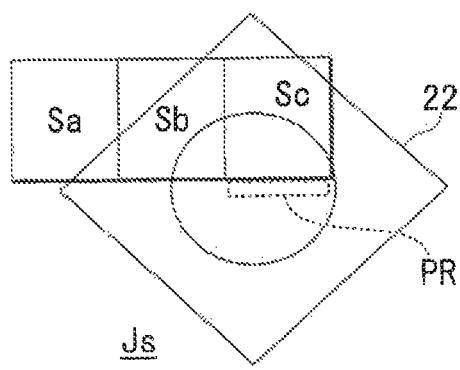
Figure 10:
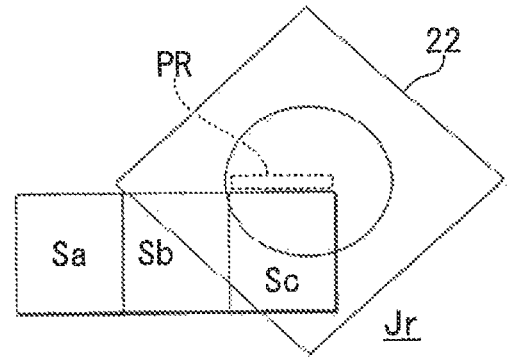

FIGS. 9 and 10 are schematic views showing an example of the operation of the second member 22 when the shot regions Sa, Sb, and Sc are exposed. FIGS. 9 and 10 are views of the second member 22 as seen from the upper side.

When the substrate P is positioned at the position d1, as shown in FIG. 9(A), the second member 22 is positioned at the position Js with respect to the projection region PR (the optical path K of the exposure light EL).

When the substrate P is positioned at the position d2, as shown in FIG. 9(B), the second member 22 is positioned at the position Jr with respect to the projection region PR (the optical path K of the exposure light EL). That is, during the scan movement operation of the substrate P from the position d1 to the position d2, the second member 22 moves in the +X axis direction reverse to the direction (−X axis direction) of the step movement of the substrate P. During the scan movement operation of the substrate P from the position d1 to the position d2, the second member 22 moves from the position Js to the position Jr via the position Jsm, the position Jm, and the position Jrm. In order words, when the substrate P moves the pathway Tp1, the second member 22 moves in the +X axis direction so that the second member 22 is changed from the state shown in FIG. 9(A) to the state shown in FIG. 9(B).

When the substrate P is positioned at the position d2. 5, as shown in FIG. 9(C), the second member 22 is positioned at the position Jm with respect to the projection region PR (the optical path K of the exposure light EL).

When the substrate P is positioned at the position d3, as shown in FIG. 9(D), the second member 22 is disposed at the position Js with respect to the projection region PR (the optical path K of the exposure light EL). That is, during the step movement operation of the substrate P from the position d2 to the position d3, the second member 22 moves in the −X axis direction which is the same as the direction (−X axis direction) of the step movement of the substrate P. During the step movement operation of the substrate P from the position d2 to the position d3, the second member 22 moves from the position Jr to the position Jm via the position Jrm, the position Jm, and the position Jsm. In other words, when the substrate P moves the pathway Tp2, the second member 22 moves in the −X axis direction so that the second member 22 is changed from the state shown in FIG. 9(B) to the state shown in FIG. 9(D) via the state shown in FIG. 9(C).

When the substrate P is positioned at the position d4, as shown in FIG. 10(A), the second member 22 is disposed at the position Jr with respect to the projection region PR (the optical path K of the exposure light EL). That is, during the scan movement operation of the substrate P from the position d3 to the position d4, the second member 22 moves in the +X axis direction reverse to the direction (−X axis direction) of the step movement of the substrate P. During the scan movement operation of the substrate P from the position d3 to the position d4, the second member 22 moves from the position Js to the position Jr via the position Jsm, the position Jm, and the position Jrm. In other words, when the substrate P moves the pathway Tp3, the second member 22 moves in the +X axis direction so that the second member 22 is changed from the state shown in FIG. 9(D) to the state shown in FIG. 10(A).

When the substrate P is positioned at the position d4. 5, as shown in FIG. 10(B), the second member 22 is positioned at the position Jm with respect to the projection region PR (the optical path K of the exposure light EL).

When the substrate P is positioned at the position d5, as shown in FIG. 10(C), the second member 22 is disposed at the position Js with respect to the projection region PR (the optical path K of the exposure light EL). That is, during the step movement operation of the substrate P from the position d4 to the position d5, the second member 22 moves in the −X axis direction which is the same as the direction (−X axis direction) of the step movement of the substrate P. During the step movement operation of the substrate P from the position d4 to the position d5, the second member 22 moves from the position Jr to the position Jm via the position Jrm, the position Jm, and the position Jsm. In other words, when the substrate P moves the pathway Tp4, the second member 22 moves in the −X axis direction so that the second member 22 is changed from the state shown in FIG. 10(A) to the state shown in FIG. 10(C) via the state shown in FIG. 10(B).

When the substrate P is positioned at the position d6, as shown in FIG. 10(D), the second member 22 is disposed at the position Jr with respect to the projection region PR (the optical path K of the exposure light EL). That is, during the scan operation movement of the substrate P from the position d5 to the position d6, the second member 22 moves in the +X axis direction reverse to the direction (−X axis direction) of the step movement of the substrate P. During the scan movement operation of the substrate P from the position d5 to the position d6, the second member 22 moves from the position Js to the position Jr via the position Jsm, the position Jm, and the position Jrm. In other words, when the substrate P moves the pathway Tp5, the second member 22 moves in the +X axis direction so that the second member 22 is changed from the state shown in FIG. 10(C) to the state shown in FIG. 10(D).

That is, in the present embodiment, in at least a part of the period in which the substrate P moves along the pathway Tp2, the second member 22 moves in the −X axis direction so that the relative speed between the second member 22 and the substrate P is decreased. In other words, in at least a part of the period of the step movement operation in which the substrate P includes the component in the −X axis direction, the second member 22 moves in the −X axis direction so that the relative speed between the second member 22 and the substrate P in the X axis direction is decreased. Similarly, in at least a part of the period in which the substrate P moves along the pathway Tp4, the second member 22 moves in the −X axis direction so that the relative speed between the second member 22 and the substrate P in the X axis direction is decreased.

In addition, in the present embodiment, the second member 22 moves in the +X axis direction in at least of a part of the period in which the substrate P moves along the pathway Tp3. Accordingly, after the substrate P moves the pathway Tp3, during the movement of the pathway Tp4, even when the second member 22 moves in the −X axis direction, the exposure light EL is able to pass through the first and second opening parts 23 and 30, and the contact between the first member 21 and the second member 22 is able to be suppressed. The case where the substrate P moves the pathways Tp1 and Tp5 is also similar to the above-described case.

That is, when the substrate P repeats the scan movement operation and the step movement operation including the component in the X axis direction, during the step movement operation, the second member 22 moves in the −X axis direction from the position Jr to the position Js so that the relative speed between the second member 22 and the substrate P is decreased, and during the scan movement operation, the second member 22 returns from the position Js to the position Jr so that the second member 22 moves in the −X axis direction again in the next step movement operation. That is, since the second member 22 moves in the +X axis direction in at least a portion of the period in which the substrate P performs the scan movement operation, the size of the second opening part 30 is able to be reduced to the required minimum, and the contact between the first member 21 and the second member 22 is suppressed.

Moreover, in the embodiment, even when the second member 22 is disposed at the first end position Jr (second end position Js), at least a portion of the first liquid recovery part 51 is continuously opposite to the substrate P (object). Accordingly, for example, in the step movement operation, the first liquid recovery part 51 is able to recover the liquid LQ on the substrate P (object).

In addition, in the present embodiment, even when the second member 22 is disposed at the first end position Jr (second end position Js), at least a portion of the first gas supply part 61 is continuously opposite to the substrate P (object). Accordingly, the gas seal is continuously formed between the second member 22 and the substrate P (object). Therefore, flowing-out of the liquid is suppressed.

Moreover, in the example described using FIGS. 9 and 10, when the substrate P is positioned at the positions d1, d3, and d5, the second member 22 is disposed at the second end position Js. When the substrate P is positioned at the positions d1, d3, and d5, the second member 22 may be disposed at the center position Jm, and may be disposed at the position Jsm between the center position Jm and the second end position Js.

In addition, in the example described using FIGS. 9 and 10, when the substrate P is positioned at the positions d2, d4, and d6, the second member 22 is disposed at the first end position Jr. When the substrate P is positioned at the positions d2, d4, and d6, the second member 22 may be disposed at the center position Jm and may be disposed at the position Jrm between the center position Jm and the first end position Jr.

Moreover, when the substrate P is positioned at the positions d2.5 and d4.5, the second member 22 may be disposed at positions different from the center position Jm. That is, when the substrate P is positioned at the positions d2.5 and d4.5, for example, the second member 22 may be disposed at the position Jsm between the center position Jm and the second end position Js, and may be disposed at the position Jrm between the center position Jm and the first end position Jr.

In addition, in at least a part of the scan movement period of the substrate P, the second member 22 may stop, and may move in the −X axis direction which is the same as the direction (−X axis direction) of the step movement of the substrate P.

Moreover, in at least a part of the step movement period of the substrate P, the second member 22 may stop, and may move in the +X axis direction reverse to the direction (−X axis direction) of the step movement of the substrate P.

That is, in a portion of the movement period (scan movement period and step movement period) of the substrate P, the second member 22 moves so that the relative speed between the second member 22 and the substrate P (object) is smaller than the relative speed between the first member 21 and the substrate P (object), and in a portion of the movement period of the substrate P, the second member 22 may stop or may move so that the relative speed between the second member 22 and the substrate is larger than the relative speed between the first member and the substrate.

As described above, according to the present embodiment, since the second member 22 which is movable with respect to the first member 21 is provided, even when the object such as the substrate P moves in the XY plane in the state where the liquid immersion space LS is formed, for example, the liquid LQ is suppressed from flowing out from the space between the liquid immersion member 5 and the object or from remaining on the object.

That is, when the object such as the substrate P moves in the XY plane at a high speed in the state where the liquid immersion space LS is formed, if the member (liquid immersion member or the like) opposite to the object is stopped, there is possibility that the liquid LQ may flow out, the liquid LQ may remain on the substrate P (object), or bubbles may occur in the liquid LQ.

In the present embodiment, for example, the second member 22 is movable so that the relative movement (relative speed and relative acceleration) between the second member 22 and the object is decreased. Accordingly, even when the object moves at a high speed in the state where the liquid immersion space LS is formed, the liquid LQ is suppressed from flowing out, the liquid LQ is suppressed from remaining on the substrate P (object), or the bubbles are suppressed from occurring in the liquid LQ.

Moreover, in the present embodiment, the first part 211 of the first member 21 is disposed at the surrounding of the optical path K (optical path KL), and the second member 22 moves outside the first part 211. Accordingly, formations of gas portion are suppressed from occurring in the optical path space SPK, or occurrences of bubbles are suppressed from occurring in the liquid LQ of the optical path K. That is, in the present embodiment, since the first part 211 of the first member 21 is disposed at at least a portion of the surrounding of the optical path K (optical path KL), even when the second member 22 moves outside than the first part 211, the pressure inside the first part 211 is suppressed from being changed, the pressure of the liquid LQ in the optical path space SPK is suppressed from being changed, or the shape of the third interface LG3 of the liquid LQ is suppressed from being largely changed. Accordingly, for example, occurrences of bubbles and the like are suppressed in the liquid LQ. Moreover, an excessive force is suppressed from being applied to the terminal optical element 13. In addition, in the present embodiment, since the first member 21 does not substantially move, the pressure between the terminal optical element 13 and the first member 21 is suppressed from being largely changed, or the shapes of the second and third interfaces LG2 and LG3 of the liquid LQ are prevented from being significantly changed.

Accordingly, occurrence of exposure failure and occurrence of a defective device are able to be prevented.

Moreover, in the present embodiment, the second member 22 includes the first liquid recovery part 51. Accordingly, the shape of the first interface LG1 formed between the first liquid recovery part 51 and the substrate P (object) is suppressed from being changed. Therefore, the liquid LQ in the liquid immersion space LS is suppressed from flowing out from the space between the liquid immersion member 5 (second member 22) and the substrate P (object), or the liquid LQ is suppressed from remaining on the substrate P (object).

Moreover, in the present embodiment, the first liquid supply part 41 is provided at the lower surface 24 of the first part 211. Accordingly, for example, even when the first interface LG1 approaches the first opening part 23 due to the movement of the object or the like, the first interface LG1 is suppressed from moving inside the first opening part 23 due to the liquid LQ supplied from the first liquid supply part 41, or the gas is suppressed from entering in the liquid LQ inside the first opening part 23.

Moreover, in the present embodiment, the second liquid supply part 42 is provided at the lower surface 31 of the second member 22. Accordingly, for example, even when the first interface LG1 approaches the first opening part 23 (opening part 301) due to the movement of the object or the like, the first interface LG1 is suppressed from moving inside the first opening part 23 (opening part 301), or the gas is suppressed from entering in the liquid LQ inside the first opening part 23 (opening part 301) due to the liquid LQ supplied from the second liquid supply part 42.

Moreover, in the present embodiment, the first gas supply part 61 is provided at the lower surface 31 of the second member 22. Therefore, the gas seal is formed between the second member 22 and the object. Accordingly, the liquid LQ is suppressed from flowing out from the second space SP2. In addition, since the gas G is supplied from the first gas supply part 61 in parallel with the recovery operation from the first liquid recovery part 51, a decrease in the pressure of the second space SP2 due to the recovery operation of the first liquid recovery part 51 is able to be suppressed.

Moreover, in the present embodiment, the gap (fourth space SP4) between the first member 21 and the second member 22 is opened to the atmosphere. Accordingly, the liquid LQ on the object is able to smoothly flow in the fourth space SP4 via the opening part 301. Therefore, for example, the change in the pressure of the optical path space SPK, the change in the pressure of the third space SP3, or the change in the pressure of the second space SP2 is able to be suppressed.

In addition, in the present embodiment, the second liquid recovery part 52 is provided. Accordingly, the liquid LQ flowing in the gap (fourth space SP4) between the first member 21 and the second member 22 is suppressed from flowing out from the gap (fourth space SP4).

Moreover, in the present embodiment, the second liquid recovery part 52 is disposed at the second part 212. Accordingly, after the liquid LQ entering in the fourth space SP4 from the opening part 301 contacts at least a portion of the outer surface 26, the inner surface 32, and the lower surface 28, and at least a portion of the upper surface 33, the liquid LQ is recovered from the second liquid recovery part 52. That is, since the second liquid recovery part 52 is disposed at the second part 212, a contact area (contact time) between the liquid LQ and the first member 21 and a contact area (contact time) between the liquid LQ and the second member 22 is able to be increased (lengthened). Accordingly, temperatures of the first member 21 and the second member 22 are adjusted by the liquid LQ which is supplied from the liquid supply part 40 (at least one of the first, the second, the third liquid supply parts 41, 42, and 43).

Moreover, in the present embodiment, in the fourth space SP4, the first gap part having the size Ha and the second gap part having the size Hb are provided. Since the second liquid recovery part 52 recovers the liquid LQ from the first gap part, the second gap part becomes a gas space. The second gap part filled with the gas functions as a damping part which suppresses vibration of the second member 22. The second gap part filled with the gas is able to function as a so-called squeeze film damper. For example, even when the second member 22 moves in the XY plane, vibration (undesired vibration) of the second member 22 with respect to the Z axis direction is suppressed by the second gap part (damping part).

Moreover, the size Hb is 0.2 mm or less, and may be 0.01 mm to 0.1 mm.

Moreover, in the present embodiment, the wall part 333 forming the second gap part is provided. Accordingly, the liquid LQ in the fourth space SP4 is suppressed from flowing out from the fourth space SP4.

In addition, in the present embodiment, at least a portion of the surface (outer surface 26 and lower surface 28) of the first member 21 and the surface (inner surface 32 and upper surface 33) of the second member 22 facing the gap (fourth space SP4) between the first member 21 and the second member 22 has liquid repellent property with respect to the liquid LQ. Accordingly, for example, even when the second member 22 moves, the pressure of the liquid LQ in the liquid immersion space LS is suppressed from being changed, and occurrence of undesired flow of the liquid LQ is suppressed.

Moreover, according to the present embodiment, the third liquid supply part 43 is provided. Accordingly, the optical path K is able to be filled with the liquid LQ.

In addition, in the present embodiment, the gap (third space SP3) between the terminal optical element 13 and the first member 21 is opened to the atmosphere. Accordingly, the liquid LQ above the object is able to smoothly flow into the third space SP3 via the opening part 37. Therefore, for example, the change in the pressure of the optical path space SPK, the change in the pressure of the third space SP3, or the change in the pressure of the second space SP2 is prevented.

Moreover, in the present embodiment, the third liquid recovery part 53 is provided. Accordingly, the liquid LQ flowing in the gap (third space SP3) between the terminal optical element 13 and the first member 21 is prevented from flowing out from the gap (third space SP3).

In addition, in the present embodiment, the first member 21 may move. The first member 21 may move with respect to the terminal optical element 13. The first member 21 may move in at least one of six directions of the X axis, Y axis, Z axis, θX, θY, and θZ directions. For example, in order to adjust a positional relationship between the terminal optical element 13 and the first member 21 or a positional relationship between the first member 21 and the second member 22, the first member 21 may move.

In addition, the first member 21 may not substantially move in the period in which the second member 22 moves, and may move in at least a part of the period in which the second member 22 does not move.

Moreover, the first member 21 may not substantially move in the state where the liquid immersion space LS is formed, and may move in the state where the liquid immersion space LS is not formed.

In addition, the first member 21 may not move in the period in which the exposure light EL is emitted from the emitting surface 12, and may move in the period in which the exposure light EL is not emitted from the emitting surface 12.

Moreover, the first member 21 may move in at least a part of the period in which the second member 22 moves. In addition, the first member 21 may move in the state where the liquid immersion space LS is formed. Moreover, the first member 12 may move in at least a part of the period in which the exposure light EL is emitted from the emitting surface 12. In addition, the first member 21 may move in at least a part of the period in which the substrate P (object) moves.

The first member 21 may move at a lower speed than the second member 22. The first member 21 may move at a lower acceleration than the second member 22. The first member 21 may move at a lower speed than the substrate P. The first member 21 may move at a lower acceleration than the substrate P.

Second Embodiment

A second embodiment will be described. In the descriptions below, the same reference numerals are assigned to the same or similar components as those of the above-described embodiment, and descriptions thereof are simplified or omitted here.

FIGS. 11 to 16 show examples of dispositions of the first liquid recover ports 51M.

Figure 11:
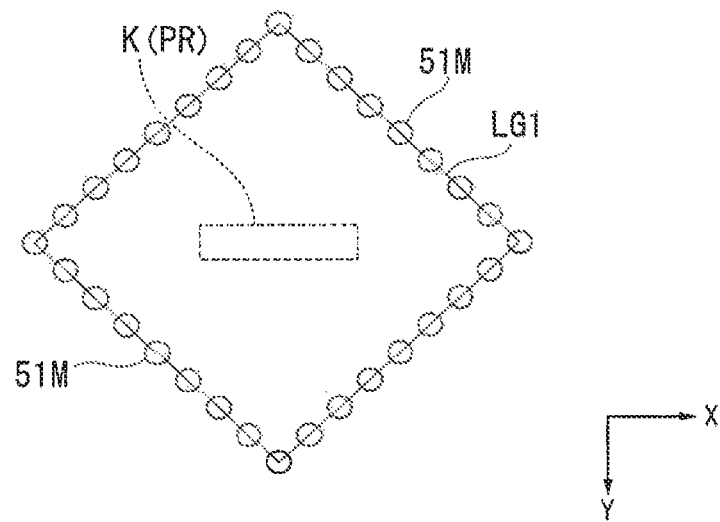
FIG. 11 is a view showing an example of a second member according to a second embodiment.

As shown in FIG. 11, the plurality of first liquid recovery ports 51M may be disposed along a rectangular virtual line. In FIG. 11, a rectangular shape drawing the virtual line is a substantially square. Apexes (corners) of the rectangular shape are disposed at the +X side and the −X side and disposed at the +Y side and the −Y side with respect to the optical path K (optical axis AX). The outer shape of the first interface LG1 of the liquid LQ between the second member 22 and the substrate P (object) is defined as a substantially rectangular shape along the plurality of first liquid recovery ports 51M.

Figure 12:
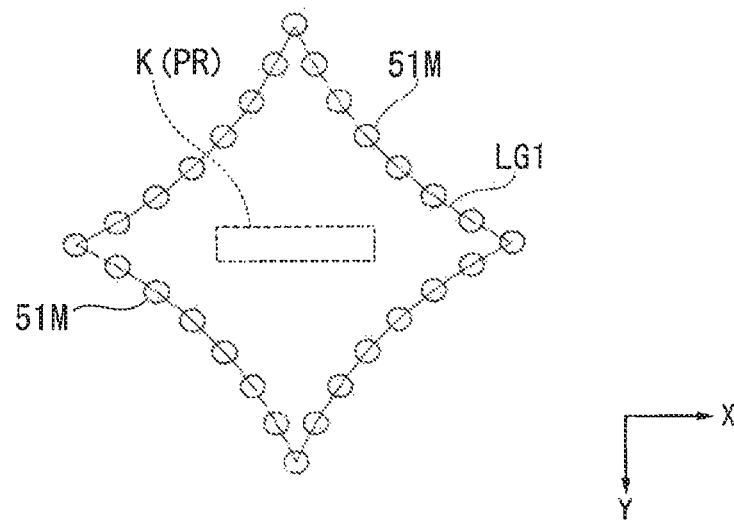
FIG. 12 is a view showing an example of the second member according to the second embodiment.

As shown in FIG. 12, the sides of the rectangular virtual line may be curved. The plurality of first liquid recovery ports 51M may be disposed along the virtual line including the curved line.

Figure 13:
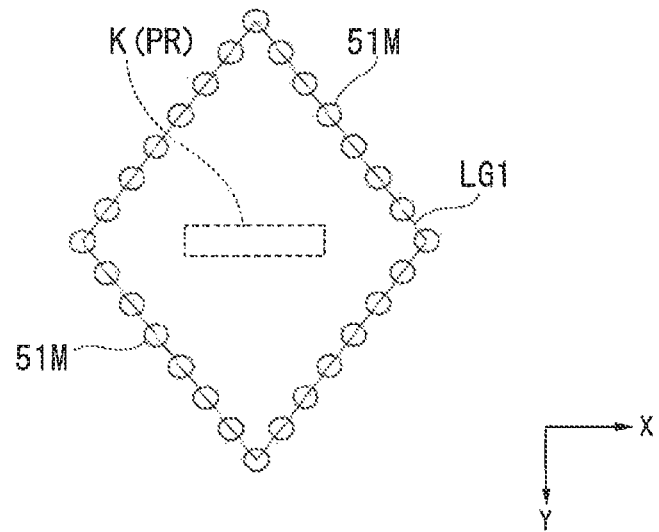
FIG. 13 is a view showing an example of the second member according to the second embodiment.

As shown in FIG. 13, the plurality of first liquid recovery ports 51M may be disposed along a rhombic virtual line which is longer in the Y axis direction. Moreover, the plurality of first liquid recovery ports 51M may be disposed along a rhombic virtual line which is longer in the X axis direction.

Figure 14:
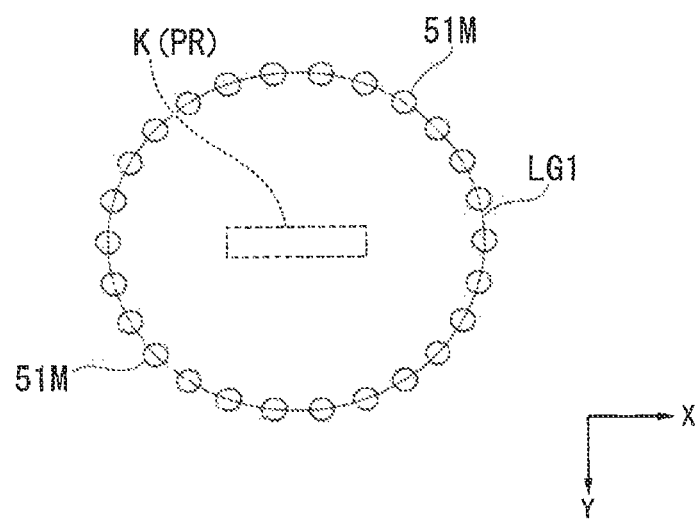
FIG. 14 is a view showing an example of the second member according to the second embodiment.

As shown in FIG. 14, the plurality of first liquid recovery ports 51M may be disposed along a circular virtual line.

Figure 15:
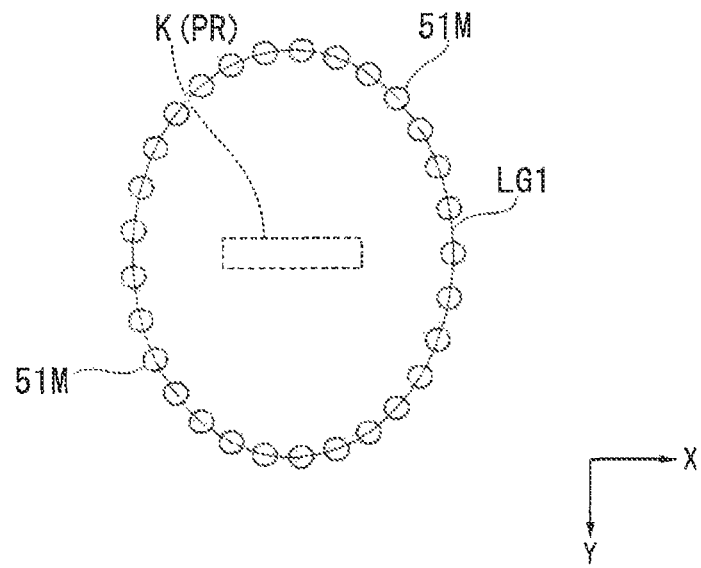
FIG. 15 is a view showing an example of the second member according to the second embodiment.

As shown in FIG. 15, the plurality of first liquid recovery ports 51M may be disposed along an elliptical virtual line which is longer in the Y axis direction. In addition, the plurality of first liquid recovery ports 51M may be disposed along an elliptical virtual line which is longer in the X axis direction.

Figure 16:
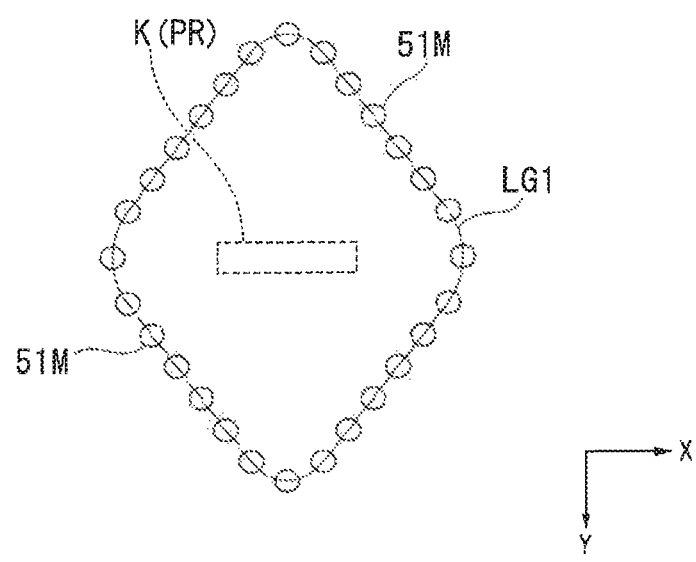
FIG. 16 is a view showing an example of the second member according to the second embodiment.

As shown in FIG. 16, the corners of the rectangular virtual line may be rounded. The plurality of first liquid recovery ports 51M may be disposed along the virtual line including the curved line.

Third Embodiment

A third embodiment will be described. In the descriptions below, the same reference numerals are assigned to the same or similar components as those of the above-described embodiments, and descriptions thereof are simplified or omitted here.

Figure 17:
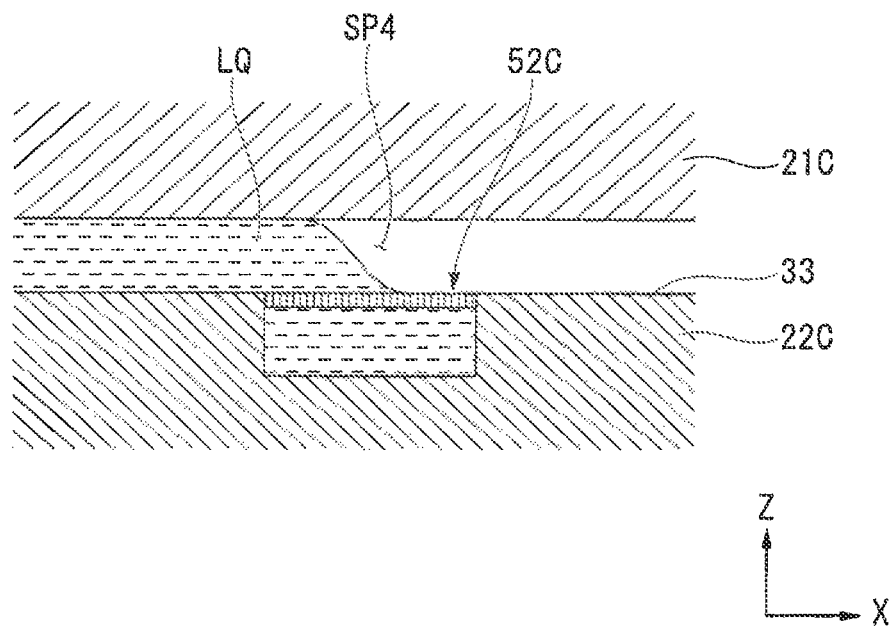
FIG. 17 is a view showing an example of a liquid immersion member according to a third embodiment.

FIG. 17 shows an example of a second liquid recovery part 52C according to the present embodiment. The second liquid recovery part 52C recovers at least a portion of the liquid LQ flowing in the gap (fourth space SP4) between the first member 21C and the second member 22C from above the substrate P (object). In the present embodiment, the second liquid recovery part 52C is disposed at the second member 22C. In the example shown in FIG. 17, the second liquid recovery part 52C is disposed at the upper surface 33 of the second member 22C.

In addition, the second liquid recovery part, which recovers at least a portion of the liquid flowing in the gap between the first member 21 and the second member 22, may be disposed at both of the first member 21 and the second member 22.

Fourth Embodiment

A fourth embodiment will be described. In the descriptions below, the same reference numerals are assigned to the same or similar components as those of the above-described embodiments, and descriptions thereof are simplified or omitted here.

Figure 18:
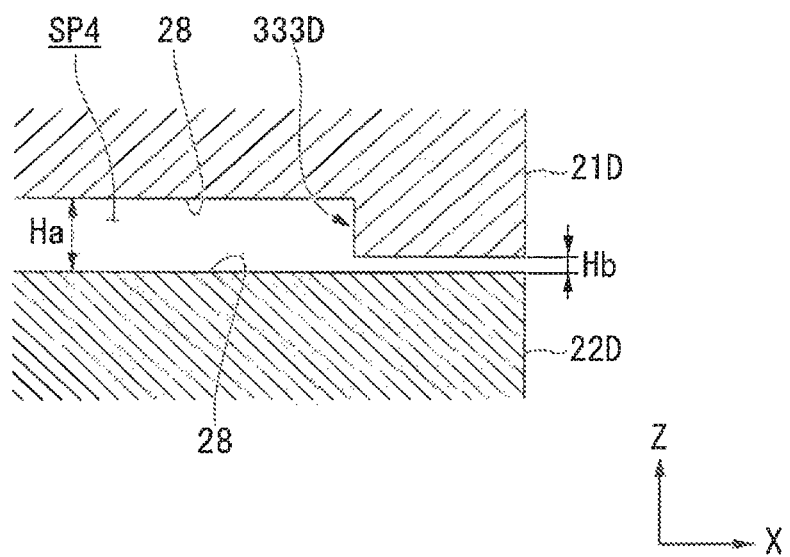
FIG. 18 is a view showing an example of a liquid immersion member according to a fourth embodiment.

FIG. 18 shows an example of a second gap part according to the present embodiment. As shown in FIG. 18, a protruding part (wall part) 333D may be provided at a first member 21D. The protruding part 333D is provided at the lower surface 28 of the first member 21D. The protruding part 333D protrudes below (second member 22D side). The second gap part having the size Hb is defined by the lower surface of the protruding part 333D and the upper surface 28 of the second member 22D.

In addition, the protruding part for defining the second gap part may be provided at both of the first member 21 and the second member 22. That is, the second gap part may be defined between the lower surface of the protruding part provided at the first member 21 to protrude below and the upper surface of the protruding part provided at the second member 22 to protrude above.

Fifth Embodiment

A fifth embodiment will be described. In the descriptions below, the same reference numerals are assigned to the same or similar components as those of the above-described embodiments, and descriptions thereof are simplified or omitted here.

Figure 19:
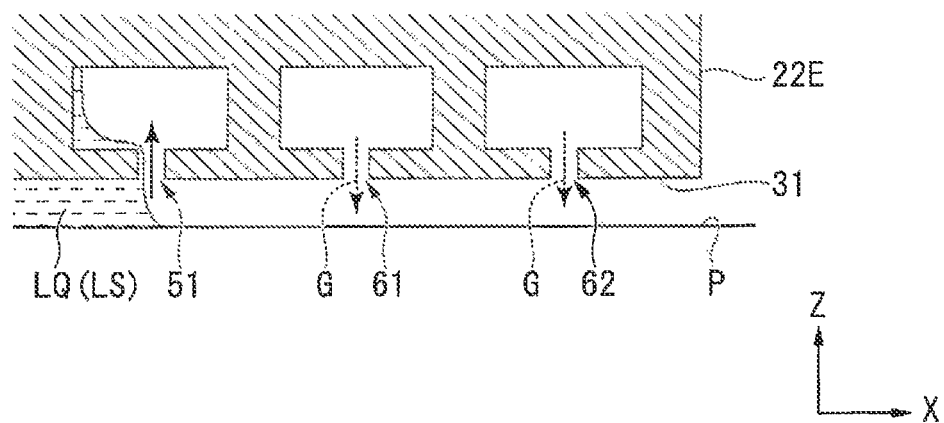
FIG. 19 is a view showing an example of a liquid immersion member according to a fifth embodiment.

FIG. 19 shows an example of a second member 22E according to the present embodiment. As shown FIG. 19(A), a second gas supply part 62 may be disposed outside the first gas supply part 61 in the radial direction with respect to the optical axis AX of the terminal optical element 13. The second gas supply part 62 is disposed at the lower surface 31 of the second member 22. By the gas G supplied from the second gas supply part 62, the liquid LQ is suppressed from flowing out from the second space SP2.

Sixth Embodiment

A sixth embodiment will be described. In the descriptions below, the same reference numerals are assigned to the same or similar components as those of the above-described embodiments, and descriptions thereof are simplified or omitted here.

Figure 20:
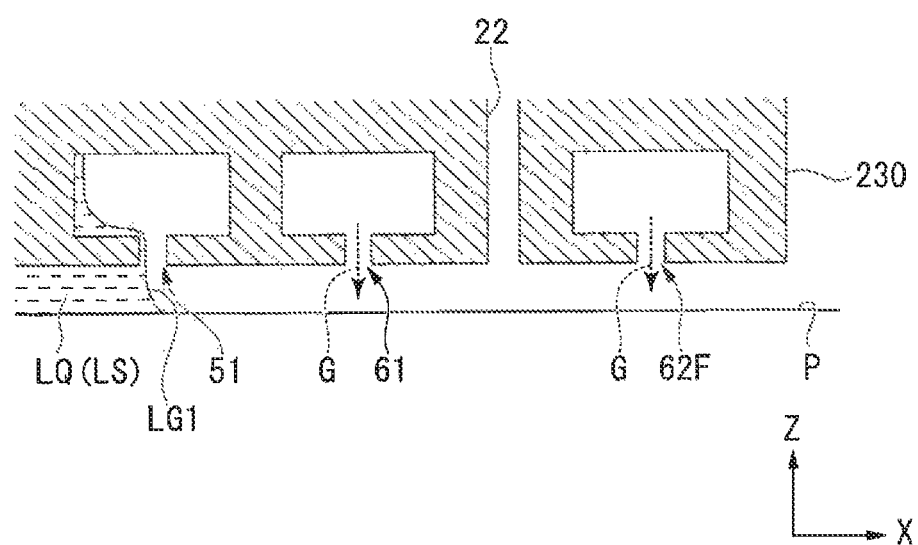
FIG. 20 is a view showing an example of a liquid immersion member according to a sixth embodiment.

FIG. 20 is a view showing an example of the exposure apparatus EX according to the present embodiment. As shown in FIG. 20, a third member 230 including a second gas supply part 62F, which is able to be opposite to the surface of the substrate P (object), may be disposed outside the second member 22 with respect to the optical path K (optical axis AX) of the exposure light EL. The third member 230 may move based on the movement conditions (movement direction, movement speed, acceleration, or the like) of the second member 22 in at least a part of the period in which the second member 22 moves so that the third member 230 does not contact the second member 22. The third member 230 may perform the supply operation of the gas G from the second gas supply part 62F while moving.

Moreover, in the examples shown in FIGS. 19 and 20, a liquid recovery part may be disposed instead of the second gas supply part 62 (62F). The liquid recovery part is provided outside the first liquid recovery part 51 and the first gas supply part 61 with respect to the optical path K (optical axis AX) of the exposure light EL, and thus, even when the liquid LQ flows outside than the first gas supply part 61, the liquid LQ is able to be recovered from the liquid recovery part.

Moreover, a liquid recovery part may be disposed at addition to the second gas supply part 62 (62F).

Seventh Embodiment

A seventh embodiment will be described. In the descriptions below, the same reference numerals are assigned to the same or similar components as those of the above-described embodiments, and descriptions thereof are simplified or omitted here.

Figure 21:
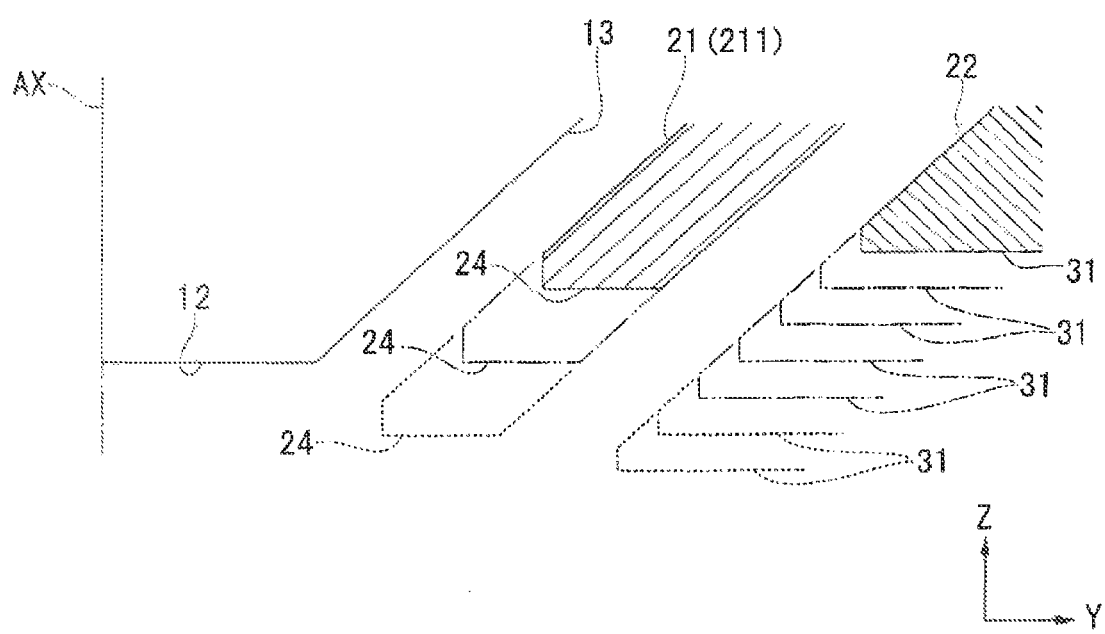
FIG. 21 is a view for explaining an example of a liquid immersion member according to a seventh embodiment.

FIG. 21 is a schematic view showing a relationship among the emitting surface 12 of the terminal optical element 13, the lower surface 24 of the first member 21 (first part 211), and the lower surface 31 of the second member 22.

As shown in FIG. 21, the lower surface 24 of the first member 21 (first part 211) may be disposed below the emitting surface 12, may be disposed at substantially the same height as the emitting surface 12, and may be disposed above the emitting surface 12. The lower surface 24 may be disposed at substantially the same plane as the emitting surface 12. The lower surface 24 may be substantially parallel to the XY plane, may be inclined to the emitting surface 12, may be inclined to the XY plane, may be a flat surface, and may include a curved surface.

As shown in FIG. 21, the lower surface 31 of the second member 22 may be disposed below the emitting surface 12, may be disposed at substantially the same height as the emitting surface 12, and may be disposed above the emitting surface 12. The lower surface 31 may be disposed at substantially the same plane as the emitting surface 12. The lower surface 31 may be substantially parallel to the XY plane, may be inclined to the emitting surface 12, may be inclined to the XY plane, may be a flat surface, and may include a curved surface.

As shown in FIG. 21, the lower surface 31 of the second member 22 may be disposed below the lower surface 24 of the first member 21 (first part 211), may be disposed at substantially the same height as the lower surface 24, and may be disposed above the lower surface 24. The lower surface 31 may be disposed at substantially the same plane as the lower surface 24. The lower surface 31 may be inclined with respect to the lower surface 24. The lower surface 24 may be disposed below the emitting surface 12, may be disposed at substantially the same height as the emitting surface 12, and may be disposed above the emitting surface 12.

Eighth Embodiment

An eighth embodiment will be described. In the descriptions below, the same reference numerals are assigned to the same or similar components as those of the above-described embodiments, and descriptions thereof are simplified or omitted here.

Figure 22:
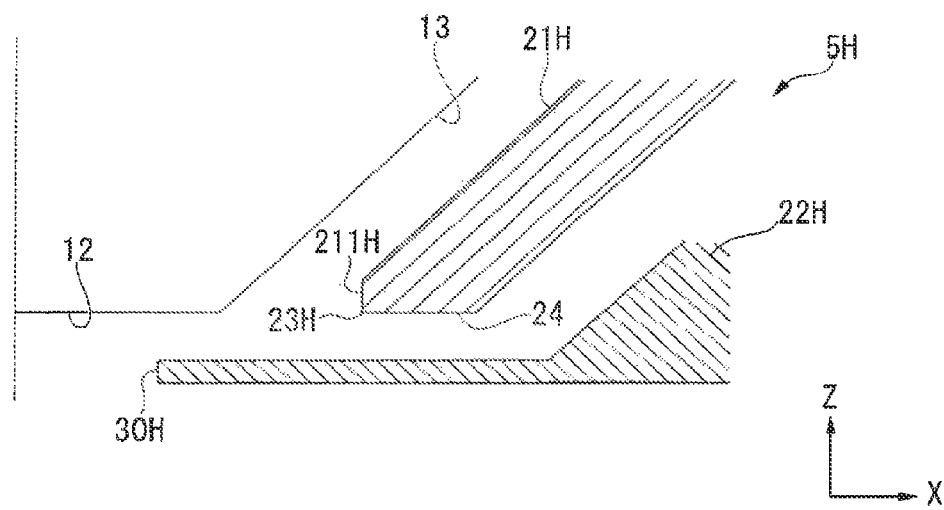
FIG. 22 is a view showing an example of a liquid immersion member according to an eighth embodiment.

FIG. 22 is a view showing an example of a liquid immersion member 5H according to the present embodiment. As shown in FIG. 22, at least a portion of a second member 22H may be disposed below the lower surface 24 of a first part 211H. In other words, at least a portion of the second member 22H may be disposed between the first part 211H and the substrate P (object). In addition, as shown in FIG. 22, at least a portion of the second member 22H may be disposed below the emitting surface 12 of the terminal optical element 13. In order words, at least a portion of the second member 22 may be disposed between the terminal optical element 13 and the substrate P (object).

Moreover, as shown in FIG. 22, a second opening part 30H of the second member 22 may be smaller than a first opening part 23H of the first member 21.

Ninth Embodiment

A ninth embodiment will be described. In the descriptions below, the same reference numerals are assigned to the same or similar components as those of the above-described embodiments, and descriptions thereof are simplified or omitted here.

Figure 23:
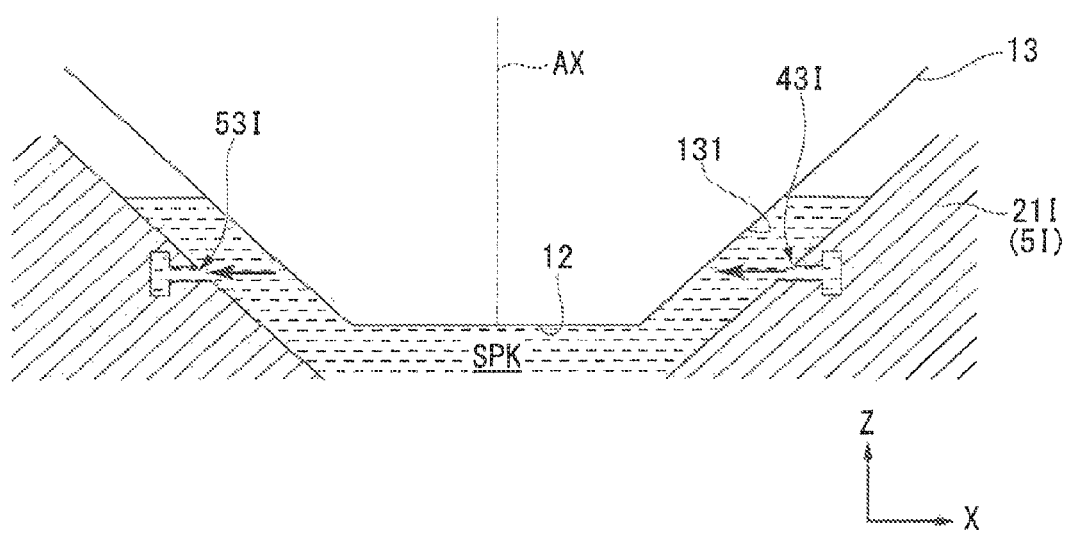
FIG. 23 is a view showing an example of a liquid immersion member according to a ninth embodiment.

FIG. 23 is a view showing an example of a liquid immersion member 5I (first member 21I) according to the present embodiment. As shown in FIG. 23, a third liquid supply part 431 opposite to the outer surface 131 of the terminal optical element 13 is disposed at one side (for example, +X side) with respect to the optical axis AX of the terminal optical element 13, and a third liquid recovery part 531 opposite to the outer surface 131 of the terminal optical element 13 may be disposed at the other side (for example, −X side) with respect to the optical axis AX of the terminal optical element 13. Accordingly, the liquid LQ flows from the one side to the other side with respect to the optical axis AX in the optical path space SPK.

Moreover, the third liquid supply part 431 is disposed to face the optical path K (optical path space SPK) between the emitting surface 12 and the substrate P (object). The third liquid recovery part 531 may be disposed to face the optical path K (optical path space SPK). In other words, one or both of the third liquid supply part 431 and the third liquid recovery part 531 may be disposed below the emitting surface 12.

Tenth Embodiment

Next, a tenth embodiment will be described. In the descriptions below, the same reference numerals are assigned to the same or similar components as those of the above-described embodiments, and descriptions thereof are simplified or omitted here.

Figure 24:
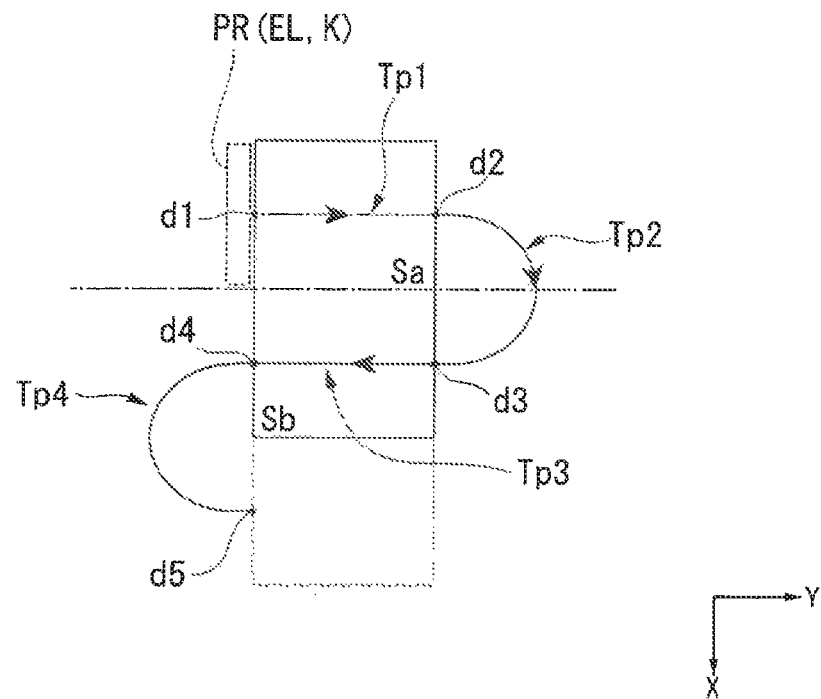
FIG. 24 is a view for explaining an example of an operation of an exposure apparatus according to a tenth embodiment.
Figure 24:
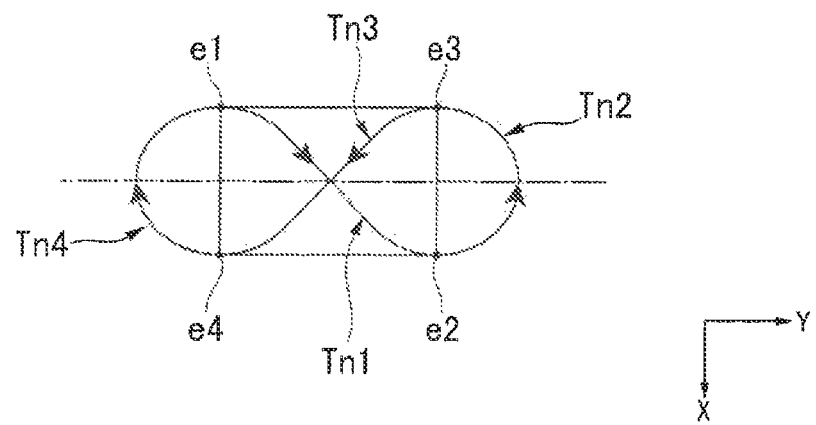

In the present embodiment, an example of the operation of the second member 22 will be described. FIG. 24(A) is a view schematically showing an example of the movement locus of the substrate P when the shot region Sa and the shot region Sb are sequentially exposed. FIG. 24(B) is a view schematically showing an example of the movement locus of the second member 22 according to the present embodiment when the shot region Sa and the shot region Sb are sequentially exposed.

Also in the present embodiment, when the substrate P (substrate stage 2) performs the scan movement operation and the step movement operation in the state where the liquid immersion space LS is formed, the second member 22 moves so that the relative movement (relative speed, relative acceleration) between the second member 22 and the substrate P (substrate stage 2) is smaller than the relative movement (relative speed, the relative acceleration) between the first member 21 and the substrate P (substrate stage 2).

As shown in FIG. 24(A), when the shot regions Sa is exposed, the substrate P sequentially moves the pathway Tp1 from the state where the projection region PR is disposed at the position d1 of the substrate P to the state where the projection region PR is disposed at the position d2 adjacent at the +Y side with respect to the position d1, the pathway Tp2 from the state where the projection region PR is disposed at the position d2 to the state where the projection region PR is disposed at the position d3 adjacent at the +X side with respect to the position d2, the pathway Tp3 from the state where the projection region PR is disposed at the position d3 to the state where the projection region PR is disposed at the position d4 adjacent at the −Y side with respect to the position d3, and the pathway Tp4 from the state where the projection region PR is disposed at the position d4 to the state where the projection region is disposed at the position d5 adjacent at the +X side with respect to the position d4, under the terminal optical element 13. The positions d1, d2, d3, and d4 are positions in the XY plane.

At least a portion of the pathway Tp1 is a straight line parallel to the Y axis. At least a portion of the pathway Tp3 is a straight line parallel to the Y axis. The pathway Tp2 includes a curved line. The pathway Tp4 includes a curved line. The position d1 includes the start point of the pathway Tp1, and the position d2 includes the end point of the pathway Tp1. The position d2 includes the start point of the pathway Tp2, and the position d3 includes the end point of the pathway Tp2. The position d3 includes the start point of the pathway Tp3, and the position d4 includes the end point of the pathway Tp3. The position d4 includes the start point of the pathway Tp4, and the position d5 includes the end point of the pathway Tp4. The pathway Tp1 is a pathway on which the substrate P moves in the −Y axis direction. The pathway Tp3 is a pathway on which the substrate P moves in the +Y axis direction. The pathway Tp2 and the pathway Tp4 are pathways on which the substrate P substantially moves in the −X axis direction.

When the substrate P moves the pathway Tp1 in the state where the liquid immersion space LS is formed, the exposure light EL is radiated to the shot region Sa via the liquid LQ. The operation in which the substrate P moves the pathway Tp1 includes the scan movement operation. In addition, when the substrate P moves the pathway Tp3 in the state where the liquid immersion space LS is formed, the exposure light EL is radiated to the shot region Sb via the liquid LQ.

The operation in which the substrate P moves the pathway Tp3 includes the scan movement operation. The operation in which the substrate P moves the pathway Tp2 and the operation in which the substrate P moves the pathway Tp4 include the step movement operation.

When the substrate P sequentially moves the pathways Tp1, Tp2, Tp3, and Tp4, as shown in FIG. 24(B), the second member 22 sequentially moves pathways Tn1, Tn2, Tn3, and Tn4. The pathway Tn1 is a pathway from a position e1 to a position e2. The pathway Tn2 is a pathway from the position e2 to a position e3. The pathway Tn3 is a pathway from the position e3 to a position e4. The pathway Tn4 is a pathway from the position e4 to the position e1. The pathway Tn1 includes a straight line. The pathway Tn2 includes a curved line. The pathway Tn3 includes a straight line. The pathway Tn4 includes a curved line. The pathway Tn1 and the pathway Tn3 intersect each other. The pathway Tn1 and the pathway Tn3 are inclined to both of the X axis and the Y axis.

That is, in the present embodiment, the second member 22 moves in the XY plane such as drawing a character "8" of Arabic numerals.

In the pathway Tn1, the second member 22 moves in the +Y axis direction while moving in the +X axis direction. That is, in the scan movement period of the substrate P, the second member 22 moves in the direction reverse to the movement direction of the substrate P in the step movement period of the substrate P with respect to the X axis direction.

In the pathway Tn2, the second member 22 substantially moves in the −X axis direction. That is, in the step movement period of the substrate P, the second member 22 moves in substantially the same direction as the movement direction of the substrate P in the step movement period of the substrate P. The second member 22 moves so that the relative speed (relative acceleration) between the second member 22 and the substrate P is decreased.

In the pathway Tn3, the second member 22 moves in the −Y axis direction while moving in the +X axis direction. That is, in the scan movement period of the substrate P, the second member 22 moves in the direction reverse to the movement direction of the substrate P in the step movement period of the substrate P with respect to the X axis direction.

In the pathway Tn4, the second member 22 substantially moves in the −X axis direction. That is, in the step movement period of the substrate P, the second member 22 moves in substantially the same direction as the movement direction of the substrate P in the step movement period of the substrate P. The second member 22 moves so that the relative speed (relative acceleration) between the second member and the substrate P is decreased.

Also in the present embodiment, the liquid LQ is suppressed from flowing out, and bubbles are suppressed from occurring in the liquid LQ. Accordingly, occurrence of exposure failure is able to be prevented, and occurrence of a defective device is able to be prevented.

Moreover, in the above-described first to tenth embodiments, the gas G may be substantially recovered from the first liquid recovery part 51, and the recovery of the liquid LQ may be suppressed. For example, the inner surface of the first liquid recovery port 51M of the first liquid recovery part 51 is formed of a film having liquid repellent property with respect to the liquid LQ, and thus, the recovery of the liquid LQ from the first liquid recovery port 51 is prevented.

Moreover, in each of the above-described embodiments, the gas G may not be actively provided from the first gas supply part 61. In other words, the first gas supply part 61 may not be connected to the gas supply apparatus. For example, the first gas supply part 61 may be opened to the atmosphere (for example, exposed to the atmosphere). In the state where the first gas supply part 61 is opened to the atmosphere (exposed to the atmosphere), the recovery operation (suction operation) from the first liquid recovery part 51 is performed, and thus, the gas G passively flows in the second space SP2 from the first gas supply part 61. Therefore, a decrease in the pressure of the second space SP2 according to the recovery operation of the first liquid recovery part 51 is prevented.

In addition, in each of the above-described embodiments, for example, the liquid LQ supplied from the first liquid supply part 51 and the liquid LQ supplied from the second liquid supply part 52 may be different from each other. The liquid LQ supplied from the first liquid supply part 51 and the liquid LQ supplied from the third liquid supply part 53 may be different from each other. The liquid LQ supplied from the second liquid supply part 52 and the liquid LQ supplied from the third liquid supply part 53 may be different from each other. The liquids LQ being different from each other includes kinds (physical properties) of the liquids LQ being different from each other, and the kinds of the liquids LQ being the same as each other and the liquids LQ being different from each other in at least one of temperature and degree of cleanness.

Moreover, in each of the above-described embodiments, the first liquid recovery part 51 and the first liquid supply part 41 may be provided at the liquid immersion member 5, and at least a portion of the second and third liquid recovery parts 52 and 53, the second and third liquid supply parts 42 and 43, and the first and second gas supply parts 61 and 62 may be omitted.

In addition, in each of the above-described embodiments, the first liquid recovery part 51 and the second liquid supply part 42 may be provided at the liquid immersion member 5, and at least a portion of the second and third liquid recovery parts 52 and 53, the first and third liquid supply parts 41 and 43, and the first and second gas supply parts 61 and 62 may be omitted.

Moreover, in each of the above-described embodiments, the first liquid recovery part 51 and the third liquid supply part 43 may be provided at the liquid immersion member 5, and at least a portion of the second and third liquid recovery parts 52 and 53, the first and second liquid supply parts 41 and 42, and the first and second gas supply parts 61 and 62 may be omitted.

Moreover, in each of the above-described embodiments, the first liquid recovery part 51 and the first gas supply part 61 may be provided at the liquid immersion member 5, and at least a portion of the second and third liquid recovery parts 52 and 53, the first, second, and third liquid supply parts 41, 42, and 43, and the second gas supply part 62 may be omitted.

In addition, in each of the above-described embodiments, the first liquid recovery part 51 and the second liquid recovery part 52 may be provided at the liquid immersion member 5, and at least a portion of the third liquid recovery part 53, the first, second, and third liquid supply parts 41, 42, and 43, and the first and second gas supply parts 61 and 62 may be omitted.

Moreover, in each of the above-described embodiments, the second gap part having the size Hb may not be provided.

In addition, in each of the above-described embodiments, the first member 21 may not include the second part 212. The first member 21 may not include the upper plate part 214.

Eleventh Embodiment

An eleventh embodiment will be described. In the descriptions below, the same reference numerals are assigned to the same or similar components as those of the above-described embodiments, and descriptions thereof are simplified or omitted here.

Figure 25:
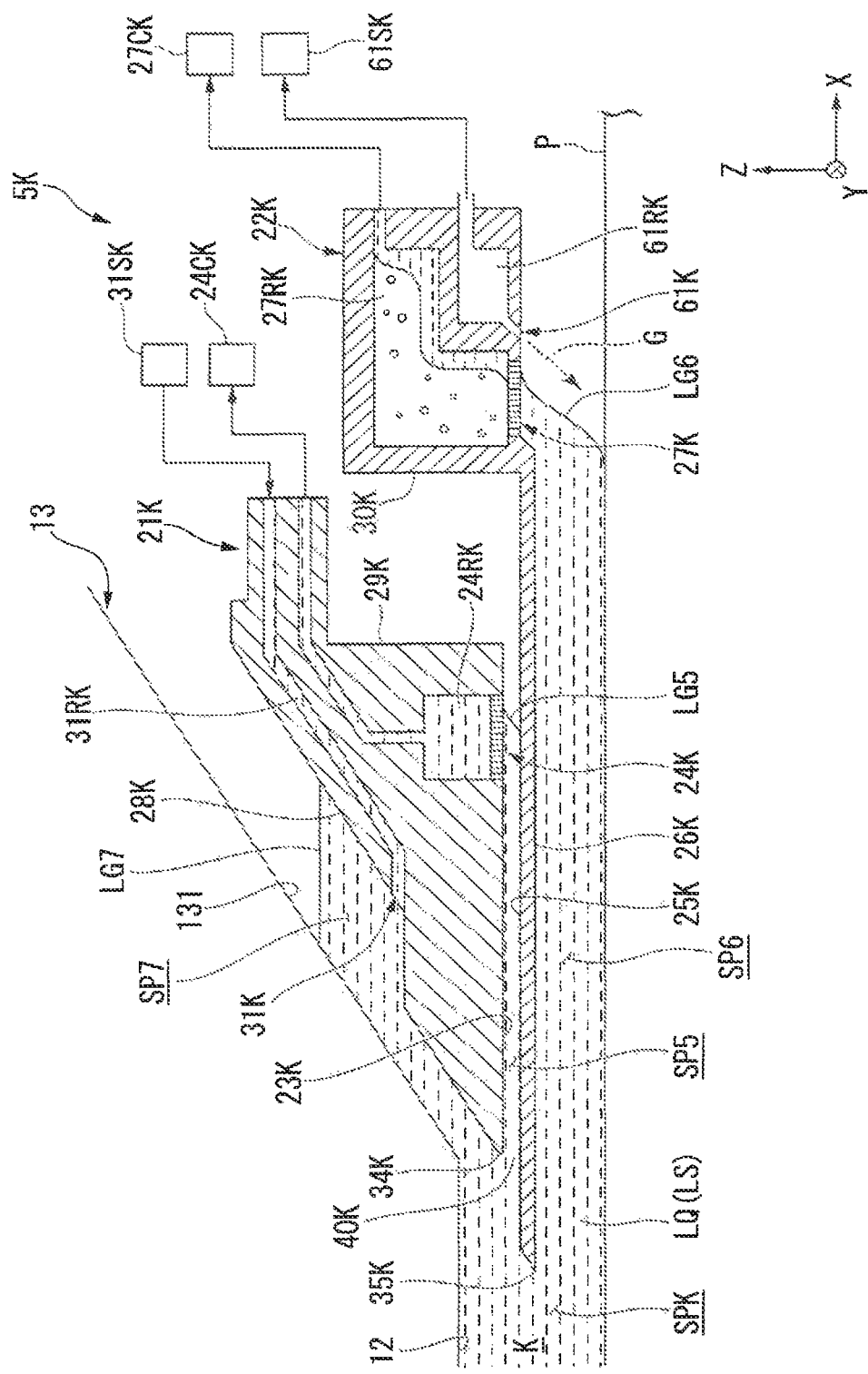
FIG. 25 is a side cross-sectional view showing a portion of a liquid immersion member according to an eleventh embodiment.
Figure 26:
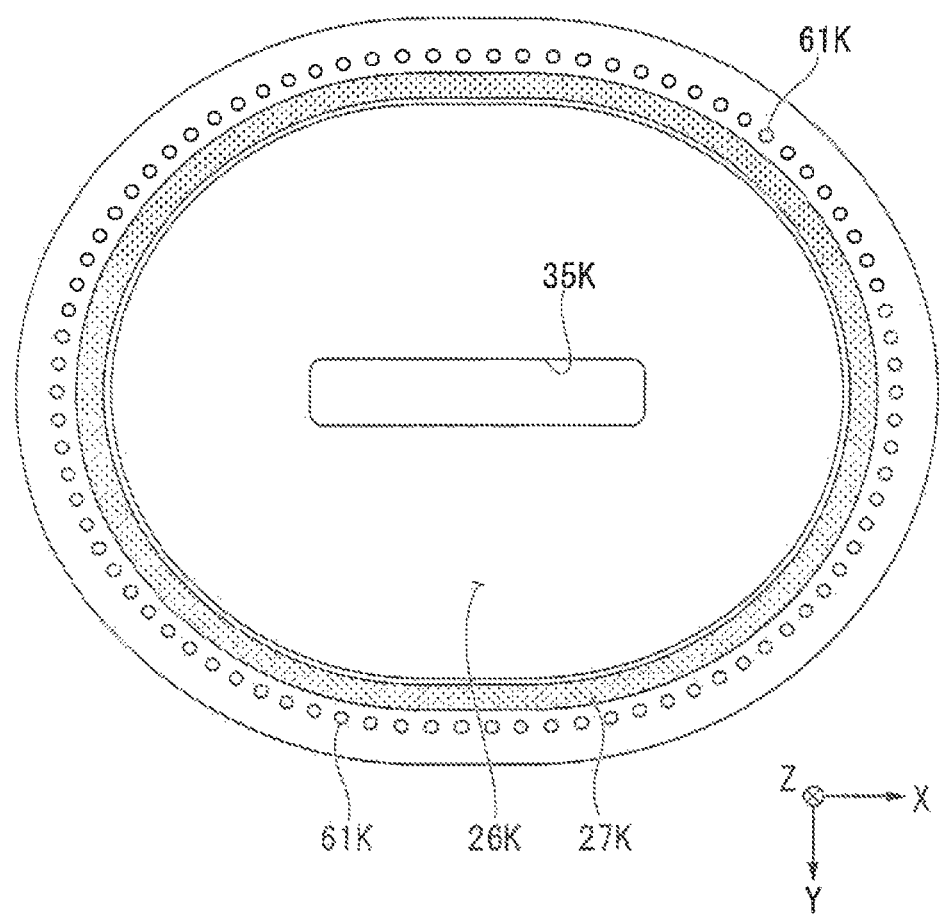
FIG. 26 is a view of the liquid immersion member according to the eleventh embodiment as seen from below.

FIG. 25 is a view showing an example of a liquid immersion member 5K according to the present embodiment. FIG. 26 is a view of the liquid immersion member 5K (second member 22K) according to the present embodiment as seen from below. The liquid immersion member 5K is able to form the liquid immersion space LS of the liquid LQ above the substrate P (object) movable below the terminal optical element 13. The liquid immersion member 5K includes a first member 21K which is disposed at at least a portion of the surrounding of the optical path K (KL) of the exposure light EL, and a second member 22K in which at least a portion is disposed to be opposite to the substrate P (object) below the first member 21K. The second member 22K is disposed at at least a portion of the surrounding of the optical path K. The second member 22 is movable with respect to the first member 21.

The first member 21K is disposed at a position further away from the substrate P (object) than the second member 22K. At least a portion of the second member 22K is disposed between the first member 21K and the substrate P (object). At least a portion of the second member 22K is disposed between the terminal optical element 13 and the substrate P (object). In addition, the second member 22K may not be disposed between the terminal optical element 13 and the substrate P (object).

The first member 21K includes a lower surface 23K facing the −Z direction and a fluid recovery part 24K which is disposed at at least a portion of the surrounding of the lower surface 23K. The second member 22K includes an upper surface 25K facing the +Z direction, a lower surface 26K facing the −Z direction, and a fluid recovery part 27K which is disposed at at least a portion of the surrounding of the lower surface 26K. The fluid recovery part 24K recovers at least a portion of the liquid LQ of the liquid immersion space LS. The fluid recovery part 27K recovers at least a portion of the liquid LQ of the liquid immersion space LS.

The first member 21K includes an inner surface 28K which is opposite to a side surface 131 of the terminal optical element 13, and an outer surface 29K toward the outside with respect to the optical path K (KL) of the exposure light EL. The second member 22K includes an inner surface 30K which is opposite to the outer surface 29K via a gap.

The inner surface 28K of the first member 21K is opposite to the side surface 131 of the terminal optical element 13 via a gap.

The second member 22K is able to be opposite to the lower surface 23K. The second member 22K is able to be opposite to the fluid recovery part 24K. At least a portion of the upper surface 25K of the second member 22K is opposite to the lower surface 23K via a gap. At least a portion of the upper surface 25K is opposite to the emitting surface 12 via a gap. Moreover, the upper surface 25K may not be opposite to the emitting surface 12.

The substrate P (object) is able to be opposite to the lower surface 26K. The substrate P (object) is able to be opposite to at least a portion of the fluid recovery part 27K. At least a portion of the upper surface of the substrate P is opposite to the lower surface 26K via a gap. At least a portion of the upper surface of the substrate P is opposite to the emitting surface 12 via a gap.

In the Z axis direction, the size of the gap between the upper surface of the substrate P (object) and the emitting surface 12 is larger than the size of the gap between the upper surface of the substrate P (object) and the lower surface 26K. Moreover, the size of the gap between the upper surface of the substrate P (object) and the emitting surface 12 may be substantially the same as the size of the gap between the upper surface of the substrate P (object) and the lower surface 26K. In addition, the size of the gap between the upper surface of the substrate P (object) and the emitting surface 12 may be smaller than the size of the gap between the upper surface of the substrate P (object) and the lower surface 26K.

A space SP5 is formed between the lower surface 23K and the upper surface 25K. A space SP6 is formed between the lower surface 26K and the upper surface of the substrate P (object). A space SP7 is formed between the side surface 131 and the inner surface 28K.

The side surface 131 of the terminal optical element 13 is disposed at the surrounding of the emitting surface 12. The side surface 131 is a non-emitting surface from which the exposure light EL is not emitted. The exposure light EL passes through the emitting surface 12 and does not pass through the side surface 131.

The lower surface 23K of the first member 21K does not recover the liquid LQ. The lower surface 23K is a non-recovery part and is not able to recover the liquid LQ. The lower surface 23K of the first member 21K is able to hold the liquid LQ between the lower surface and the second member 22K.

The upper surface 25K of the second member 22K does not recover the liquid LQ. The upper surface 25K is a non-recovery part and is not able to recover the liquid LQ. The upper surface 25K of the second member 22K is able to hold the liquid LQ between the upper surface 25K and the first member 21K.

The lower surface 26K of the second member 22K does not recover the liquid LQ. The lower surface 26K is a non-recovery part and is not able to recover the liquid LQ. The lower surface 26K of the second member 22K is able to hold the liquid LQ between the substrate P (object) and the lower surface 26K.

The inner surface 28K, the outer surface 29K, and the inner surface 30K do not recover the liquid LQ. The inner surface 28K, the outer surface 29K, and the inner surface 30K are non-recovery parts and they are not able to recover the liquid LQ.

In the present embodiment, the lower surface 23K is substantially parallel to the XY plane. The upper surface 25K is also substantially parallel to the XY plane. The lower surface 26K is also substantially parallel to the XY plane. That is, the lower surface 23K and the upper surface 25K are substantially parallel to each other. The upper surface 25K and the lower surface 26K are substantially parallel to each other.

Moreover, the lower surface 23K may not be parallel to the XY plane. The lower surface 23K may be inclined with respect to the XY plane and may include a curved surface.

In addition, the upper surface 25K may not be parallel to the XY plane. The upper surface 25K may be inclined with respect to the XY plane and may include a curved surface.

Moreover, the lower surface 26K may not be parallel to the XY plane. The lower surface 26K may be inclined with respect to the XY plane and may include a curved surface.

In addition, the lower surface 23K and the upper surface 25K may be parallel to each other or may not be parallel to each other. The upper surface 25K and the lower surface 26K may be parallel to each other or may not be parallel to each other. The lower surface 23K and the lower surface 26K may be parallel to each other or may not be parallel to each other.

The first member 21K includes an opening 34K through which the exposure light EL emitted from the emitting surface 12 is able to pass. The second member 22 includes an opening 35K through which the exposure light EL emitted from the emitting surface 12 is able to pass. At least a portion of the terminal optical element 13 is disposed inside the opening 34K. The lower surface 23K is disposed at the surrounding of the lower end of the opening 34K. The upper surface 25K is disposed at the surrounding of the upper end of the opening 35K. The lower surface 26K is disposed at the surrounding of the lower end of the opening 35K.

The size of the opening 34K in the XY plane is larger than the size of the opening 35K. With respect to the X axis direction, the size of the opening 34K is larger than the size of the opening 35K. With respect to the Y axis direction, the size of the opening 34K is larger than the size of the opening 35K. In the present embodiment, the first member 21K is not disposed immediately below the emitting surface 12. The opening 34K of the first member 21K is disposed at the surrounding of the emitting surface 12. The opening 34K is larger than the emitting surface 12. The lower end of the gap which is formed between the side surface 131 of the terminal optical element 13 and the first member 21K faces the upper surface 25K of the second member 22K. Moreover, the opening 35K of the second member 22K is disposed to be opposite to the emitting surface 12. In the present embodiment, the shape of the opening 35K in the XY plane is a rectangular shape. The opening 35K is long in the X axis direction. Moreover, the shape of the opening 35K may be an elliptical shape which is long in the X axis direction and may be a polygonal shape which is long in the X axis direction.

In addition, the size of the opening 34K may be smaller than the size of the opening 35K. Moreover, the size of the opening 34K may be substantially the same as the size of the opening 35K.

The first member 21K is disposed at the surrounding of the terminal optical element 13. The first member 21K is an annular member. The first member 21K is disposed so as not to contact the terminal optical element 13. A gap is formed between the first member 21K and the terminal optical element 13K. The first member 21K does not face the emitting surface 12. Moreover, a portion of the first member 21K may not be opposite to the emitting surface 12. That is, a portion of the first member 21K may be disposed between the emitting surface 12 and the upper surface of the substrate P (object). In addition, the first member 21K may not be annular. For example, the first member 21K may be disposed at a portion of the surrounding of the terminal optical element 13 (optical path K). For example, a plurality of the first members 21K may be disposed at the surrounding of the terminal optical element 13 (optical path K).

The second member 22K is disposed at the surrounding of the optical path K. The second member 22K is an annular member. The second member 22K is disposed so as not to contact the first member 21K. A gap is formed between the second member 22K and the first member 21K.

The second member 22K is movable with respect to the first member 21K. The second member 22K is movable with respect to the terminal optical element 13. A relative position between the first member 21K and the second member 22K is changed. The relative position between the second member 22K and the terminal optical element 13 is changed.

The second member 22K is movable in the XY plane perpendicular to the optical axis of the terminal optical element 13. The second member 22K is movable to be substantially parallel to the XY plane. In the present embodiment, the second member 22K is movable in at least the X axis direction. Moreover, the second member 22K may move in at least one direction of the Y axis, Z axis, θX, θY, and θZ directions, in addition to the X axis direction.

In the present embodiment, the terminal optical element 13 does not substantially move. The first member 21K also does not substantially move.

The second member 22K is movable below at least a portion of the first member 21K. The second member 22K is movable between the first member 21K and the substrate P (object).

The second member 22K moves in the XY plane, and thus, the size of the gap between the outer surface 29K of the first member 21K and the inner surface 30K of the second member 22K is changed. In other words, the second member 22K moves in the XY plane, and thus, the size of the space between the outer surface 29K and the inner surface 30K is changed. For example, according to the movement of the second member 22K in the −X axis direction, the size of the gap between the outer surface 29K and the inner surface 30K is decreased (the space between the outer surface 29K and the inner surface 30K is decreased) at the +X side with respect to the terminal optical element 13. According to the movement of the second member 22K in the +X axis direction, the size of the gap between the outer surface 29K and the inner surface 30K is increased (the space between the outer surface 29K and the inner surface 30K is increased) at the +X side with respect to the terminal optical element 13.

In the present embodiment, a movable range of the second member 22K is determined so that the first member 21K (outer surface 29K) and the second member 22K (inner surface 30K) do not contact each other.

The liquid immersion member 5K includes a liquid supply part 31K which supplies the liquid LQ to form the liquid immersion space LS. The liquid supply part 31K is disposed at the first member 21K.

Moreover, the liquid supply part 31K may be disposed at both of the first member 21K and the second member 22K. In addition, the liquid supply part 31K may be disposed at the first member 21K and may not be disposed at the second member 22K. In addition, the liquid supply part 31K may be disposed at the second member 22K and may not be disposed at the first member 21K. Moreover, the liquid supply part 31K may be disposed at members other than the first member 21K and the second member 22K.

The liquid supply part 31K is disposed inside the fluid recovery part 24K and the fluid recovery part 27K in the radial direction with respect to the optical path K (the optical axis of the terminal optical element 13). In the present embodiment, the liquid supply part 31K includes an opening (liquid supply port) which is disposed at the inner surface 28K of the first member 21K. The liquid supply part 31K is disposed to be opposite to the side surface 131. The liquid supply part 31K supplies the liquid LQ to the space SP7 between the side surface 131 and the inner surface 28K. In the present embodiment, the liquid supply part 31K is disposed at each of the +X side and the −X side with respect to the optical path K (terminal optical element 13).

Moreover, the liquid supply part 31K may be disposed at the Y axis direction with respect to the optical path K (terminal optical element 13), and the plurality of liquid supply parts may be disposed at the surrounding of the optical path K (terminal optical element 13) which includes the X axis direction and the Y axis direction. One liquid supply part 31K may be provided. In addition, instead of the liquid supply part 31K or in addition to the liquid supply part 31K, a liquid supply part which is able to supply the liquid LQ may be provided at the lower surface 23K.

In the present embodiment, the liquid supply part (liquid supply port) 31K is connected to a liquid supply apparatus 31SK via a supply channel 31RK which is formed in the inner portion of the first member 21K. The liquid supply apparatus 31SK is able to supply the cleaned liquid LQ, in which the temperature is adjusted, to the liquid supply part 31K. In order to form the liquid immersion space LS, the liquid supply part 31K supplies the liquid LQ from the liquid supply apparatus 31SK.

An opening 40K is formed between the inner edge of the lower surface 23K and the upper surface 25K. The optical path space SPK which includes the optical path K between the emitting surface 12 and the substrate P (object), and the space SPK5 between the lower surface 23K and the upper surface 25K are connected to each other via the opening 40K. In the present embodiment, the optical path space SPK includes the space between the emitting surface 12 and the substrate P (object) and the space between the emitting surface 12 and the upper surface 25K. The opening 40K is disposed so as to face the optical path K. The space SP7 between the side surface 131 and the inner surface 28K, and the space SP5 are connected to each other via the opening 40K.

At least a portion of the liquid LQ from the liquid supply part 31K is supplied to the space SP5 between the lower surface 23K and the upper surface 25K via the opening 40K. At least a portion of the liquid LQ, which is supplied from the liquid supply part 31K to form the liquid immersion space LS, is supplied to the substrate P (object) opposite to the emitting surface 12 via the opening 34K and the opening 35K. Accordingly, the optical path K is filled with the liquid LQ. At least a portion of the liquid LQ from the liquid supply part 31K is supplied to the space SP6 between the lower surface 26K and the upper surface of the substrate P (object).

The fluid recovery part 24K is disposed outside the lower surface 23K with respect to the optical path K (with respect to an optical axis of the terminal optical element 13). The fluid recovery part 24K is disposed at the surrounding of the lower surface 23K. The fluid recovery part 24K is disposed at the surrounding of the optical path K of the exposure light EL. Moreover, the fluid recovery part 24K may be disposed at a portion of the surrounding of the lower surface 23K. For example, a plurality of the fluid recovery parts 24K may be disposed at the surrounding of the lower surface 23K. The fluid recovery part 24K is disposed to face the space SP5. The fluid recovery part 24K recovers the liquid LQ from the space SP5.

The fluid recovery part 27K is disposed outside the lower surface 26K with respect to the optical path K (with respect to the optical axis of the terminal optical element 13). The fluid recovery part 27K is disposed at the surrounding of the lower surface 26K. The fluid recovery part 27K is disposed at the surrounding of the optical path K of the exposure light EL. Moreover, the fluid recovery part 27K may be disposed at a portion of the surrounding of the lower surface 26K. For example, a plurality of the fluid recovery parts 27K may be disposed at the surrounding of the lower surface 26K. The fluid recovery part 27K is disposed to face the space SP6. The fluid recovery part 27K recovers the liquid LQ from the space SP6.

The fluid recovery part 27K is disposed outside the first member 21K with respect to the optical path K (the optical axis of the terminal optical element 13). The fluid recovery part 27K is disposed outside the space SP5 with respect to the optical path K (the optical axis of the terminal optical element 13).

In the present embodiment, movement of the liquid LQ from one of the space SP5 at the upper surface 25 side and the space SP6 at the lower surface 26 side to the other is suppressed. The space SP5 and the second space SP6 are partitioned by the second member 22K. The liquid LQ in the space SP5 is able to move to the space SP6 via the opening 35K. The liquid LQ in the space SP5 is not able to move to the space SP6 without going through the opening 35K. The liquid LQ, which exists in the space SP5 outside than the opening 35K with respect to the optical path K, is not able to move to the space SP6. The liquid LQ in the space SP6 is able to move to the space SP5 via the opening 35K. The liquid LQ in the space SP6 is not able to move to the space SP5 without going through the opening 35K. The liquid LQ, which exists in the space SP6 outside than the opening 35K with respect to the optical path K, is not able to move to the space SP5. That is, in the present embodiment, the liquid immersion member 5K does not have a channel which fluidly connects the space SP5 and the space SP6, other than the opening 35K.

In the present embodiment, the fluid recovery part 27K recovers the liquid LQ from the space SP6 and does not recover the liquid LQ in the space SP5. The fluid recovery part 24K recovers the liquid LQ from the space SP5 and does not recover the liquid LQ in the space SP6.

Moreover, the liquid LQ, which has moved to the outside (outside the outer surface 29K) of the space SP5 with respect to the optical path K, is prevented from moving to the substrate P (the space SP5) due to the inner surface 30K.

The fluid recovery part 24 includes an opening (fluid recovery port) which is disposed at at least a portion of the surrounding of the lower surface 23K of the first member 21K. The fluid recovery part 24K is disposed to be opposite to the upper surface 25K. The fluid recovery part 24K is connected to a liquid recovery apparatus 24CK via a recovery channel (space) 24RK which is formed in the inner portion of the first member 21K. The liquid recovery apparatus 24CK is able to connect the fluid recovery part 24K and a vacuum system. The fluid recovery part 24K is able to recover the liquid L from the space SP5. At least a portion of the liquid LQ in the space SP5 is able to flow into the recovery channel 24RK via the fluid recovery part 24K.

In the present embodiment, the fluid recovery part 24 includes a porous member, and the fluid recovery port includes holes of the porous member. In the present embodiment, the porous member includes a mesh plate. The fluid recovery part 24 recovers the liquid LQ via the holes of the porous member. The liquid LQ in the space SP5 recovered from the fluid recovery part 24K (holes of the porous member) flows into the recovery channel 24R, flows through the recovery channel 24RK, and is recovered by the liquid recovery apparatus 24CK.

The fluid recovery part 27K includes an opening (fluid recovery port) which is disposed at at least a portion of the surrounding of the lower surface 26K of the second member 22K. The fluid recovery part 27K is disposed to be opposite to the upper surface of the substrate P (object). The fluid recovery part 27K is connected to a liquid recovery apparatus 27CK via a recovery channel (space) 27RK which is formed in the inner portion of the second member 22K. The liquid recovery apparatus 27CK is able to connect the fluid recovery part 27K and the vacuum system. The fluid recovery part 27K is able to recover at least a portion of the liquid LQ in the second space SP6. At least a portion of the liquid LQ in the second space SP6 is able to flow into the recovery channel 27RK via the fluid recovery part 27K.

In the present embodiment, the fluid recovery part 27K includes a porous member, and the fluid recovery port includes holes of the porous member. In the present embodiment, the porous member includes a mesh plate. The liquid recovery part 27K recovers the fluid (one or both of the liquid LQ and the gas) via the holes of the porous member. The liquid LQ in the space SP6 recovered from the fluid recovery part 27K (holes of the porous member) flows into the recovery channel 27RK, flows through the recovery channel 27KR, and is recovered by the liquid recovery apparatus 27CK.

The recovery channel 27RK is disposed outside the inner surface 30K with respect to the optical path K (the optical axis of the terminal optical element 13). The recovery channel 27RK is disposed above the liquid recovery part 27K. According to the movement of the second member 22K, the fluid recovery part 27K and the recovery channel 27RK of the second member 22K move outside of the outer surface 29K of the first member 21K.

The gas is recovered via the fluid recovery part 27K along with the liquid LQ. In addition, the porous member may not be provided at the second member 22K. That is, the fluid (one or both of liquid LQ and gas) in the space SP6 may be recovered without going through the porous member.

In the present embodiment, since the recovery operation of the liquid LQ from the fluid recovery part 27K is performed in parallel with the supply operation of the liquid LQ from the liquid supply part 31K, the liquid immersion space LS is formed between the terminal optical element 13 and the liquid immersion member 5K at one side and the substrate P (object) at the another side, by the liquid LQ.

Moreover, in the present embodiment, the recovery operation of the fluid from the fluid recovery part 24K is performed in parallel with the supply operation of the liquid LQ from the liquid supply part 31K and the recovery operation of the fluid from the fluid recovery part 27K.

In present embodiment, the interface LG5 of the liquid LQ in the liquid immersion space LS is formed between the first member 21K and the second member 22K. The interface LG6 of the liquid LQ in the liquid immersion space LS is formed between the second member 22K and the substrate P (object). The interface LG7 of the liquid LQ in the liquid immersion space LS is formed between the terminal optical element 13 and the first member 21.

In the present embodiment, the second member 22K includes a gas supply part 61K which supplies the gas G to at least a portion of the surrounding of the liquid immersion space LS. The substrate P (object) is able to be opposite to the gas supply part 61K. The gas supply part 61K is disposed to be opposite to the substrate P (object). The gas supply part 61K is disposed outside the fluid recovery part 27K with respect to the optical path K (the center of the opening 35). The gas supply part 61K is disposed at at least a portion of the surrounding of the fluid recovery part 27K. A plurality of the fluid recovery parts 27K are provided at the second member 22K, and includes openings (gas supply ports) which are able to supply the gas G. As shown in FIG. 26, in the present embodiment, a plurality of the gas supply parts 61K are disposed to surround the optical path K (the center of the opening 35K) outside of the fluid recovery part 27K with respect to the optical path K (the center of the opening 35K).

The gas supply part 61K is connected to a gas supply apparatus 61SK via a supply channel 61RK (space) which is formed in the inner portion of the second member 22K. The gas supply apparatus 61SK is able to supply the cleaned gas G in which the temperature is adjusted. In addition, the gas supply apparatus 61SK includes a humidity adjustment apparatus which is able to adjust humidity of the supplied gas G, and thus, is able to supply the humidified gas G. The gas G discharged from the gas supply apparatus 61SK is supplied to the gas supply part 61K via the supply channel 61RK. The gas supply part 61K supplies the gas G from the gas supply apparatus 61SK to at least a portion of the surrounding of the liquid immersion space LS. In the present embodiment, the gas supply part 61K supplies the gas G to at least a portion of the surrounding of the interface LG6 of the liquid LQ.

Next, an example of the operation of the liquid immersion member 5K according to the present embodiment will be described. Similar to the above-described embodiments, in the state where the liquid immersion space LS is formed, one or both of the second member 22 and the substrate P (object) are moved. The gas G is supplied from the gas supply part 61K in at least a part of the period in which one or both of the second member 22 and the substrate P (object) are moved.

The gas supply part 61K supplies the gas G so that the liquid LQ is suppressed from flowing out from the space SP6 between the liquid immersion member 5K and the substrate P (object) in the state where the liquid immersion space LS is formed.

Figure 27:
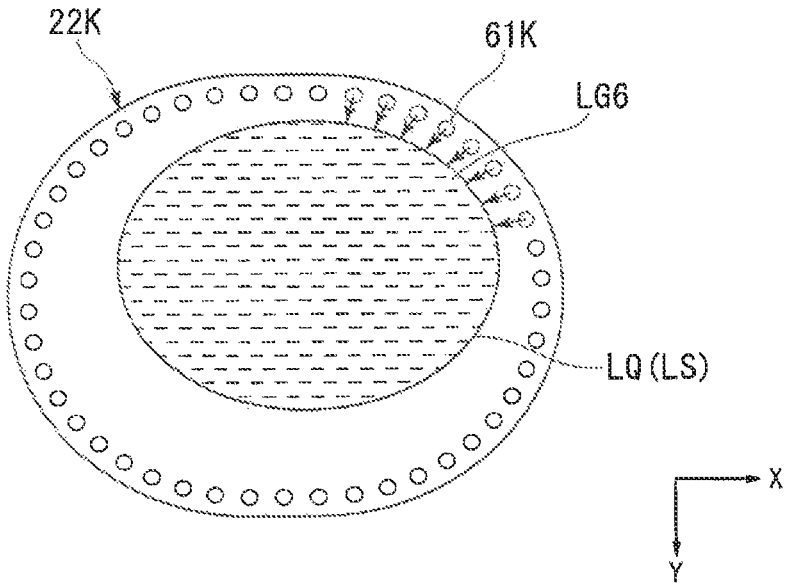
FIG. 27 is a view for explaining an example of an operation of the liquid immersion member according to the eleventh embodiment.
Figure 27:
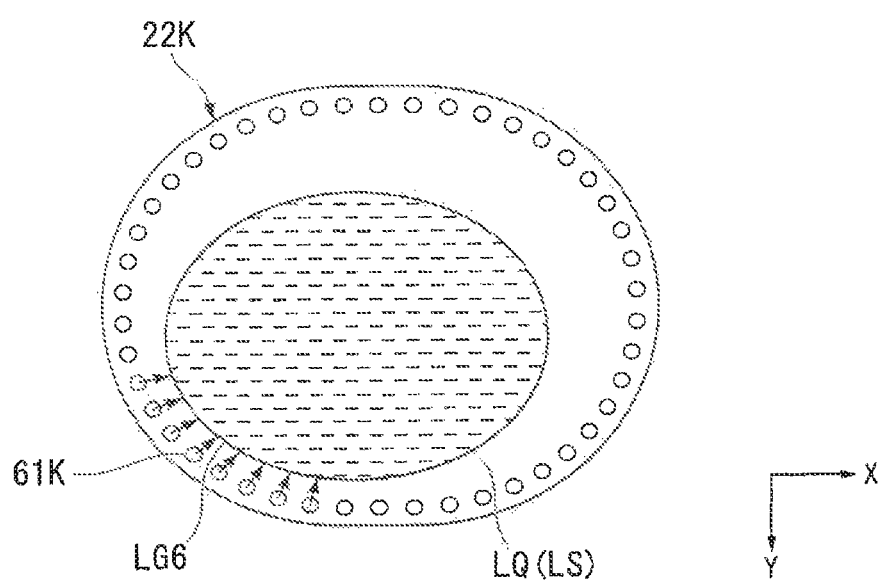

FIG. 27 is a schematic view showing an example of a gas supply operation of the gas supply part 61K. FIG. 27 is a view of the second member 22K as seen from the lower surface side. In the present embodiment, a gas supply condition from the gas supply part 61K is determined based on one or both of the movement condition of the second member 22K and the movement condition of the substrate P (object).

For example, when the second member 22K moves in the +Y axis direction while moving the −X axis direction in the state where the substrate P is stopped, as shown in FIG. 27(A), the liquid immersion space LS moves to the +X side and the −Y side with respect to the center of the second member 22K in the XY plane. That is, the second member 22K and the liquid immersion space LS relatively move so that the interface LG6 of the liquid LQ approaches the edges at the +X side and the −Y side of the second member 22K. In order words, the second member 22K and the liquid immersion space LS relatively move so that the liquid LQ flows out from the edges at the +X side and the −Y side of the second member 22K. Moreover, for example, when the substrate P (object) moves in the −Y axis direction while moving the +X axis direction in the state where the second member 22 is stopped, as shown in FIG. 27(A), the relative position between the second member 22K and the liquid immersion space LS is changed.

In addition, for example, when the second member 22K moves in the −Y axis direction while moving the +X axis direction in the state where the substrate P stops, as shown in FIG. 27(B), the liquid immersion space LS moves to the −X side and the +Y side with respect to the center of the second member 22K in the XY plane. That is, the second member 22K and the liquid immersion space LS relatively move so that the interface LG6 of the liquid LQ approaches the edges at the −X side and the +Y side of the second member 22K. In order words, the second member 22K and the liquid immersion space LS relatively move so that the liquid LQ flows out from the edges of the −X side and the +Y side of the second member 22K. Moreover, for example, when the substrate P (object) moves in the +Y axis direction while moving the −X axis direction in the state where the second member 22 is stopped, as shown in FIG. 27(B), the relative position between the second member 22K and the liquid immersion space LS is changed.

That is, based on the movement direction of the second member 22K in the XY plane, at least one of the flowing-out position and the flowing-out direction of the liquid LQ from the space SP6 between the liquid immersion member 5K and the substrate P (object) is changed. Moreover, based on the movement direction of the substrate P (object) in the XY plane, at least one of the flowing-out position and the flowing-out direction of the liquid LQ from the space SP6 between the liquid immersion member 5K and the substrate P (object) is changed.

In addition, based on the movement locus of the second member 22K in the XY plane, at least one of the flowing-out position and the flowing-out direction of the liquid LQ from the space SP6 between the liquid immersion member 5K and the substrate P (object) is changed. Moreover, based on the movement locus of the substrate P (object) in the XY plane, at least one of the flowing-out position and the flowing-out direction of the liquid LQ from the space SP6 between the liquid immersion member 5K and the substrate P (object) is changed.

In addition, based on the movement speed or the acceleration of the second member 22K in the XY plane, at least one of the flowing-out position, the flowing-out direction, and the flowing-out amount of the liquid LQ from the space SP6 between the liquid immersion member 5K and the substrate P (object) is changed. Moreover, based on the movement speed or the acceleration of the substrate P (object) in the XY plane, at least one of the flowing-out position, the flowing-out direction, and the flowing-out amount of the liquid LQ from the space SP6 between the liquid immersion member 5K and the substrate P (object) is changed.

That is, based on one or both of the movement condition of the second member 22K and the movement condition of the substrate P (object), at least one of the flowing-out position, the flowing-out direction, and the flowing-out amount of the liquid LQ from the space SP6 between the liquid immersion member 5K and the substrate P (object) is determined. The movement condition of the second member 22K includes at least one of the movement speed, the acceleration, the movement direction, and the movement locus of the second member 22K. The movement condition of the substrate P (object) includes at least one of the movement speed, the acceleration, the movement direction, and the movement locus of the substrate P (object).

Accordingly, the controller 6 is able to presume (estimate) at least one of the flowing-out position, the flowing-out direction, and the flowing-out amount of the liquid LQ from the space SP6 between the liquid immersion member 5K and the substrate P (object) based on one or both of the movement condition of the second member 2K and the movement condition of the substrate P (object).

The movement condition of the second member 2K and the movement condition of the substrate P (object) are defined by the exposure recipe (exposure control information). That is, the movement condition of the second member 2K and the movement condition of the substrate P (object) are known information. Therefore, the controller 6 is able to presume (estimate) at least one of the flowing-out position, the flowing-out direction, and the flowing-out amount of the liquid LQ from the space SP6 between the liquid immersion member 5K and the substrate P (object) based on one or both of the movement condition of the second member 2K and the movement condition of the substrate P (object) which are the known information.

For example, based on one or both of the movement condition of the second member 2K and the movement condition of the substrate P (object), at least one of the flowing-out position, the flowing-out direction, and the flowing-out amount of the liquid LQ is able to be obtained by simulation, or by experiment. That is, a relationship between one or both of the movement condition of the second member 2K and the movement condition of the substrate P (object) and at least one of the flowing-out position, the flowing-out direction, and the flowing-out amount of the liquid LQ is able to be obtained in advance by simulation or experiment. The information is stored in the storage apparatus 7. Based on the information of the storage apparatus 7, and one or both of the movement condition of the second member 2K and the movement condition of the substrate P (object) which are determined by the exposure recipe, the controller 6 is able to obtain (presume) at least one of the flowing-out position, the flowing-out direction, and the flowing-out amount of the liquid LQ from the space SP6.

Based on information related to at least one of the flowing-out position, the flowing-out direction, and the flowing-out amount of the liquid LQ from the space SP6 between the liquid immersion member 5 and the substrate P (object) which are presumed by one or both of the movement condition of the second member 22 and the movement condition of the substrate P (object), the controller 6 determines the gas supply condition of the gas supply part 61K.

For example, as shown in FIG. 27(A), when one or both of the second member 22K and the substrate P (object) move so that the liquid LQ flows out from edges at the +X side and the −Y side of the second member 22K, the controller 6 determines the gas supply condition of each of the plurality of gas supply parts 61K so that the liquid LQ is suppressed from flowing out. In the example shown in FIG. 27(A), the gas G is supplied from the gas supply parts 61K which are disposed at the edges at the +X side and the −Y side of the second member 22K among the plurality of gas supply parts 61K. In addition, as shown in FIG. 27(B), when one or both of the second member 22K and the substrate P (object) move so that the liquid LQ flows out from the edges at the −X side and +Y side of the second member 22K, the controller 6 supplies the gas G from the gas supply parts 61K disposed at the edges at the −X side and the +Y side of the second member 22K among the plurality of gas supply parts 61K so that the liquid LQ is prevented from flowing out.

In addition, the controller 6 may determine at least one of the supply direction, the supply range, the flow rate of the supplied gas G, and the presence or the absence of the gas supply from the gas supply part 61K, as the gas supply condition of the gas supply part 61K so that the flowing-out of the liquid LQ is suppressed.

In addition, a gas supply member, in which the gas supply part 61K is provided, may be disposed at a member different from the liquid immersion member 5K (second member 22K). The gas supply member may move based on the movement condition of the second member 22K so that the gas supply member does not contact the second member 22K. The controller 6 may determine the position of the gas supply part 61K (gas supply member) so that the liquid LQ is prevented from flowing out, based on one or both of the movement condition of the second member 22K and the movement condition of the substrate P (object).

As described above, also in the present embodiment, the liquid LQ is able to be prevented from flowing out. Accordingly, occurrence of exposure failure and occurrence of a defective device are able to be prevented.

Figure 28:
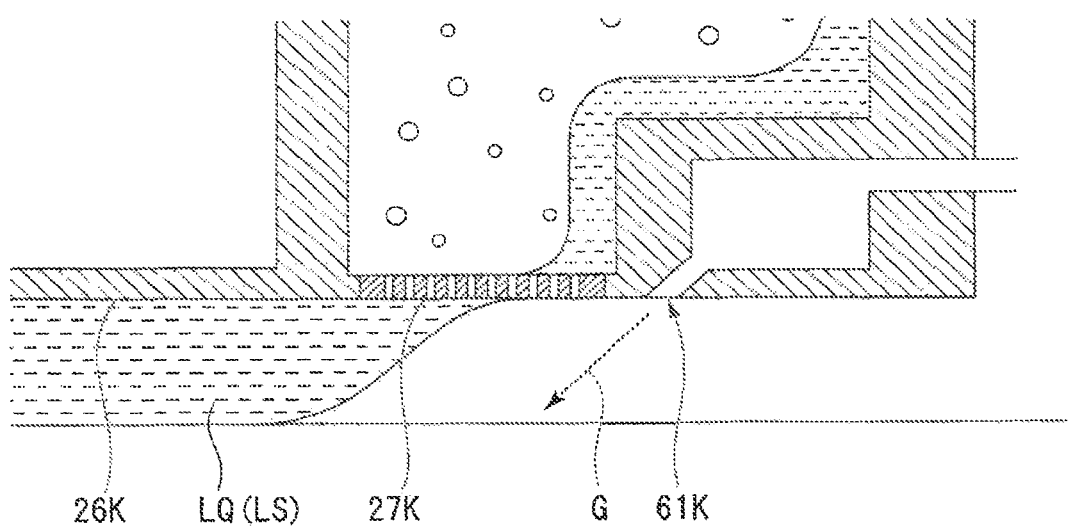
FIG. 28 is a side cross-sectional view showing a portion of the liquid immersion member according to the eleventh embodiment.

Moreover, in the present embodiment, as shown in FIG. 28, the lower surface 26K and the fluid recovery part 27K may be disposed at substantially the same plane.

Figure 29:
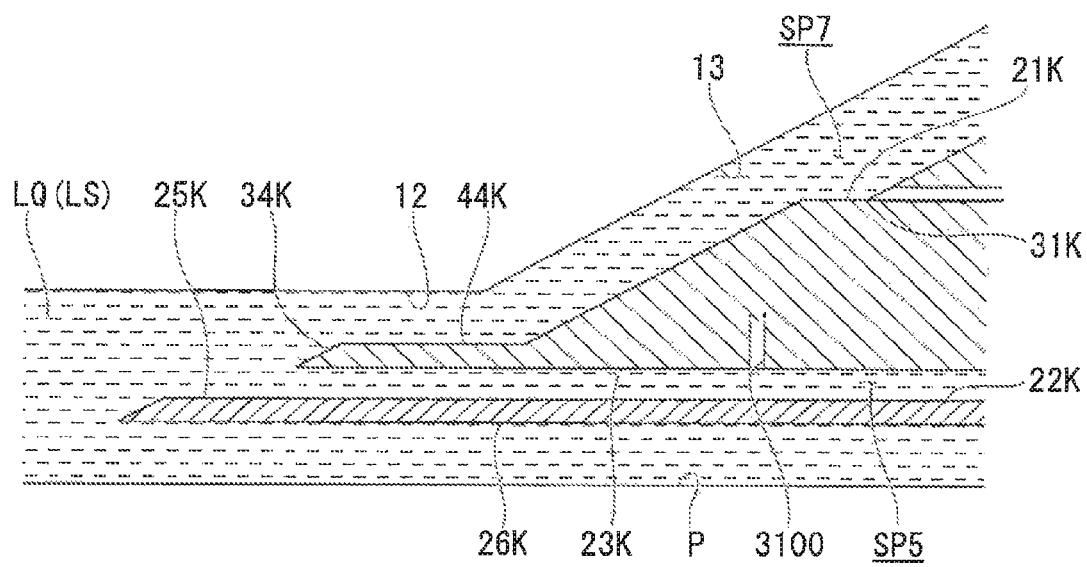
FIG. 29 is a side cross-sectional view showing a portion of the liquid immersion member according to the eleventh embodiment.

In addition, in the above-described eleventh embodiment, as shown in FIG. 29, at least a portion of the first member 21K may be opposite to the emitting surface 12 of the terminal optical element 13. That is, a portion of the first member 21K may be disposed between the emitting surface 12 and the upper surface of the substrate P (object).

In the example shown in FIG. 29, the first member 21K includes an upper surface 44K which is disposed at the surrounding of the opening 34K. The upper surface 44K is disposed at the surrounding of the upper end of the opening 34K. Moreover, in the example shown in FIG. 29, a portion of the upper surface 25K of the second member 22K also is opposite to the emitting surface 12.

In addition, in each of the above-described embodiments, as shown in FIG. 29, a liquid supply part (liquid supply port) 3100 may be provided to face the space SP5. In the example shown in FIG. 29, in the liquid supply part 3100, the lower surface 23K of the first member 21K is disposed to face the space SP5. Moreover, the liquid supply part 3100 may be disposed at the upper surface 25K of the second member 22K to face the space SP5.

For example, the liquid LQ is supplied from the liquid supply part 3100, and thus, even when the liquid LQ which is supplied from the liquid supply part 31K facing the space SP7 does not flow in the space SP5, the space SP5 is filled with the liquid LQ.

Figure 30:
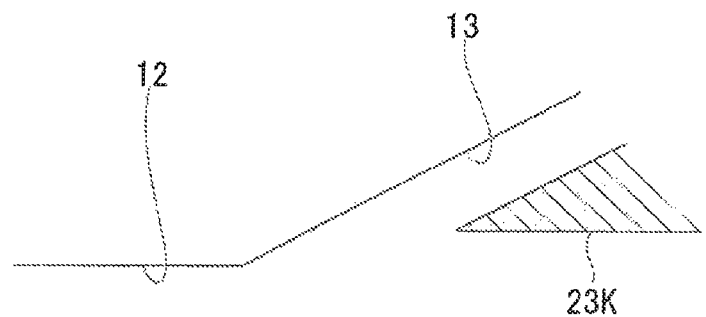
FIG. 30 is a side cross-sectional view showing a portion of the liquid immersion member according to the eleventh embodiment.

In addition, in above-described eleventh embodiment, the second member 22K may not be opposite to the emitting surface 12. That is, the second member 22K may not be disposed between the emitting surface 12 and the upper surface of the substrate P (object). For example, as shown in FIG. 30, the lower surface 23K of the first member 21K may be disposed at more +Z side than the emitting surface 12. In addition, the position (height) of the lower surface 23K of the first member 21K with respect to the Z axis direction may be substantially the same as the position (height) of the emitting surface 12. The lower surface 23K of the first member 21K may be disposed at more −Z side than the emitting surface 12K.

Moreover, in each of the above-described embodiments, the size of the gap between the upper surface of the substrate P (object) and the emitting surface 12 may be substantially the same as the size of the gap between the upper surface of the substrate P and the lower surface of the second member (22 or the like).

Moreover, in each of the above-described embodiments, the size of the gap between the upper surface of the substrate P (object) and the emitting surface 12 may be smaller than the size of the gap between the upper surface of the substrate P and the lower surface of the second member (22 or the like).

In addition, in each of the above-described embodiments, a suction port, which sucks at least one of the liquid LQ and the gas from the space between the first member (21 or the like) and the terminal optical element 13, may be provided at the first member 21.

In addition, in each of the above-described embodiments, the first member (21 or the like) may not have an annular shape. For example, the first member 21 may be disposed at a portion of the surrounding of the terminal optical element 13 (optical path K). For example, the plurality of first members 21 may be disposed at the surrounding of the terminal optical element 13 (optical path K).

Moreover, in each of the above-described embodiments, the controller 6 includes a computer system which includes a CPU or the like. In addition, the controller 6 includes an interface which is able to perform communication with a computer system and an external apparatus. For example, the storage apparatus 7 includes a memory such as a RAM, a hard disk, and a recording medium such as a CD-ROM. In the storage apparatus 7, an operating system (OS) which controls the computer system is installed and a program used to control the exposure apparatus EX is stored.

Moreover, an input apparatus which is able to input signals may be connected to the controller 6. The input apparatus includes input equipment such as a keyboard or a mouse, a communication apparatus or the like which is able to input data from the external apparatus, and the like. Moreover, a display apparatus such as a liquid crystal display may be also provided.

The controller (computer system) 6 is able to read various information which includes the programs which are recorded in the storage apparatus 7. Programs are recorded in the storage apparatus 7, and the programs make the controller 6 perform the control of the liquid immersion exposure apparatus which exposes the substrate by the exposure light via the liquid filled in the optical path of the exposure light between the emitting surface of the optical member from which the exposure light is emitted and the substrate.

Moreover, according to the above-described embodiments, the programs which are recorded in the storage apparatus 7 may make the controller 6 perform: forming a liquid immersion space of the liquid on a surface of the substrate by using a liquid immersion member that includes a first member and a second member, the first member including a first part disposed at surrounding of an optical path of the exposure light, a first opening part, through which the exposure light is able to pass, and a first liquid supply part being provided at the first part of the first member, the first liquid supply part being disposed at at least surrounding of the first opening part and being capable of opposing the surface of the substrate, the second member including a first liquid recovery part which is capable of opposing the surface of the substrate and being movable with respect to the first member outside the first part with respect to the optical path; exposing the substrate by the exposure light emitted from the emitting surface via the liquid of the liquid immersion space; and moving the second member with respect to the first member in at least a portion of exposure of the substrate.

Moreover, according to the above-described embodiments, the programs which are recorded in the storage apparatus 7 may make the controller 6 perform: forming a liquid immersion space of the liquid on a surface of the substrate by using a liquid immersion member that includes a first member and a second member, the first member including a first part disposed at surrounding of an optical path of exposure light, a first opening part, through which the exposure light is able to pass, being provided at the first part of the first member, the second member including a first liquid recovery part and a first gas supply part and being movable with respect to the first member outside the first part with respect to the optical path, the first liquid recovery part being capable of opposing the surface of the object, the first gas supply part being disposed outside the first liquid recovery part in a radial direction with respect to an optical axis of an optical member and being capable of opposing the surface of the object; exposing the substrate by the exposure light emitted from the emitting surface via the liquid of the liquid immersion space; and moving the second member with respect to the first member in at least a portion of exposure of the substrate.

Moreover, according to the above-described embodiments, the programs which are recorded in the storage apparatus 7 may make the controller 6 perform: forming a liquid immersion space of the liquid on a surface of the substrate by using a liquid immersion member that includes a first member and a second member, the first member including a first part disposed at surrounding of an optical path of the exposure light, a first opening part, through which the exposure light is able to pass, being provided at the first part of the first member, the second member including a first liquid recovery part and a second liquid supply part and being movable with respect to the first member outside the first part with respect to the optical path, the first liquid recovery part being capable of opposing the surface of the object, the second liquid supply part being disposed between the optical path and the first liquid recovery part in a radial direction with respect to an optical axis of the optical member and being capable of opposing the surface of the object; exposing the substrate by the exposure light emitted from the emitting surface via the liquid of the liquid immersion space; and moving the second member with respect to the first member in at least a portion of exposure of the substrate.

In addition, according to the above-described embodiments, the programs which are recorded in the storage apparatus 7 may make the controller 6 perform: forming a liquid immersion space of the liquid on a surface of the substrate by using a liquid immersion member that includes a first member, a second member, and a second liquid recovery part, the first member including a first part disposed at surrounding of an optical path of the exposure light, a first opening part, through which the exposure light is able to pass, being provided at the first part of the first member, the second member including a first liquid recovery part and being movable with respect to the first member outside the first part with respect to the optical path, the first liquid recovery part being capable of opposing a surface of the object, the second liquid recovery part being disposed at the first member and being capable of recovering at least a portion of liquid which has flowed in a gap between the first member and the second member from above the object; exposing the substrate by the exposure light emitted from the emitting surface via the liquid of the liquid immersion space; and moving the second member with respect to the first member in at least a portion of exposure of the substrate.

Moreover, according to the above-described embodiments, the programs which are recorded in the storage apparatus 7 may make the controller 6 perform: forming a liquid immersion space of the liquid on a surface of a substrate by using a liquid immersion member that includes a first member, a second member, and a second liquid recovery part, wherein a gap between the first member and the second member includes a first gap part having a first size, and a second gap part which is disposed outside the first gap part with respect to the optical axis of the optical member and has a second size smaller than the first size, and the second liquid recovery part is capable of recovering liquid from the first gap part, the first member including a first part disposed at surrounding of an optical path of the exposure light, a first opening part, through which the exposure light is able to pass, being provided at the first part of the first member, the second member including a first liquid recovery part which is capable of opposing a surface of the object and being movable with respect to the first member outside the first part with respect to the optical path, the second liquid recovery part being capable of recovering at least a portion of liquid which has flowed in the gap between the first member and the second member from above the object; exposing the substrate by the exposure light emitted from the emitting surface via the liquid of the liquid immersion space; and moving the second member with respect to the first member in at least a portion of exposure of the substrate.

Moreover, according to the above-described embodiments, the programs which are recorded in the storage apparatus 7 may make the controller 6 perform: forming a liquid immersion space of the liquid on a substrate which is movable below the optical member by using a first liquid immersion member that includes a first member and a second member. the first member being disposed at at least a portion of surrounding of an optical path of the exposure light, the second member being disposed so that at least a portion of the second member is capable of opposing the object below the first member and being movable with respect to the first member; exposing the substrate by the exposure light emitted from the emitting surface via the liquid of the liquid immersion space; moving the second member with respect to the first member in at least a portion of the exposure of the substrate; and supplying gas from a gas supply part to at least a portion of surrounding of the liquid immersion space.

The programs which are stored in the storage apparatus 7 are read by the controller 6, and thus, various apparatuses of the exposure apparatus EX such as the substrate stage 2, the measurement stage 3, and the liquid immersion member 5 cooperate with one another and perform various processing such as the liquid immersion exposure of the substrate P in the state where the liquid immersion space LS is formed.

Moreover, in each of the above-described embodiments, the optical path K on the emitting surface 12 side (image surface side) of the terminal optical element 13 of the projection optical system PL is filled with the liquid LQ. However, for example, the projection optical system PL may be the projection optical system in which the optical path of the incident side (object surface side) at the terminal optical element 13 is also filled with the liquid LQ as disclosed in PCT International Publication No. WO 2004/019128.

In addition, in each of the above-described embodiments, the liquid LQ is water. However, the liquid may be liquid other than the water. Preferably, the liquid LQ is transparent with respect to the exposure light EL, has a high refractive index with respect to the exposure light EL, and is stable with respect to the projection optical system PL or the film of a photosensitive material (photoresist) which forms the surface of the substrate P or the like. For example, the liquid LQ may be fluorinated liquid such as hydrofluoroether (HFE), perfluorinated polyether (PFPE), and Fomblin® oil. Moreover, the liquid LQ may be various fluids, for example, supercritical liquid.

Moreover, in each of the above-described embodiment, the substrate P includes a semiconductor wafer used to manufacture a semiconductor device. However, for example, the substrate P include a glass substrate for a display device, a ceramic wafer for a thin film magnetic head, a mask or an original plate (synthetic quartz, silicon wafer) of a reticle which is used in an exposure apparatus, or the like.

Moreover, in each of the above-described embodiments, the exposure apparatus EX is a scanning type exposure apparatus (scanning stepper) of a step-and-scan system in which the mask M and the substrate P synchronously move and the patterns of the mask M are scanned and exposed. However, for example, the exposure apparatus EX may be a projection exposure apparatus (stepper) of a step-and-repeat system in which patterns of the mask M are collectively exposed in a state where the mask M and the substrate P are stationary and the substrate P is sequentially step-moved.

In addition, the exposure apparatus EX may be an exposure apparatus (a collective exposure apparatus of a stitch system) in which, in the exposure of a step-and-repeat system, after the reduced image of a first pattern is transferred on the substrate P using the projection optical system in a state where the first pattern and the substrate P are substantially stationary, the reduced image of a second pattern is partially overlapped with the first pattern using the projection optical system and is collectively exposed on the substrate P in a state where the second pattern and the substrate P are substantially stationary. Moreover, the exposure apparatus of the stitch system may be an exposure apparatus of a step-and-stitch system in which at least two patterns are partially overlapped on the substrate P and transferred thereto, and the substrate P is sequentially moved.

In addition, for example, the exposure apparatus EX may be an exposure apparatus in which patterns of two masks are combined on the substrate via the projection optical system and one shot region on the substrate is approximately simultaneously double-exposed by single scanning exposure, as disclosed in U.S. Pat. No. 6,611,316. Moreover, the exposure apparatus EX may be an exposure apparatus of a proximity system, a mirror projection aligner, or the like.

Figure 31:
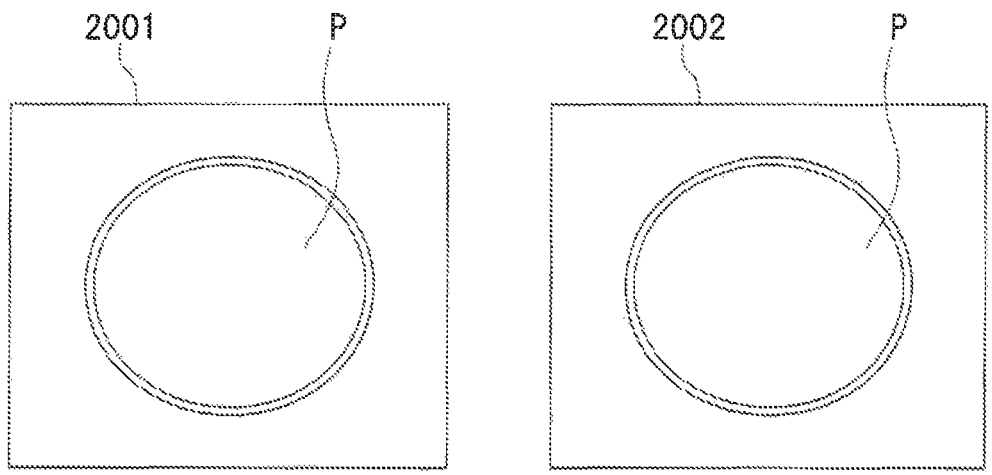
FIG. 31 is a view showing an example of a substrate stage.

In addition, in each of the above-described embodiments, the exposure apparatus EX may be an exposure apparatus of a twin stage type which includes a plurality of substrate stages, as disclosed in U.S. Pat. No. 6,341,007, U.S. Pat. No. 6,208,407, U.S. Pat. No. 6,262,796, or the like. For example, as shown in FIG. 31, when the exposure apparatus EX includes two substrate stages 2001 and 2002, the object which is capable of being disposed so as to be opposite to the emitting surface 12 includes at least one of one substrate stage, a substrate which is held by a first holding part of the one substrate stage, another substrate stage, and a substrate which is held by a first holding part of another substrate stage.

Moreover, the exposure apparatus EX may be an exposure apparatus which includes the plurality of substrate stages and measurement stages.

The exposure apparatus EX may be an exposure apparatus used to manufacture a semiconductor element which exposes a semiconductor element pattern on the substrate P, an exposure apparatus used to manufacture a liquid crystal display element or a display, or an exposure apparatus used to manufacture a thin film magnetic head, an imaging element (CCD), a micromachine, a MEMS, a DNA chip, or a reticle or mask, or the like.

Moreover, in each of the above-described embodiments, the light transmission type mask is used in which a predetermined light shielding pattern (or a phase pattern, a dimming pattern) is formed on the substrate having light transparency. However, instead of this mask, for example, as disclosed in U.S. Pat. No. 6,778,257, a variable molding mask (also referred to as an electronic mask, an active mask, or an image generator) may be used which forms a transparent pattern, a reflective pattern, or a light-emitting pattern based on electronic data of the pattern to be exposed. In addition, instead of the variable molding masks which include a non-light emission type image display element, a pattern-forming apparatus which includes a self light-emission type image display element may be provided.

In each of the above-described embodiments, the exposure apparatus EX includes the projection optical system PL. However, the components in each of the above-described embodiments may be applied to an exposure apparatus and an exposing method which do not use the projection optical system PL. For example, the components in each of the above-described embodiments may be applied to an exposure apparatus and an exposing method in which the liquid immersion space is formed between an optical member such as a lens and the substrate and the exposure light is radiated to the substrate via the optical member.

Moreover, for example, the exposure apparatus EX may be an exposure apparatus (a lithography system) in which interference fringes are formed on the substrate P, and thus, a line-and-space pattern is exposed on the substrate P, as disclosed in PCT International Publication No. WO 2001/035168.

The exposure apparatuses EX of the above-described embodiments are manufactured by assembling various subsystems including each above-described component so as to maintain predetermined mechanical accuracy, electrical accuracy, and optical accuracy. In order to secure the various accuracies, before and after the assembly, adjustment for achieving optical accuracy with respect to various optical systems, adjustment for achieving mechanical accuracy with respect to various mechanical systems, and adjustment for achieving electrical accuracy with respect to various electrical systems are performed. The process of assembling the exposure apparatus from various subsystems includes mechanical connections, wiring connections of electric circuits, piping connections of air-pressure circuits, or the like between various subsystems. Of course, the respective assembly processes of each subsystem are needed before the assembly process from various subsystems to the exposure apparatus. After the assembly process of exposure apparatus by various subsystems is terminated, a general adjustment is performed, and thus, various accuracies in the overall exposure apparatus are secured. Moreover, preferably, the manufacturing of the exposure apparatus is performed in a clean room in which temperature, a degree of cleanness, or the like is controlled.

Figure 32:
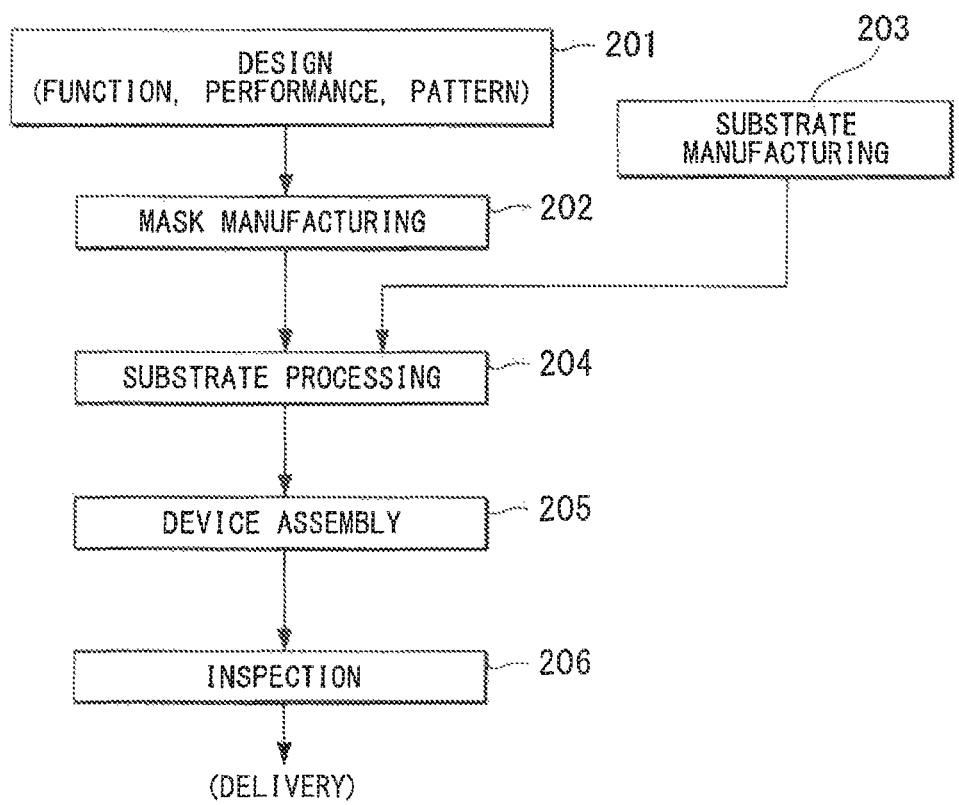
FIG. 32 is a flowchart for explaining an example of a method of manufacturing a device.

As shown in FIG. 32, a micro-device such as a semiconductor device is manufactured through a step 201 in which the function and performance design of the micro-device is performed, a step 202 in which a mask (reticle) is manufactured based on the design step, a step 203 in which a substrate which is a base material of the device is manufactured, a substrate processing step 204 which includes the substrate processing (exposure processing) including exposing the substrate by the exposure light from the pattern of the mask and developing the exposed substrate according to the above-described embodiments, a device assembly step (which includes manufacturing processes such as a dicing process, a bonding process, and a package process) 205, an inspection step 206, or the like.

Moreover, the aspects of each of the above-described embodiments may be appropriately combined. In addition, some components may not be used. Moreover, as long as legally permitted, the disclosures of all publications and United States Patents with respect to the exposure apparatuses or the like cited in each of the above-mentioned embodiments and modifications are incorporated in the disclosures of the present application.

What is claimed is:

1. A liquid immersion exposure apparatus, comprising:
a projection system having an optical member via which exposure light is projected; and
a liquid immersion member which is used for forming a liquid immersion space on a surface of an object opposite to an emitting surface of the optical member, wherein:
the liquid immersion member includes (i) a first member that has a first liquid supply port, and a first opening, through which the exposure light is projected and (ii) a second member that has a first liquid recovery port facing downwardly and that is movable with respect to the first member,
the first member has a second liquid recovery port,
the first liquid supply port faces an outer surface of the optical member and is provided on one side of the optical member, the second liquid recovery port faces the outer surface of the optical member and is provided on the other side of the optical member, and the second member is moved in a direction perpendicular to an optical axis of the optical member so that a relative speed between the second member and the object is smaller than a relative speed between the first member and the object, while recovering liquid in a gap between the second member and the object via the first liquid recovery port of the second member.

2. The apparatus according to claim 1, wherein:
the object includes a substrate to be exposed, and
the liquid immersion space covering a portion of an upper surface of the substrate is formed, while performing a liquid supply via the first liquid supply port and performing a liquid recovery via the first and second liquid recovery ports.

3. The apparatus according to claim 1, wherein:
the second member has a second liquid supply port facing downwardly, and
the liquid immersion space covering a portion of an upper surface of the substrate is formed, while performing a liquid supply via the first and second liquid supply ports and performing a liquid recovery via the first and second liquid recovery ports.

4. The apparatus according to claim 3, wherein:
the second liquid supply port is arranged radially inward of the first liquid recovery port with respect to a path of the exposure light.

5. The apparatus according to claim 1, further comprising a third liquid recovery port via which the liquid is recovered from a gap between the first and second members, wherein the liquid immersion space covering a portion of an upper surface of the substrate is formed, while performing a liquid supply via the first liquid supply port and performing a liquid recovery via the first, second and third liquid recovery ports.

6. The apparatus according to claim 5, wherein:
the third liquid recovery port is disposed at the first member, the second member, or both of the first and second members.

7. The apparatus according to claim 6, wherein:
the first member has a first lower surface,
the second member has a second lower surface,
a first end of the gap between the first and second members is formed between the first and second lower surfaces,
the gap between the first and second members communicates with an outside space via a second end of the gap, and
the liquid in the liquid immersion space on the object is allowed to flow into the gap between the first and second members via the first end of the gap.

8. The apparatus according to claim 7, wherein:
the position of the second end of the gap is higher than that of the first end of the gap.

9. The apparatus according to claim 7, wherein:
the first end of the gap is arranged so that the first end opposes the surface of the object, and
the second end of the gap is arranged so that the second end does not oppose the surface of the object.

10. The apparatus according to claim 7, wherein:
the first lower surface and the second lower surface are disposed at substantially a same plane.

11. The apparatus according to claim 1, wherein:
the first member has a first lower surface, the second member has a second lower surface which is arranged radially outward of the first lower surface with respect to a path of the exposure light, and
the first liquid recovery port is arranged in the second lower surface.

12. The apparatus according to claim 11, wherein:
the second member has a second liquid supply port arranged in the second lower surface and arranged radially inward of the first liquid recovery port with respect to the path of the exposure light.

13. The apparatus according to claim 12, wherein:
the first member has a third liquid supply port arranged in the first lower surface.

14. The apparatus according to claim 11, wherein:
the first member has a third liquid supply port arranged in the first lower surface.

15. The apparatus according to claim 11, wherein:
the second member has a second opening around which the second lower surface extends,
the second member has a plurality of liquid recovery ports including the first liquid recovery port in the second lower surface, and
the plurality of liquid recovery ports are arranged in a rhombic shape around the second opening.

16. The apparatus according to claim 11, wherein:
the first lower surface is disposed below the emitting surface of the optical member.

17. The apparatus according to claim 1, wherein:
the second member is movable in a plane substantially perpendicular to an optical axis of the optical member.

18. The apparatus according to claim 17, wherein:
the second member is moved based on a movement condition of the object.

19. The apparatus according to claim 17, wherein:
the second member is moved in a state where the liquid immersion space is formed, and
the second member is moved in at least a portion of a time period in which the exposure light is emitted from the emitting surface of the optical member.

20. A device manufacturing method comprising:
exposing a substrate using the exposure apparatus according to claim 1, and
developing the exposed substrate.

21. A liquid immersion exposure method comprising:
projecting exposure light onto an object through a projection system having an optical member; and
at least during the projecting, forming a liquid immersion space on a surface of the object while the object is positioned opposite to an emitting surface of the optical member, the liquid immersion space being formed by a liquid supplied and recovered with a liquid immersion member, wherein:
the liquid immersion member includes (i) a first member that has a first liquid supply port, and a first opening, through which the exposure light is projected and (ii) a second member that has a first liquid recovery port facing downwardly and that is movable with respect to the first member,
the first member has a second liquid recovery port,
the first liquid supply port faces an outer surface of the optical member and is provided on one side of the optical member,
the second liquid recovery port faces the outer surface of the optical member and is provided on the other side of the optical member, and the second member is moved in a direction perpendicular to an optical axis of the optical member so that a relative speed between the second member and the object is smaller than a relative speed between the first member and the object, while recovering liquid in a gap between the second member and the object via the first liquid recovery port of the second member.

22. The method according to claim 21, wherein:
the object includes a substrate to be exposed, and
the liquid immersion space covering a portion of an upper surface of the substrate is formed, while performing a liquid supply via the first liquid supply port and performing a liquid recovery via the first and second liquid recovery ports.

23. The method according to claim 21, wherein:
the second member has a second liquid supply port facing downwardly, and
the liquid immersion space covering a portion of an upper surface of the substrate is formed, while performing a liquid supply via the first and second liquid supply ports and performing a liquid recovery via the first and second liquid recovery ports.

24. The method according to claim 23, wherein:
the second liquid supply port is arranged radially inward of the first liquid recovery port with respect to a path of the exposure light.

25. The method according to claim 21, wherein:
a third liquid recovery port via which the liquid is recovered from a gap between the first and second members is provided, and
the liquid immersion space covering a portion of an upper surface of the substrate is formed, while performing a liquid supply via the first liquid supply port and performing a liquid recovery via the first, second and third liquid recovery ports.

26. The method according to claim 25, wherein:
the third liquid recovery port is disposed at the first member, the second member, or both of the first and second members.

27. The method according to claim 26, wherein:
the first member has a first lower surface,
the second member has a second lower surface,
a first end of the gap between the first and second members is formed between the first and second lower surfaces,
the gap between the first and second members communicates with an outside space via a second end of the gap, and
the liquid in the liquid immersion space on the object is allowed to flow into the gap between the first and second members via the first end of the gap.

28. The method according to claim 27, wherein:
the position of the second end of the gap is higher than that of the first end of the gap.

29. The method according to claim 27, wherein:
the first end of the gap is arranged so that the first end opposes the surface of the object, and
the second end of the gap is arranged so that the second end does not oppose the surface of the object.

30. The method according to claim 27, wherein:
the first lower surface and the second lower surface are disposed at substantially a same plane.

31. The method according to claim 21, wherein:
the first member has a first lower surface,
the second member has a second lower surface which is arranged radially outward of the first lower surface with respect to a path of the exposure light, and
the first liquid recovery port is arranged in the second lower surface.

32. The method according to claim 31, wherein:
the second member has a second liquid supply port arranged in the second lower surface and arranged radially inward of the first liquid recovery port with respect to the path of the exposure light.

33. The method according to claim 32, wherein:
the first member has a third liquid supply port arranged in the first lower surface.

34. The method according to claim 31, wherein:
the first member has a third liquid supply port arranged in the first lower surface.

35. The method according to claim 31, wherein:
the second member has a second opening around which the second lower surface extends,
the second member has a plurality of liquid recovery ports including the first liquid recovery port in the second lower surface, and
the plurality of liquid recovery ports are arranged in a rhombic shape around the second opening.

36. The method according to claim 31, wherein:
the first lower surface is disposed below the emitting surface of the optical member.

37. The method according to claim 21, wherein:
the second member is movable in a plane substantially perpendicular to an optical axis of the optical member.

38. The method according to claim 37, wherein:
the second member is moved based on a movement condition of the object.

39. The method according to claim 37, wherein:
the second member is moved in a state where the liquid immersion space is formed, and
the second member is moved in at least a portion of a time period in which the exposure light is emitted from the emitting surface of the optical member.

40. A device manufacturing method comprising:
exposing a substrate using the exposure method according to claim 21, and
developing the exposed substrate.

* * * * *